(12) United States Patent
Nakatsu et al.

(10) Patent No.: US 7,859,105 B2
(45) Date of Patent: Dec. 28, 2010

(54) POWER CONVERTER, POWER SYSTEM PROVIDED WITH SAME, AND MOBILE BODY

(75) Inventors: Kinya Nakatsu, Hitachinaka (JP);
Koichi Yahata, Hitachinaka (JP);
Masato Takahashi, Hitachinaka (JP);
Mitsufumi Iwanaka, Hitachi (JP);
Ryuichi Saito, Hitachi (JP); Haruki Hamada, Naka (JP)

(73) Assignee: Hitachi, Ltd., Tokyo (JP)

( * ) Notice: Subject to any disclaimer, the term of this patent is extended or adjusted under 35 U.S.C. 154(b) by 1729 days.

(21) Appl. No.: 10/505,321

(22) PCT Filed: Apr. 4, 2003

(86) PCT No.: PCT/JP03/04341

§ 371 (c)(1),
(2), (4) Date: Aug. 20, 2004

(87) PCT Pub. No.: WO03/085814

PCT Pub. Date: Oct. 16, 2003

(65) Prior Publication Data

US 2005/0161809 A1    Jul. 28, 2005

(30) Foreign Application Priority Data

Apr. 4, 2002  (JP) .............................. 2002-102916

(51) Int. Cl.
*H01L 23/48* (2006.01)
*H01L 23/52* (2006.01)
*H01L 29/40* (2006.01)

(52) U.S. Cl. .............. 257/734; 318/400.37; 318/400.38

(58) Field of Classification Search ................. 257/734; 318/400.37, 400.38
See application file for complete search history.

(56) References Cited

U.S. PATENT DOCUMENTS 4,283,643 A * 8/1981 Levin .......................... 327/511

(Continued)

FOREIGN PATENT DOCUMENTS

DE  197 41 417 A1  4/1999

(Continued)

OTHER PUBLICATIONS

German Office Action with English translation dated Nov. 27, 2009 (Twenty-Three (23) pages).

*Primary Examiner*—Bentsu Ro
*Assistant Examiner*—Erick Glass
(74) *Attorney, Agent, or Firm*—Crowell & Moring LLP

(57) ABSTRACT

To provide a power converter equipped with a current detector which is small and can carry out highly accurate current detection, in the power converter equipped with a power module 16 having a power controlling semiconductor element 7 disposed on the power module base 27 with a ceramic substrate 28 interposed, and a control unit 26 for controlling the operation of the power controlling semiconductor element 7, a current detector 40 having a magnetic detecting unit 47 which is disposed in the detection conductor 11, electrically connected to the power controlling semiconductor element 7 and disposed on the power module base 27 with the ceramic substrate 28 interposed, and has a magnetic detecting semiconductor element 43 electrically connected to the control unit 26 is provided in the power module 16; and relative distance between the detection conductor 11 and the power module base 27 is larger than the relative distance between the current detection electrode 42 and the power module base 27.

5 Claims, 32 Drawing Sheets

U.S. PATENT DOCUMENTS

| | | |
|---|---|---|
| 5,023,684 A | 6/1991 | Tsunoda |
| 5,677,604 A | 10/1997 | Masaki et al. |
| 6,148,784 A * | 11/2000 | Masberg et al. .......... 123/192.1 |
| 6,184,679 B1 | 2/2001 | Popovic et al. |
| 6,236,110 B1 | 5/2001 | Muto et al. |
| 6,429,639 B1 * | 8/2002 | Pelly ...................... 324/117 H |
| 6,441,604 B1 * | 8/2002 | Gohara et al. ........... 324/117 R |
| 6,459,255 B1 * | 10/2002 | Tamai et al. ............ 324/117 H |
| 6,462,531 B1 * | 10/2002 | Ohtsuka ................. 324/117 H |
| 6,472,878 B1 | 10/2002 | Bruchmann |
| 6,636,029 B1 | 10/2003 | Kunze et al. |
| 6,683,448 B1 * | 1/2004 | Ohtsuka ................. 324/117 H |

FOREIGN PATENT DOCUMENTS

| | | |
|---|---|---|
| DE | 198 38 536 A1 | 3/2000 |
| EP | 0 867 725 A1 | 9/1998 |
| JP | 05223849 | 9/1993 |
| JP | 08194016 | 7/1996 |
| JP | 11136960 | 5/1999 |
| JP | 2000019199 | 1/2000 |
| JP | 2000171491 | 6/2000 |
| JP | 2001086768 | 3/2001 |
| JP | 2001221815 | 8/2001 |
| JP | 2002040058 | 2/2002 |

* cited by examiner

POWER CONVERTER, POWER SYSTEM PROVIDED WITH SAME, AND MOBILE BODY

CLAIM OF PRIORITY

The present application claims priority from Japanese application serial No. 2002-102916, filed on Apr. 4, 2002, and PCT International Application, PCT/JP03/0434(filed on Apr. 3, 2004, the content of which is hereby incorporated by reference into this application.

BACKGROUND OF THE INVENTION

The present invention relates to a power converter for controlling electric power supplied to a load, and an electric power system and a mobile body equipped with the power converter.

In an electric power system for supplying electric power to a load, a power converter is controlled according to load current flowing through the load, thereby controlling electric power supplied to the load. To do so, the electric power system is equipped with a current detector for detecting the load current flowing through the load.

Conventionally, in an electric power system for supplying electric power to a load, such as a motor drive system for converting direct current (DC) power from a storage battery into alternating current (AC) power and supplying it to a motor which drives an electric car or hybrid car, a current detector, for example, which has been disclosed in Japanese Laid-open Patent Publication No. Hei 11-136960, is incorporated in a power converter for converting DC power into AC power so as to detect current supplied to a motor. This conventional current detector is created such that a Hall element is placed in the gap of the annular magnetic core that is fitted into a bus bar which functions as an output conductor of the power converter's circuit module. The aforementioned current detector is fitted into a cooling block which is a component of the power converter's circuit module.

Furthermore, as disclosed in Japanese Application Patent Laid-open Publication No. 2001-221815 and Japanese Application Patent Laid-open Publication No. 2002-40058, a current detector has been proposed in which a Hall element is disposed at the center inside the letter-U shaped conductor and magnetic flux concentrated in the area is directly inputted into the Hall element, thereby detecting current flowing through the letter-U shaped conductor. This current detector is created such that a first part consisting of a letter-U shaped conductor and a resin formed body, a support plate to which a semiconductor chip including a Hall element is fixed, and a second part consisting of a lead terminal and a resin formed body adhere to one other.

Furthermore, recently, as disclosed in Japanese Application Patent Laid-open Publication No. 2000-19199, a current detection method has been proposed in which a current path is formed symmetrically with respect to an axis or a point, and a Hall element is disposed at a location where magnetic flux density at a central portion of the current path is almost constant, thereby detecting current flowing through the current path inexpensively and by using a small device.

In an electric power system for supplying electric power to a load, such as a motor drive system for converting DC power from a storage battery into AC power and supplying it to a motor which drives an electric car or hybrid car, how to make a power converter for converting DC power into AC power small and inexpensive has been studied in order to inexpensively make electrically-operated vehicles such as electric cars and hybrid cars, increase fuel efficiency and travel distance per one battery charge, and reduce space for mounting the power converter.

To achieve the above objectives, it is desirable that among all components of the power converter, high-voltage components which require certain intervals to insulate one another and components which generate heat when a large current is applied be integrated and made compact thereby forming a module having excellent insulation and heat discharge performance. A variety of modules have recently been proposed. As disclosed in the aforementioned Japanese Laid-open Patent Publication No. Hei 11-136960, a module which incorporates a current detector has been proposed.

However, a current detector disclosed in Japanese Laid-open Patent Publication No. Hei 11-136960 requires a magnetic core. For that reason, it is impossible to dispose a current detector inside the cooling block without making the cooling block large. That is, in a current detector using a magnetic core, to detect current flowing through a current-carrying conductor, it is necessary to adjust the amount of magnetic flux by adjusting the gap width, to make the effective sectional area of the magnetic core large, and to make the effective length of the magnetic path short so as to prevent the magnetic core from becoming saturated. As a result, it is difficult to make the magnetic core small. Accordingly, when the magnetic core is installed inside the cooling block, the cooling block needs to be made large. Furthermore, when the magnetic core is installed on the side wall of the cooling block, it is necessary to make the side wall of the cooling block protrude outward to dispose the magnetic core. As a consequence, there is no other choice than to make the cooling block large.

SUMMARY OF THE INVENTION

To solve the aforementioned problems, the inventors of this application direct attention to the application of a current detector to a power converter, wherein magnetic flux generated by current flowing through the current-carrying conductor is directly inputted into a Hall element, thereby the current detector detects current flowing through the current-carrying conductor. To do so, how to mount the current detector to the power converter has been studied.

Firstly, the inventors of this application studied the way to apply the current detector to the power converter which is disclosed in Japanese Application Patent Laid-open Publication No. 2001-221815 and Japanese Application Patent Laid-open Publication No. 2002-40058. In this case, an appropriate method to mount the current detector to the power converter is to solder the current detector's detection conductor, together with a semiconductor element, onto an electrode located on an insulating substrate which is soldered onto a heat discharging conductive member. However, in this mounting method, it is necessary to uniformly raise the temperature of both the heat discharging conductive member and the current detector to the degree or higher at which solder will melt in order to solder those devices. In addition, the temperature profile for the soldering process frequently requires that the temperature be maintained at the degree or higher at which solder melts for more than several minutes. Therefore, it is considered that in the above-mentioned mounting method, the difference of linear expansion coefficients between the Hall element and the resin formed body causes thermal stress, which results in permanent deformation of the Hall element, thereby decreasing the accuracy of the current detector.

Furthermore, similar to the above-mentioned current detector, an appropriate mounting method is to attach a component consisting of a support plate to which a semiconductor chip including a Hall element is fixed, lead terminal, and resin formed body to a current-carrying conductor with a sheet-like adhesion layer or insulation layer interposed. However, in this mounting method, it is considered that if the thickness of the adhesion layer or insulation layer is not uniform, intervals between the Hall element and the current-carrying conductor become nonuniform, causing the accuracy of the current detector to decrease.

Furthermore, similar to the above-mentioned current detector, another appropriate mounting method is to provide a first resin formed body installed in the current-carrying conductor for the positioning purpose and to combine a second resin formed body, which is a component consisting of a support plate to which a semiconductor chip including a Hall element is fixed, lead terminal, and resin formed body, with the first resin formed body. However, in this mounting method, minute structure of the first resin formed body, which functions as a positioning jig, must be accurately molded in resin. As a result, it is presumed that a production yield will decrease, causing production costs to increase.

Furthermore, similar to the current detection method disclosed in Japanese Application Patent Laid-open Publication No. 2000-19199, an appropriate mounting method is to create current-carrying conductors so that they are symmetrical with respect to an axis or a point, and to place the Hall element at a location where the magnetic flux density at a central portion of the current-carrying conductors is almost constant. However, in this mounting method, it is considered that there will be a decreased degree of flexibility for disposing the current-carrying conductors. Moreover, in this mounting method, if electrodes on the insulating substrate which is soldered onto the heat discharging conductive member are made symmetrical with respect to an axis or a point, magnetic flux generated by current flowing through one electrode interlinks with the other electrode, which causes eddy current to flow through the other electrode. As a result, the eddy current generates magnetic flux in the other electrode. Accordingly, in the above-mentioned mounting method, it is considered that the magnetic flux generated by the eddy current flowing through the other electrode is detected by the Hall element, resulting in decreasing the accuracy of the current detector.

Furthermore, the inventors of this application conducted further studies to realistically apply the current detector to a power converter. For example, in a power converter for an electric car or hybrid car, the current to be detected is large, several hundred amperes. Accordingly, excessive resistance loss will occur in the current detector's detection conductor, which requires heat to be discharged from the detection conductor. In this case, it is considered that an appropriate method to mount the current detector is to solder the detection conductor, together with a power converting semiconductor element, onto the electrode on the insulating substrate which is soldered to the heat discharging conductive member.

However, in this mounting method, detection magnetic flux generated by current flowing through the detection conductor interlinks with the heat discharging conductive member, and therefore, mirror current flows through the heat discharging conductive member according to the method of mirror image (or method of image) used in electromagnetism. Mirror current is nearly induction current (or is called eddy current) induced by detection current, and flows near the surface of the heat discharging conductive member in proportion to the square root of the product of the detection current frequency and the electric conductivity and magnetic permeability of the heat discharging conductive member. In particular, when resistance of the heat discharging conductive member is extremely low, or when detection current frequency is extremely high, mirror current which is the same magnitude as detection current flows in the area symmetrical to the surface of the heat discharging conductive member in the reverse direction, causing magnetic flux to be generated around the heat discharging conductive member. Accordingly, the Hall element detects magnetic flux generated by mirror current in addition to magnetic flux generated by detection current flowing through the detection conductor. Consequently, it is considered that the accuracy of the current detector decreases as the current detection method disclosed in Japanese Application Patent Laid-open Publication No. 2000-19199. Furthermore, magnetic flux generated by mirror current changes according to the frequency of detection current (frequency dependent). Therefore, it is considered that the result detected by the Hall element changes according to the frequency of detection current, causing the accuracy of the current detector to decrease.

Thus, it was revealed that if a current detector, which inputs magnetic flux generated by the current-carrying conductor directly into a Hall element thereby detecting current flowing through the current-carrying conductor, is applied to a power converter, the accuracy of the current detector would decrease. Therefore, the inventors of this application further studied the configuration of the current detector which inhibits the accuracy of the current detector from decreasing as well as a method to mount the current detector to a power converter. As a result, the inventors of this application have found a desirable configuration of the current detector and a method to mount the current detector to a power converter.

Herein, the present invention provides a small power converter which is able to accurately control electric power, and an electric power system and mobile body equipped with the power converter. Furthermore, the present invention provides a power converter equipped with a small current detector which is able to accurately detect current, and an electric power system and mobile body equipped with the power converter.

The aforementioned power converter can be configured such that
the power converter comprises
a power module having
a power controlling semiconductor element disposed on the conductive member with an insulation member interposed and
a current detector for detecting current which is inputted into the power controlling semiconductor element or outputted from the power controlling semiconductor element; and
a control unit for controlling operation of the power controlling semiconductor element, wherein
the current detector has
a conductor which is electrically connected to the power controlling semiconductor element, disposed on the conductive member with an insulation member interposed, and has a portion relative distance of which to the conductive member is larger than relative distance between the laminate portion disposed on the conductive member with the insulation member interposed and the conductive member; and
a magnetic detecting unit which is disposed in the conductor portion or in the vicinity of the conductor portion relative distance of which to the conductive member is larger than relative distance between the conductor portion disposed on the conductive member with the insulation member interposed and the conductive member, and has a magnetic detecting semiconductor element which is electrically connected to the control unit.

According to the aforementioned power converter, a current detector, which detects current flowing through the conductor by inputting magnetic flux generated by the conductor directly into the magnetic detecting semiconductor element, is incorporated, and therefore, it is possible to make the current detector smaller than conventional current detectors, thereby enabling the current detector to be built in the power module of the power converter. Therefore, according to the aforementioned power converter, no space is necessary in the power converter to install the current detector, thereby making the power converter small. Also, according to the aforementioned power converter, it is possible to inhibit the size of the power module from becoming large.

Furthermore, according to the aforementioned power converter, because the magnetic detecting unit is disposed in the conductor portion or in the vicinity of the conductor portion, relative distance of which to the conductive member is larger than relative distance between the conductor portion laminated on the conductive member with the insulation member interposed and the conductive member, the magnetic flux generated by the current flowing through the conductor interlinks with the conductive member. Therefore, it is possible to inhibit the influence of magnetic flux which is generated by the eddy current (induction current) flowing through the conductive member. Consequently, according to the aforementioned power converter, it is possible to improve the accuracy of the current detector. That is, the extent to which the amount of magnetic flux generated by current flowing through the conductor interlinks with the conductive member varies depending on the value of the coefficient of magnetic coupling between the magnetic flux generated by current flowing through the conductor and the conductive member. Accordingly, the magnitude of the eddy current (induction current) changes in proportion to the coupling coefficient. For this reason, as relative distance between the detection conductor and the conductive member becomes larger, the amount of leakage of magnetic flux generated by current flowing through the conductor increases, thereby making the coupling coefficient smaller. This reduces eddy current (induction current), that is, mirror current. Therefore, it is possible to inhibit the influence of magnetic flux which is generated by the flowing eddy current (induction current). Consequently, according to the aforementioned power converter, it is possible to improve the accuracy of the current detector 40.

In the aforementioned power converter, relative distance between the conductor equipped with the magnetic detecting unit or disposed in the vicinity of the magnetic detecting unit and the conductive member is larger than the relative distance between the power controlling semiconductor element and the conductive member; and the conductor protrudes in the direction further away from the conductive member than the conductor portion laminated on the conductive member with the insulation member interposed. Herein, the protrusion bends from the conductor portion laminated on the conductive member with an insulation member interposed and extends in the direction away from the conductive member. Or the protrusion bends again from the conductor portion extending in the direction away from the conductive member and further extends. Or the protrusion further bends a plurality of times from the conductor portion extending in the direction away from the conductive member and further extends to the conductive member. Or current flowing through the plane, arranged such that the portion laminated on the conductive member with an insulation member interposed is parallel to the surface on which the conductive member is located, flows in the direction away from the plane and then flows close to the plane.

In the aforementioned power converter, by making the portion of the conductive member that corresponds to the conductor portion relative distance of which to the conductive member is larger than the relative distance between the conductor portion laminated on the conductive member with an insulation member interposed and the conductive member thinner than the other portion, it is possible to make relative distance between the conductor portion equipped with the magnetic detecting unit or disposed in the vicinity of the magnetic detecting unit and the conductive member larger than the relative distance between the conductor portion laminated on the conductive member with an insulation member interposed and the conductive member.

In the aforementioned power converter, the magnetic detecting unit is disposed in the conductor portion or in the vicinity of the conductor portion relative distance of which to the conductive member is larger than relative distance between the conductor portion laminated on the conductive member with the insulation member interposed and the conductive member so that among magnetic flux generated by the conductor portion relative distance of which to the conductive member is larger than relative distance between the conductor portion laminated on the conductive member with the insulation member interposed and the conductive member, the magnetic detecting unit detects magnetic flux having a component parallel to the conductive member or to induction current flowing through the conductive member; or the magnetic detecting unit detects magnetic flux having a component parallel to the perpendicular line which vertically intersects with the conductive member.

In the aforementioned power converter, the conductor portion relative distance of which to the conductive member is larger than relative distance between the conductor portion laminated on the conductive member with the insulation member interposed and the conductive member has a portion which is vertical to the conductive member and extends in the direction away from the conductive member, and the magnetic detecting unit is disposed in the conductor portion which is vertical to the conductive member and extends in the direction away from the conductive member so that the surface of the magnetic detection surface of the magnetic detecting semiconductor element is vertical to the conductive member and the conductor portion which extends in the direction away from the conductive member and parallel to the conductor portion which extends in the direction away from the conductive member. Or, the conductor portion relative distance of which to the conductive member is larger than relative distance between the conductor portion laminated on the conductive member with the insulation member interposed and the conductive member has a portion which extends parallel to the conductive member, and the magnetic detecting unit is disposed in the conductor portion which extends parallel to the conductive member so that the magnetic detection surface of the magnetic detecting semiconductor element is vertical and parallel to the conductor portion which extends parallel to the conductive member.

The aforementioned power converter can be configured such that the power converter comprises a power module having a power controlling semiconductor element electrically connected to a load or an electric power supply means via a conductor, a control unit for controlling operation of the power controlling semiconductor element, and a current detector disposed in the conductor, wherein the current detector has a magnetic detecting unit which is configured such that a magnetic detecting semiconductor element and a part of a connecting conductor which electrically connects the magnetic detecting semiconductor element with the control unit are encased in resin, and at least a part of the magnetic detecting unit is contained in a depression created in the conductor.

According to the aforementioned power converter, at least a part of the magnetic detecting unit is contained in the depression created in the conductor, and therefore, it is possible to keep an interval between the magnetic detecting semiconductor element and the conductor constant. Therefore, according to the aforementioned power converter, there is no unevenness between the magnetic detecting semiconductor element and the conductor, which prevents the accuracy of the current detector from decreasing. Furthermore, according to the aforementioned power converter, because at least a part of the magnetic detecting unit is contained in the depression created in the conductor, positioning can be easily carried out. Consequently, according to the aforementioned power converter, it is possible to prevent production yield from decreasing, thereby preventing production costs of the power converter from increasing.

In the aforementioned power converter, the conductor is an out-going electrode of the terminal block in which the wire electrically connected to the load or the electric power supply means electrically connects an electrode of the terminal block which is electrically connected by tightening a screw with the power module or the control unit, and the depression is provided in the out-going electrode.

The aforementioned power converter can be configured such that the power converter comprises a power module having a power controlling semiconductor element, and a current detector for detecting current which is inputted into the power controlling semiconductor element or outputted from the power controlling semiconductor element;

a control unit for controlling operation of the power controlling semiconductor element; and a conductive member through which induction current flows due to electromagnetic induction generated by current flowing through the current detector, wherein the current detector has a conductor electrically connected to the power controlling semiconductor element, and a magnetic detecting unit which is disposed in the conductor or in the vicinity of the conductor and has a magnetic detecting semiconductor element which is electrically connected to the control unit; and among magnetic flux generated by the conductor, the magnetic detecting unit detecting magnetic flux having a component parallel to the conductive member or to the induction current flowing through the conductive member.

According to the aforementioned power converter, among magnetic flux generated by the conductor, magnetic flux which contains components parallel to the conductive member or to the induction current flowing through the conductive member is detected; accordingly, it is possible to inhibit the influence of the frequency dependent magnetic flux due to induction current generated in the conductive member on the result detected by the current detector. As a result, according to aforementioned power converter, the accuracy of the current detector can be increased. That is, when linear detection current having a component parallel to the conductive member flows, induction current parallel to the component flows in the reverse direction through the conductive member, thereby generating magnetic flux. Magnetic flux caused by induction current has a component vertical to the conductive member and parallel to the plane perpendicular to the induction current and has no component parallel to the conductive member or induction current. Therefore, among magnetic flux generated by the conductor, by detecting magnetic flux having a component parallel to the conductive member or induction current, it is possible to inhibit the influence of the frequency dependent induction current. As a result, according to the aforementioned power converter, the accuracy of the current detector can be increased.

In the aforementioned power converter, the conductor has a portion extends in the direction away from the conductive member, and among magnetic flux generated by the conductor portion which extends in the direction away from the conductive member, the magnetic detecting unit detects magnetic flux having a component parallel to the conductive member or to the induction current flowing through the conductive member.

In the aforementioned power converter, the conductor has a portion which is vertical to the conductive member and extends in the direction away from the conductive member, and the magnetic detecting unit is disposed in the conductor portion which is vertical to the conductive member and extends in the direction away from the conductive member so that the magnetic detection surface of the magnetic detecting semiconductor element is vertical to the conductive member and the conductor portion extends in the direction away from the conductive member and parallel to the conductor portion which extends in the direction away from the conductive member.

In the aforementioned power converter, the conductor extends parallel to the conductive member and has at least first and second bend, and among magnetic flux generated the conductor portion located between the first bend and the second bend, the magnetic detecting unit detects magnetic flux having a component parallel to the conductive member or to induction current flowing through the conductive member.

In the aforementioned power converter, the conductor extends parallel to the conductive member and has at least first and second bend; and the magnetic detecting unit is disposed in the conductor portion located between the first bend and the second bend so that the magnetic detection surface of the magnetic detecting semiconductor element is vertical to the conductor portion located between the first bend and the second bend and the conductive member and parallel to the conductor portion located between the first bend and the second bend.

The aforementioned power converter can be configured such that the power converter comprises
a power module having
a power controlling semiconductor element and
a current detector for detecting current inputted into the power controlling semiconductor element or outputted from the power controlling semiconductor element;
a control unit for controlling operation of the power controlling semiconductor element; and
a conductive member through which induction current flows due to electromagnetic induction generated by current flowing through the current detector, wherein
the current detector has
a conductor which is electrically connected to the power controlling semiconductor element, extends parallel to the conductive member, and has at least first and second bend; and
a magnetic detecting unit which is disposed in the conductor portion located between the first bend and the second bend or in the vicinity of the conductor portion and has a magnetic detecting semiconductor element which is electrically connected to the control unit; and among magnetic flux generated by the conductor portion located between the first bend and the second bend, the magnetic detecting unit detecting magnetic flux having a component parallel to the conductive member or to the induction current flowing through the conductive member.

According to the aforementioned power converter, among magnetic flux generated by the conductor portion between the first bend and the second bend, magnetic flux having a component parallel to the conductive member or induction current flowing through the conductive member is detected. Accordingly, it is possible to inhibit the influence of the magnetic flux which depends on detection current frequency caused by induction current generated in the conductive member on the result detected by the current detector. Therefore, according to the aforementioned power converter, the accuracy of the current detector can be increased. That is, by creating at least first and second bend in the conductor extends parallel to the conductive member, it is possible to direct induction current flowing through the conductive member in the vicinity of the conductor portion located between the first bend and the second bend so that the induction current flows in the direction perpendicular to the conductor portion located between the first bend and the second bend. Magnetic flux created by induction current has a component vertical to the conductive member and parallel to the plane perpendicular to induction current, and has no component vertical to the conductive member and parallel to the plane which is parallel to the induction current. Therefore, among magnetic flux generated by the conductor portion located between the first bend and the second bend, by detecting magnetic flux having a component parallel to the conductive member or to the induction current flowing through the conductive member, it is possible to inhibit the influence of the frequency dependent induction current thereby detecting current flowing through the conductor even if the conductor extends parallel to conductive member on the conductive member. As a result, according to the aforementioned power converter, the accuracy of the current detector can be increased.

In the aforementioned power converter,
the conductor consists of a first conductor which is the conductor portion located between the first bend and the second bend, a second conductor which extends from the first conductor and bends at the first bend, and a third conductor which extends from the first conductor and bends at the second bend, and among magnetic flux generated by the first conductor,
the magnetic detecting unit detects magnetic flux having a component parallel to the conductive member or to the induction current flowing through the conductive member.

In the aforementioned power converter,
the conductor consists of a first conductor which is the conductor portion located between the first bend and the second bend, a second conductor which extends from the first conductor and bends at the first bend, and a third conductor which extends from the first conductor and bends at the second bend, and
the magnetic detecting unit is disposed in the first conductor so that the magnetic detection surface of the magnetic detecting semiconductor element is vertical to the first conductor and the conductive member and parallel to the first conductor.

The aforementioned power converter can be configured such that the power converter comprises
a power module having
a power controlling semiconductor element, and
a current detector for detecting current inputted into the power controlling semiconductor element or outputted from the power controlling semiconductor element;
a control unit for controlling operation of the power controlling semiconductor element; and
a conductive member through which induction current flows due to electromagnetic induction generated by current flowing through the current detector, wherein
the current detector has
a conductor which is electrically connected to the power controlling semiconductor element and has at least first and second bend, and
a magnetic detecting unit which is disposed in the conductor portion located between the first bend and the second bend or in the vicinity of the conductor portion and has a magnetic detecting semiconductor element which is electrically connected to the control unit, and among magnetic flux generated by the conductor portion located between the first bend and the second bend, the magnetic detecting unit detecting magnetic flux having a component parallel to the conductive member or to the induction current flowing through the conductive member.

According to the aforementioned power converter, among magnetic flux generated by the conductor portion located between the first bend and the second bend, magnetic flux having a component parallel to the conductive member or to the induction current flowing through the conductive member is detected. Accordingly, it is possible to inhibit the influence of the magnetic flux which depends on detection current frequency caused by induction current generated in the conductive member on the result detected by the current detector. Therefore, according to the aforementioned power converter, the accuracy of the current detector can be increased. That is, when linear detection current having a component parallel to the conductive member flows, induction current parallel to the component flows in the reverse direction through the conductive member, thereby generating magnetic flux. Magnetic flux caused by induction current has a component vertical to the conductive member and parallel to the plane perpendicular to the induction current and has no component parallel to the conductive member or induction current. Therefore, among magnetic flux generated by the conductor portion located between the first bend and the second bend, by detecting magnetic flux having a component parallel to the conductive member or induction current, it is possible to inhibit the influence of the frequency dependent induction current. As a result, according to the aforementioned power converter, the accuracy of the current detector can be increased.

In the aforementioned power converter,
the conductor is the conductor portion located between the first bend and the second bend and consists of a first conductor which extends vertical to the conductive member, a second conductor which extends from the first conductor and bends at the first bend, and a third conductor which extends from the first conductor and bends at the second bend, and among magnetic flux generated by the first conductor,
the magnetic detecting unit detects magnetic flux having a component parallel to the conductive member or to the induction current flowing through the conductive member.

In the aforementioned power converter,
the second conductor and the third conductor have a right angle to the first conductor and extend in different directions. Specifically, the second conductor and the third conductor extend in the opposite directions, or the third conductor extends in the direction at an obtuse angle (i.e. θ is more than 90 degrees and less than 180 degrees) with the second conductor.

In the former case, the magnetic detecting unit is disposed on the plane such that the magnetic detection surface of the magnetic detecting semiconductor element is vertical to the second conductor and the third conductor using the first conductor's axis as an intersecting point so that among magnetic flux generated by the first conductor, the magnetic detecting semiconductor element detects magnetic flux having a component parallel to the conductive member or to the induction current flowing through the conductive member.

In the latter case, the magnetic detecting unit is disposed in the space in which the magnetic detection surface of the magnetic detecting semiconductor element is segmented by the plane vertical to the second conductor using the first bend as an intersecting point and in the space which is located on the third conductor side including the first conductor so that the magnetic detecting semiconductor element detects magnetic flux having a component parallel to the conductive member or to the induction current flowing through the conductive member among magnetic flux generated by the first conductor. Or the magnetic detecting unit is disposed in the space in which the magnetic detection surface of the magnetic detecting semiconductor element is segmented by the plane vertical to the second conductor using the first bend as an intersecting point, and in the space which is located on the third conductor side including the first conductor and is segmented by the plane vertical to the third conductor using the second bend as an intersecting point, and also in the space which overlaps with the space located on the second conductor side including the first conductor so that the magnetic detecting semiconductor element detects magnetic flux having a component parallel to the conductive member or the induction current flowing through the conductive member among magnetic flux generated by the first conductor.

The aforementioned power converter can be configured such that
the power converter comprises
a power module having
a power controlling semiconductor element, and
a current detector for detecting current inputted into the power controlling semiconductor element or outputted from the power controlling semiconductor element;
a control unit for controlling operation of the power controlling semiconductor element; and
a conductive member through which induction current flows due to electromagnetic induction generated by current flowing through the current detector, wherein
the current detector has
a conductor electrically connected to the power controlling semiconductor element, and
a magnetic detecting unit which is disposed in the conductor or in the vicinity of the conductor and has a magnetic detecting semiconductor element which is electrically connected to the control unit, and among magnetic flux generated by the conductor,
the magnetic detecting unit detecting magnetic flux having a component parallel to the perpendicular line which vertically intersects with the conductive member.

According to the aforementioned power converter,
among magnetic flux generated by the conductor, the magnetic detecting unit detects magnetic flux having a component parallel to the perpendicular line which vertically intersects with the conductive member. Accordingly, it is possible to inhibit the influence of the magnetic flux which depends on detection current frequency generated by induction current flowing through the conductive member on the result detected by the current detector. Therefore, according to the aforementioned power converter, the accuracy of the current detector can be increased. That is, magnetic flux generated by induction current flowing through the conductive member has less components which are parallel to the perpendicular line which vertically intersects with the conductive member from the conductor than the components vertical to the perpendicular line. Therefore, among magnetic flux generated by the conductor, by detecting magnetic flux containing a component parallel to the perpendicular line which vertically intersects with the conductive member, the influence of magnetic flux generated by induction current can be inhibited. As a result, according to the aforementioned power converter, the accuracy of the current detector can be increased.

In the aforementioned power converter,
the conductor has a portion which protrudes in the direction away from the conductive member, and among magnetic flux generated by the conductor portion protruding in the direction away from the conductive member,
the magnetic detecting unit detects magnetic flux having a component parallel to the perpendicular line which vertically intersects with the conductive member.

In the aforementioned power converter,
the conductor has a portion which protrudes in the direction away from the conductive member and is parallel to the conductive member, and
the magnetic detecting unit is disposed in the conductor portion which protrudes in the direction away from the conductive member and is parallel to the conductive member so that the magnetic detection surface of the magnetic detecting semiconductor element is parallel to the conductive member and is vertical and parallel to the conductor portion which protrudes in the direction away from the conductive member and is parallel to the conductive member.

The aforementioned electric power system can be configured such that the electric power system converts electric power supplied by an electric power supply means into prescribed electric power by a power converter and supplies the power to a load, wherein a power converter is according to any one of above-mentioned power converters. According to the aforementioned electric power system, because the above-mentioned power converter, which is small and accurately controls electric power, is used, it is possible to make an electric power system small, inexpensive and reliable.

The aforementioned electric power system is specifically a power generation system which converts DC power supplied by an electric power generating means (e.g. solar cells or fuel cells), which is an electric power supply means, into AC power by a power converter and supplies the power to the electric power system, which is a load. Or, the electric power system is a drive system which converts AC power supplied by an electric power system, which is an electric power supply means, into prescribed AC power or DC power by a power converter and supplies the power to an electric load (e.g. rotating machine), which is a load, thereby driving the electric load. Or, the electric power system is a drive system which converts DC power supplied by a battery means (e.g. battery), which is an electric power supply means, into AC power by a power converter and supplies the power to an electric load (e.g. rotating machine), which is a load, thereby driving the electric load.

The aforementioned mobile body can be configured such that the mobile body comprises a body, a driven device provided in the body, a motor for being driven by an external power source or electric power supplied from an internal power source mounted to the body thereby driving the driven device, and a power converter for controlling electric power supplied from the power source to the motor, wherein a power converter is according to any one of the above-mentioned power converter.

According to the aforementioned mobile body, because the above-mentioned power converter, which is small and accurately controls electric power, is used as a power converter for a mobile body, the mobile body can be made inexpensive, fuel efficiency and travel distance per one battery charge can be improved, and space for mounting the power converter can be reduced.

The aforementioned mobile body is an electric vehicle, such as an electric car, hybrid car, or electrical four-wheel drive, and is equipped with an electrical drive system which converts DC power supplied from an external power source or an internal power source (battery) into AC power by the aforementioned power converter, and supplies the power to a motor for driving a driven device (wheel) provided in the body (car) to drive the motor thereby driving the driven device (wheel). Or, the mobile body is a vehicle, and is equipped with an electrical drive system, such as an electrical air-conditioning system, electrical power steering system, or electric brake system, which converts DC power supplied from an external power source or an internal power source (battery) into AC power by the aforementioned power converter, and supplies the power to a motor for driving a driven device (compressor, steering device, or brake device) provided in the body (car) to drive the motor thereby driving the driven device (compressor, steering device, or brake device).

The aforementioned power converter is installed at any one of the following: a driver's cabin in which car driving devices are installed, an engine room in which an internal-combustion engine is installed, a load-carrying platform, and a portion which encases at least a part of the front and rear wheels.

Furthermore, preferred embodiments of the aforementioned power converter are explained.

In the aforementioned power converter, it is preferable that the magnetic detecting unit be configured such that the magnetic detecting semiconductor element and at least a part of the terminal member which electrically connects the magnetic detecting semiconductor element with the control unit are encased in resin. It is preferable that a depression for encasing a part of the magnetic detecting unit be provided in the conductor portion which is equipped with the magnetic detecting unit and at least a part of the magnetic detection is encased in the depression. It is preferable that the terminal member extend in the direction away from the conductor. It is preferable that a fixing jig abut on the portion, with the adhesion layer interposed, which is not opposite to the depression of the magnetic detecting unit, thereby securing the magnetic detecting unit. It is preferable that the fixing jig be created such that the conductor protrudes into the portion which is not opposite to the depression of the magnetic detecting unit. Or, it is preferable that the fixing jig be a resin formed body which engages with the conductor and protrudes into the portion which is not opposite to the depression of the magnetic detecting unit, thereby securing the magnetic detecting unit. Or, it is preferable that the fixing jig be a resin formed body into which an electrode member electrically connected to the terminal member is inserted, and a part of the electrode member is exposed on the surface to make wire bonding possible. Furthermore, it is preferable that the fixing jig protrude from the conductor side into the magnetic detecting unit side thereby securing the terminal member.

In the aforementioned power converter, it is preferable that the magnetic detecting unit be created such that the magnetic detecting semiconductor element fixed on the substrate and the terminal member electrically connected to the control unit are electrically connected to each other on the substrate. It is preferable that a depression for containing at least a part of the magnetic detecting unit is created in the conductor portion equipped with the magnetic detecting unit, and at least a part of the magnetic detecting unit is contained in the depression. It is preferable that at least two fixing jigs abut on the portion which is not opposite to the depression of the magnetic detecting unit with an adhesion layer interposed, thereby securing the magnetic detecting unit. It is preferable that the fixing jig be created such that the conductor protrude into the portion which is not opposite to the depression of the substrate.

In the aforementioned power converter, it is preferable that the magnetic detecting unit be created such that the magnetic detecting semiconductor element and the electrode member which is electrically connected to the magnetic detecting semiconductor element and the control unit and can be bonded with wires are encased with resin so that the electrode member is exposed outside.

In the aforementioned power converter, it is preferable that relative distance between another conductor disposed in the vicinity of the magnetic detecting unit and the magnetic detecting unit is larger than relative distance between the conductor and the magnetic detecting unit. It is preferable that the current-carrying area in proximity to the magnetic detecting unit of the conductor is smaller than the other current-carrying area of the conductor.

In the aforementioned power converter, it is preferable that the control unit have a means to calibrate the accuracy of the current detector. It is preferable that the calibration means be a computer which carries out arithmetic operations necessary for controlling the power controlling semiconductor element. It is preferable that the computer create a calibration signal to be inputted into the current detector according to the comparison result between the value obtained by the current detector detecting reference current flowing through the conductor and the reference current value. It is preferable that the calibration signal be inputted into the current detector via a circuit which can step up or down the signal. Furthermore, it is preferable that the control unit have a means to output the calibration signal and result detected by the current detector. Furthermore, it is preferable that the calibration means be a first computer for carrying out arithmetic operations necessary for controlling the power controlling semiconductor element and a second computer electrically connected to the first computer. It is preferable that the first computer create a first calibration signal to be inputted into the current detector according to the comparison result between the value obtained by the current detector detecting reference current flowing through the conductor and the reference current value, and the second computer create a second signal according to the comparison result between the value obtained by the current detector detecting reference current flowing through the conductor and the reference current value, and also compare the second calibration signal with the first calibration signal; and if it is determined that the first calibration signal is false, the second calibration signal is outputted to the current detector instead of the first calibration signal. It is preferable that the first calibration signal or second calibration signal be inputted into the current detector via a circuit which can step up or down the signal. Furthermore, it is preferable that the control unit have a means to output the first calibration signal or second calibration signal. Moreover, it is preferable that the control unit have a means to input, from outside, a calibration signal to calibrate the accuracy of the current detector.

In the aforementioned power converter, it is preferable that at least two magnetic detecting units be provided. It is preferable that one magnetic detecting unit be used to backup the other magnetic detecting unit and both magnetic detecting units be symmetric.

In the aforementioned power converter, it is preferable that at least two current detectors be provided. It is preferable that one current detector detect current flowing through the conductor, and the other current detector has a magnetic detecting semiconductor element which is oriented in the same direction as one magnetic detecting semiconductor element of the current detector and is disposed in the vicinity of one current detector. Furthermore, it is preferable that one current detector detect magnetism radiated from outside, and the control unit correct the result detected by one current detector according to the result detected by the other current detector.

In the aforementioned power converter, it is preferable that the conductive member be a metal chassis which encase the semiconductor module and the control unit. Or, it is preferable that the conductive member be a conductor foil of insulating substrate on which the power converting semiconductor element is mounted. Or, it is preferable that the conductive member be another conductor electrically connected to the power controlling semiconductor element. Or, it is preferable that the conductive member be a metal base on which the power controlling semiconductor element is laminated with an insulation member interposed. It is preferable that the metal base be a heat discharge member which discharge heat from the power controlling semiconductor element and the conductor to outside or to the cooler.

DESCRIPTION OF THE PREFERRED EMBODIMENTS

A power converter controls electric power supplied to a load and there are various types of power converters, such as a rectifier for converting AC power to DC power, inverter for converting DC power to AC power, and a DC-DC converter which is a combination of rectifier and inverter and converts inputted DC power into desirable DC power. Hereafter, embodiments of the present invention will be explained with reference to the drawings.

Embodiment 1

A first embodiment of the present invention will be explained by referring to FIGS. 1 through 9. What is explained as an example in this embodiment is a power converter (inverter) which is incorporated in a motor drive system of an electric car that is driven by a motor as the vehicle's only drive source, and which converts DC power outputted from a battery, which is a power storage means, into three-phase AC power and supplies the power to the motor.

Figure 9:
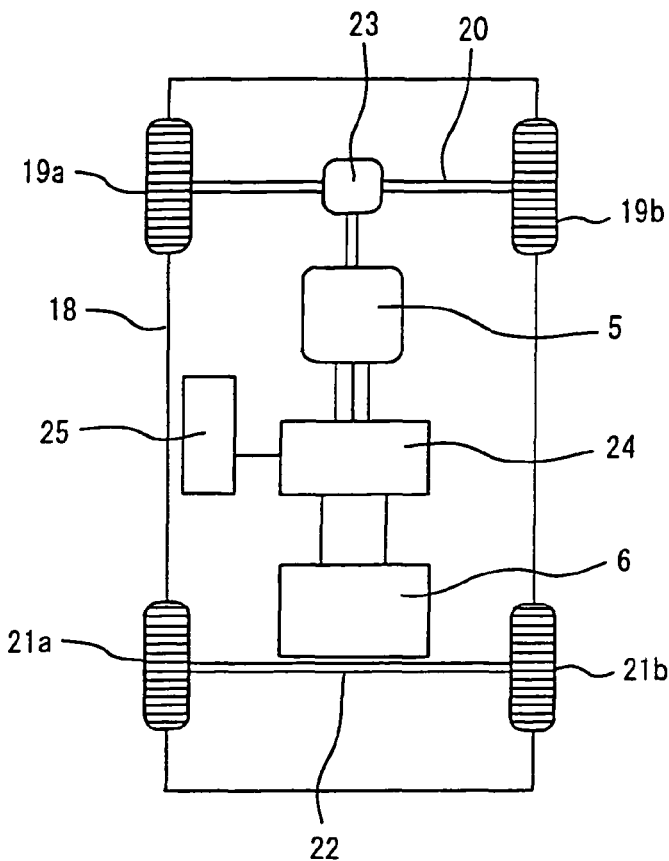
FIG. 9 is a block diagram showing the configuration of an electric car equipped with a motor drive system incorporating a power converter which is a first embodiment of the present invention.

FIG. 9 is a schematic diagram showing the configuration of an electric car equipped with a motor drive system which incorporates a power converter according to this embodiment. In FIG. 9, 18 denotes a vehicle body. At the front of the vehicle body 18, front wheels having an axle 20 and wheels 19a and 19b attached to both ends of the axle 20 are rotatably mounted. At the rear of the vehicle body 18, rear wheels having an axle 22 and wheels 21a and 21b attached to both ends of the axle 22 are rotatably mounted.

A motor 5 is mechanically connected to the axle 20 via a gear 23. A power converter 24 is electrically connected to the motor 5, and DC power supplied from a battery 6 is converted into three-phase AC power and supplied. A higher-level control device 25 is electrically connected to the power converter 24, and command signals, such as a response to pressing down the accelerator, are inputted.

Figure 8:
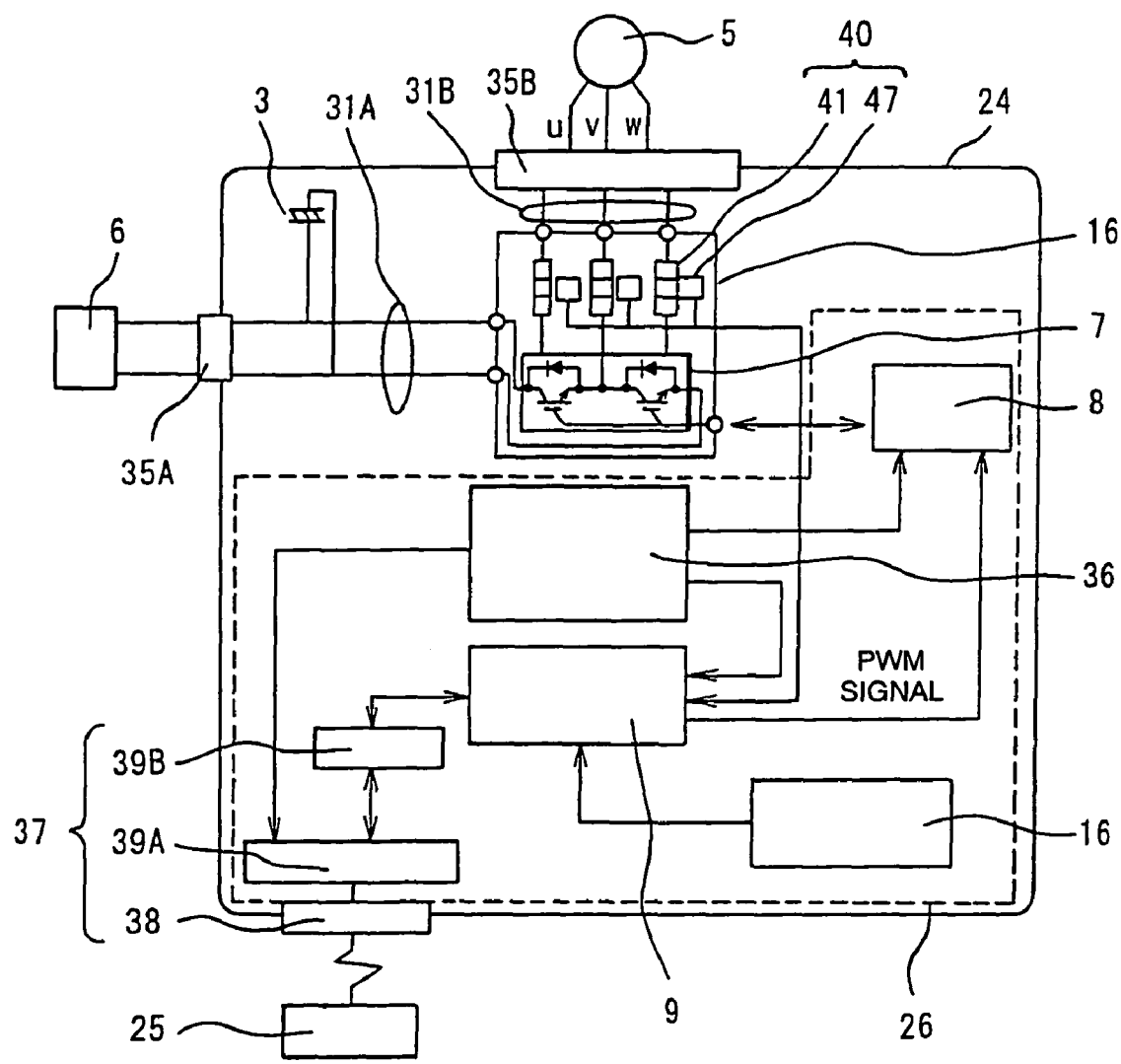
FIG. 8 is a system block diagram showing the configuration of a motor drive system of an electric car equipped with a power converter which is a first embodiment of the present invention.

FIG. 8 shows the configuration of a motor drive system of an electric car which incorporates a power converter according to this embodiment. A power converter according to this embodiment is a pulse width modulation system which controls switching operations (ON/OFF operation) of a power controlling semiconductor element 7 according to the PWM signal (pulse width modulation signal) and converts DC power outputted from a battery 6 into three-phase AC power and supplies it to the motor 5. The power converter consists of a power module 16 and a control unit 26.

The power module 16 is a converter unit which converts DC power outputted from a battery 6 into three-phase AC power and is equipped with a power controlling semiconductor element 7 and a current detector 40. As a power controlling semiconductor element 7, a switching element which is a combination of IGTB and diode element, or a switching element constituted by MOS-FETs is used. The current detector 40 detects current flowing through a current-carrying conductor by inputting magnetic flux generated by the current-carrying conductor directly into a magnetic detecting semiconductor element. The current detector 40 is provided for each phase of current to detect each phase (U-phase, V-phase and W-phase) of three-phase AC power which has been converted by the power controlling semiconductor element 7.

The control unit 26 controls switching operations (ON/OFF operation) of the power controlling semiconductor element 7 installed in the power module 16 according to the command signal sent by the higher-level control device 25. The control unit 26 has a drive circuit 8, computer 9, control power source 36 and an interface circuit 37.

The interface circuit 37 receives a command signal, such as a response to pressing down the accelerator, outputted from a higher-level control device 25. The interface circuit 37 has a communication receiver IC39A which receives command signals inputted from a higher-level control device 25 via an input port 38 and a photo coupler 39B which insulates signals outputted from the communication receiver IC39A.

The computer 9 is constituted by a computing element typified by a microcomputer chip, and carries out arithmetic operations according to a signal outputted by an interface circuit 37 and a detection signal outputted by a current detector 40 and creates and outputs a PWM control signal.

The drive circuit 8 steps up or down the PWM control signal outputted from the computer 9 and outputs the signal to the power module 16 as a drive signal for controlling switching operations (ON/OFF operation) of the power controlling semiconductor element 7 provided in the power module 16.

The control power source 36 supplies drive power to the drive circuit 8, computer 9, current detector 40 and interface circuit 37. The control power source 36 has a regulator IC which is a voltage control element for stepping up or down voltage of DC power supplied by the battery 6, a capacitor which is a capacitance element for stabilizing the output of the regulator IC, a transformer which is a voltage control element for creating a power source insulated from the battery 6 and is equipped with a primary winding and secondary winding, a means for changing voltage of the transformer's primary winding according to voltage of the secondary winding, and a diode and a capacitor 3 which are a rectifying element and a capacitance element, respectively, for smoothing the output of the transformer's secondary winding.

The DC power supplied from the battery 6 is inputted into the power module 16 via a DC bus bar 31A supported by the DC terminal block 35A. On the other hand, a command signal, such as a response to pressing down the accelerator, is inputted into the control unit 26 from the higher-level control device 25 and is inputted into the computer 9 via the interface circuit 37 together with the detection signal outputted from the current detector 40. The computer 9 carries out arithmetic operations according to the inputted signal, creates a PWM control signal and outputs the signal to the drive circuit 8. The drive circuit 8 steps up or down the PWM control signal and then inputs it as a drive signal into the power module 16. This controls switching operations of the power controlling semiconductor element 7, thereby converting DC power inputted into the power module 16 into three-phase AC power. The converted three-phase AC power is supplied to the motor 5 via an AC bus bar 31B supported by the AC terminal block 35B. The motor 5 is driven by the supplied three-phase AC power.

Figure 4:
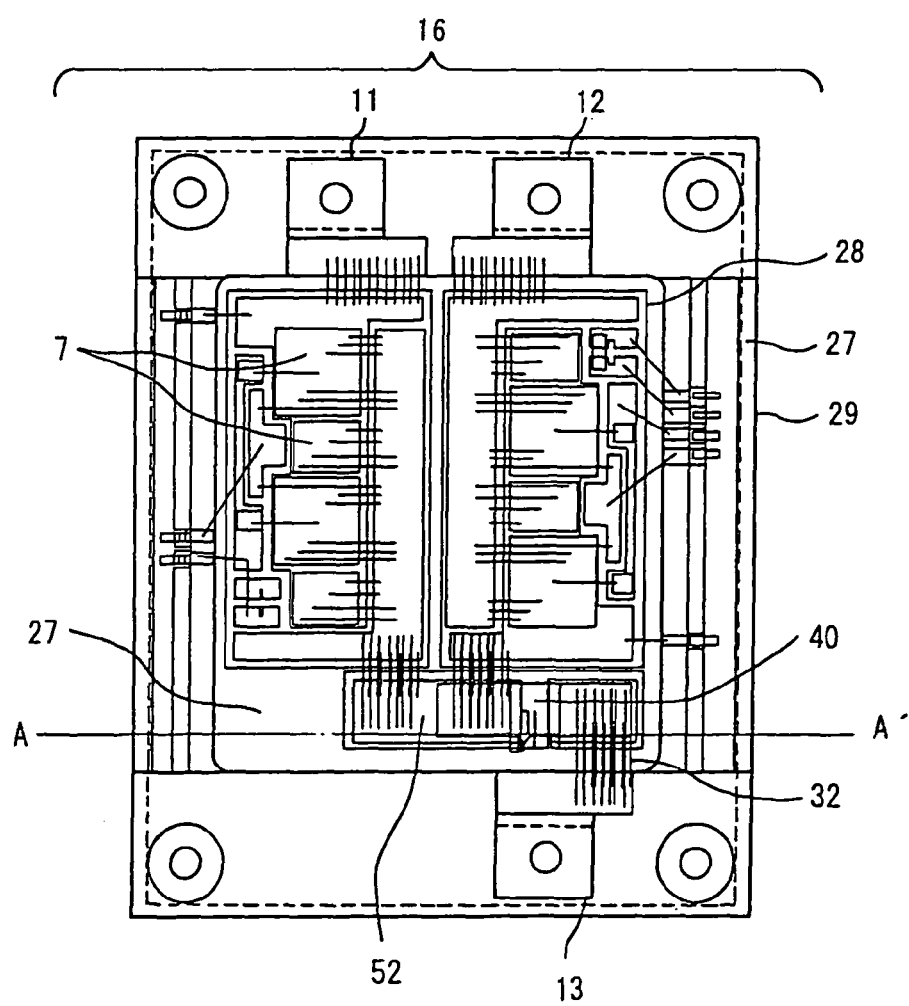
FIG. 4 is a plan view showing the internal configuration of a power module (one-phase portion) of a power converter which is a first embodiment of the present invention.
Figure 5:
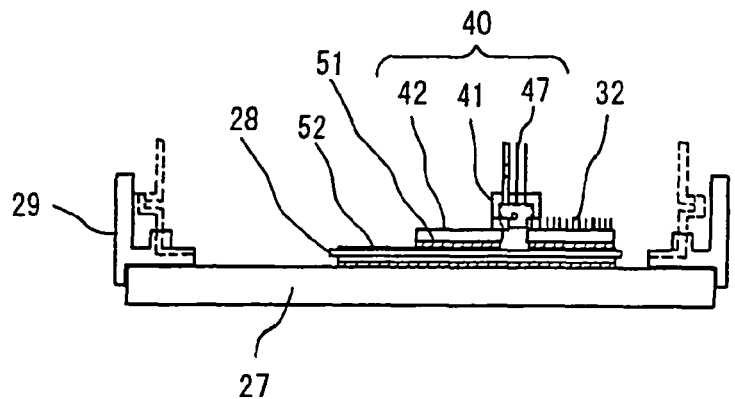
FIG. 5 shows the internal configuration of a power module (one-phase portion) of a power converter which is a first embodiment of the present invention and is also a sectional view taken substantially along the line A-A' in FIG. 4.
Figure 6:
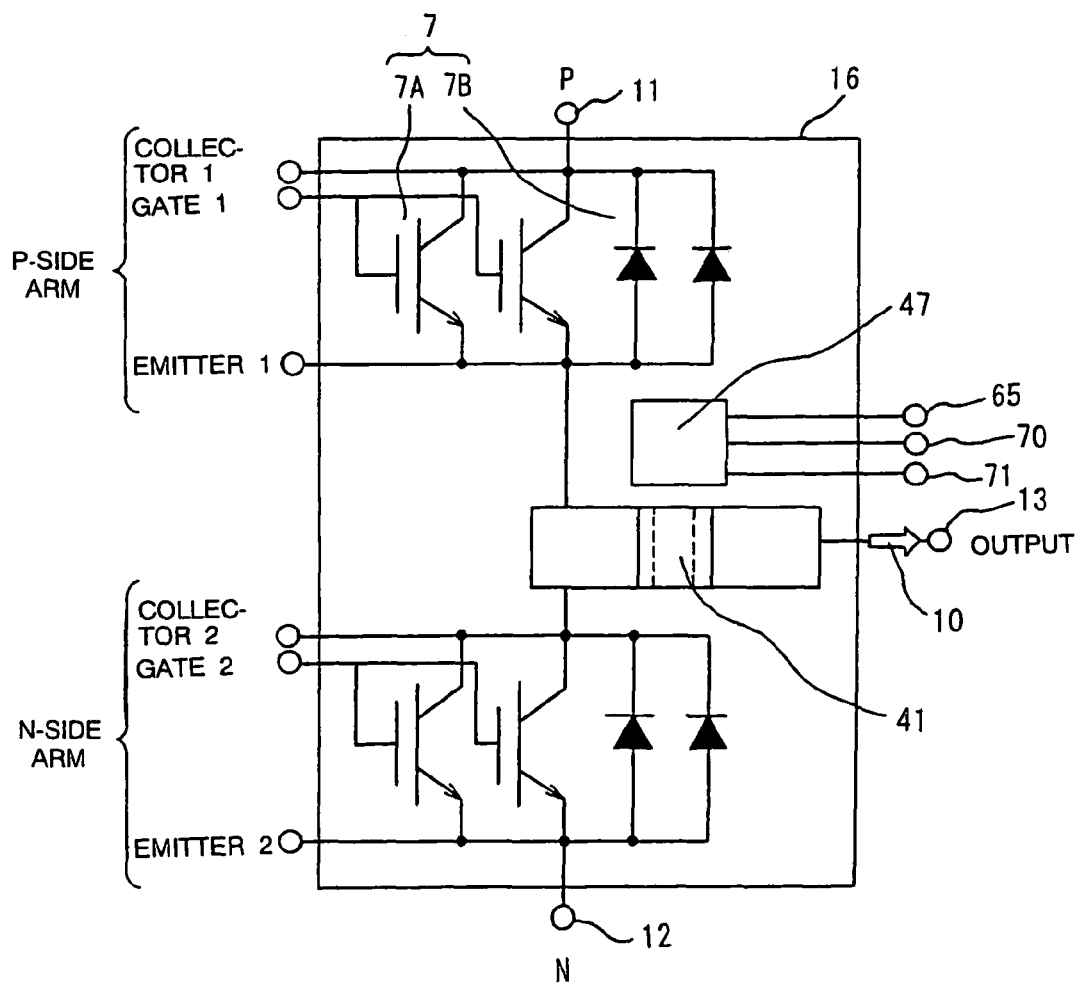
FIG. 6 a circuit diagram showing the electrical circuit configuration of a power module (one-phase portion) of a power converter which is a first embodiment of the present invention.
Figure 7:
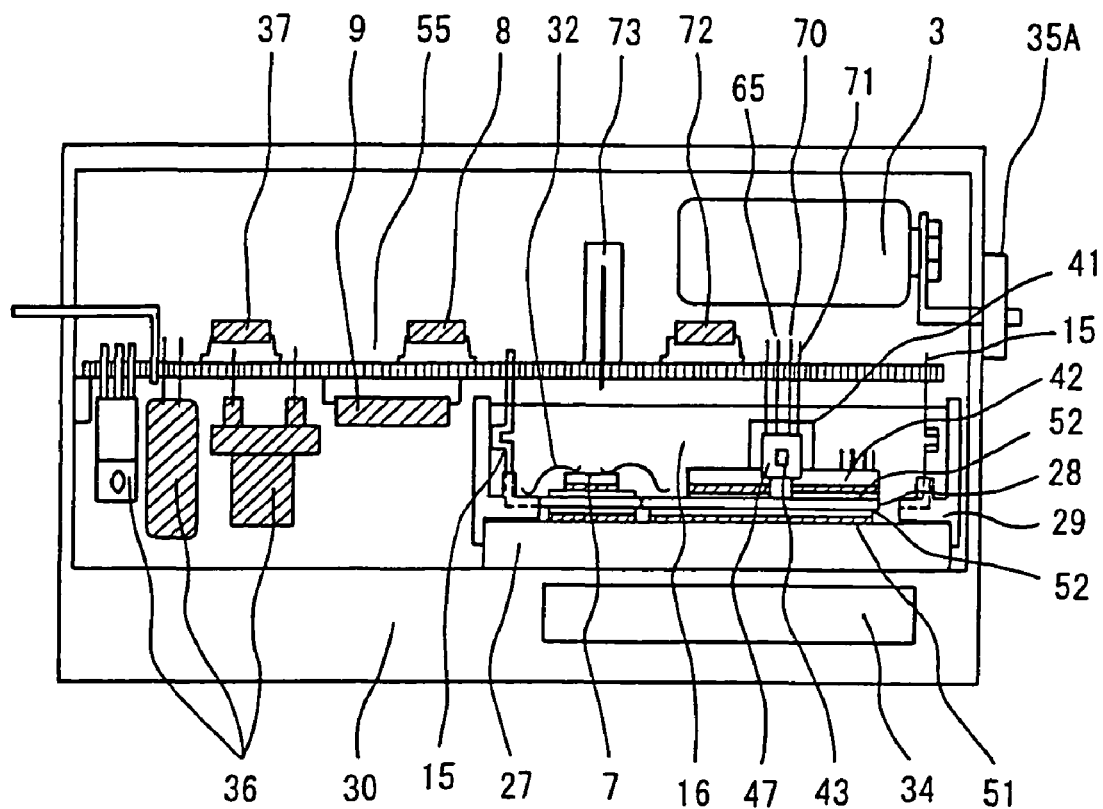
FIG. 7 is a sectional view showing the internal configuration of a power converter which is a first embodiment of the present invention.

FIGS. 4 and 5 show the configuration of one-phase portion of the power module which is incorporated in a power converter according to this embodiment. FIG. 6 shows the electrical circuit configuration of one-phase portion of the power module which is incorporated in a power converter according to this embodiment. FIG. 7 shows the entire configuration of the power converter according to this embodiment.

In the drawings, 30 denotes a power converter case. The power converter case 30 encases a power module 16 and a control unit 26. The power module 16 is arranged such that three-phase portions of implements, each of which consists of a power module base 27 and a module case 29 installed vertically along the periphery of the power module base 27, are juxtaposed on the bottom wall of the power converter case 30.

Three ceramic substrates, which are plate-like insulation members, are disposed on the power module base 27. The ceramic substrate 28 is fixed onto the power module base 27 by means of solder 51 with a laminated copper foil electrode 52 fixed onto the power module base 27 interposed. A wiring pattern (or arm) created by a laminated copper foil electrode 52 is fixed onto the other surface of the ceramic substrate 28 which is located opposite the power module base 27 side. An electrode 52 is fixed onto the surface of two of three ceramic substrates 28 which is located opposite the power module bases 27, and a power controlling semiconductor element 7 is fixed onto the electrode 52 by means of solder 51. This configuration creates laminates which consist of a positive conversion circuit and a negative conversion circuit. The laminates which consist of a positive conversion circuit and a negative conversion circuit are located opposite to each other on the power module base 27. Two power controlling semiconductor elements 7, each of which is arranged such that an IGBT7A and a diode element 7B are electrically connected in parallel, are mounted to the laminates which consist of a positive conversion circuit and a negative conversion circuit so that the two power controlling semiconductor elements 7 are electrically connected in parallel.

In the laminate that constitutes a positive conversion circuit, the collector of IGBT7A and the cathode of diode element 7B are electrically connected to the arm of collector 1, the emitter of IGBT7A and the anode of diode element 7B are electrically connected to the arm of emitter 1, and the gate of IGBT7A is electrically connected to the arm of gate 1. The DC positive connection terminal 11 is electrically connected to the arm of collector 1. A current detector 40 is electrically connected to the arm of emitter 1.

In the laminate that constitutes a negative conversion circuit, the collector of IGBT7A and the cathode of diode element 7B are electrically connected to the arm of collector 2, the emitter of IGBT7A and the anode of diode element 7B are electrically connected to the arm of emitter 2, and the gate of IGBT7A is electrically connected to the arm of gate 2. The DC positive connection terminal 12 is electrically connected to the arm of emitter 2. A current detector 40 is electrically connected to the arm of collector 2.

The other ceramic substrate 28 is disposed at one end of the laminate that constitutes a positive conversion circuit and the laminate that constitutes a negative conversion circuit. An electrode 52 is fixed onto the surface of the other ceramic substrate 28 which is located opposite the power module base 27 side, and a current detector 40 is fixed onto the electrode 52 by means of solder 51. Thus, laminates on which the current detector 40 is mounted are created. Specific configuration of the current detector 40 will be described later.

On one side of the power module 16 which is an opposite side of the current detector 40 side, a positive connection terminal 11 which is mechanically connected to the DC positive-side bus bar 31A and a negative connection terminal 12 which is mechanically connected to the DC negative-side bus bar 31A are disposed. On the current detector 40 side of the power module 16, one-phase portion of connection terminal 13 which is mechanically connected to the AC one-phase portion of bus bar 31B is disposed.

A control board 55, which is a plate-like insulation member, is disposed above the power module 16. Laminated copper foil electrodes are fixed onto both surfaces of the control board 55, and a drive circuit 8, computer 9, control power source 36 and an interface circuit 37 which constitute a control unit 26 are put into electrical contact with the control board 55. Furthermore, a buffer circuit 72, external connection terminal 73, control terminal 15 of the power controlling semiconductor element 7 which protrudes upward from the power module, and a connection terminal 44 of the current detector 40 have electrical connections with the control board 55.

A cooler 34 is disposed in the housing body which corresponds to the bottom wall of the power converter case 30. The cooler 43 is a cooling conduit through which cooling water, a cooling medium, flows. Thus, heat generated in the power controlling semiconductor element 7 is transmitted to the cooler 34 via the ceramic substrate 28 and the power module base 27, and cooled by cooling water flowing through the cooler 34. Moreover, in this embodiment, a cooling conduit is used as a cooler 43; however, a heat discharge member (cooling fin), which is capable of exchanging heat with cooling air, a cooling medium, can also be used.

A capacitor 3, which is a capacitance element, is disposed above the control board 55. The capacitor 3 is provided to suppress DC voltage change due to the switching operation by the power controlling semiconductor element 7, and the capacitor 3 has electrical connections with the DC positive-side bus bar 31A and the DC negative-side bus bar 31A. Herein, a field-effect capacitor is used as capacitor 3 but not limited to it; any capacitance element which functions as stated above is applicable.

A wire-bonding system which uses aluminum wires 32 as connecting members is utilized to make the electrical connections between the connection terminal 11 and the arm of collector 1, between the connecting conductor 12 and the arm of emitter 2, between electrodes of the power controlling semiconductor element 7 and each arm, and among the current detector 40, the arm of emitter 1, the arm of collector 2 and the connection terminal 13.

Figure 1:
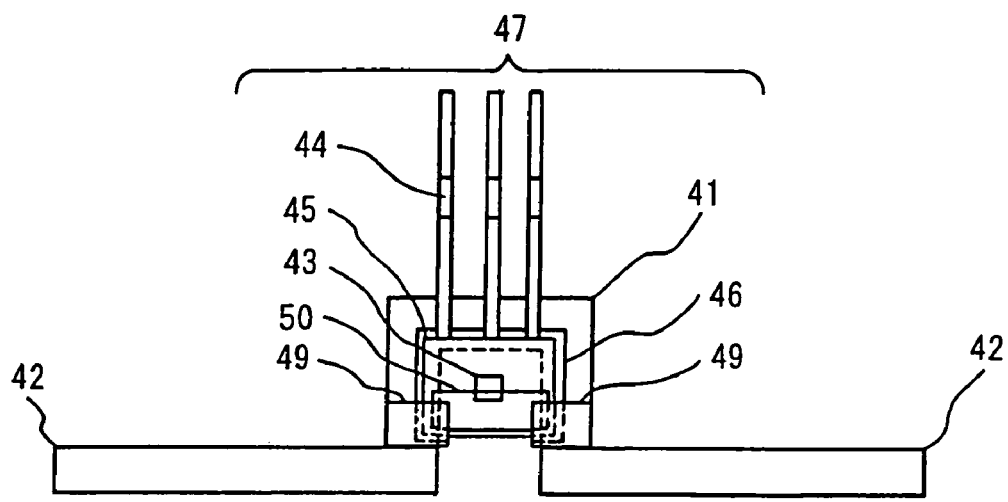
FIG. 1 is a front view showing the configuration of a current detector built in a power module of a power converter which is a first embodiment of the present invention.
Figure 2:
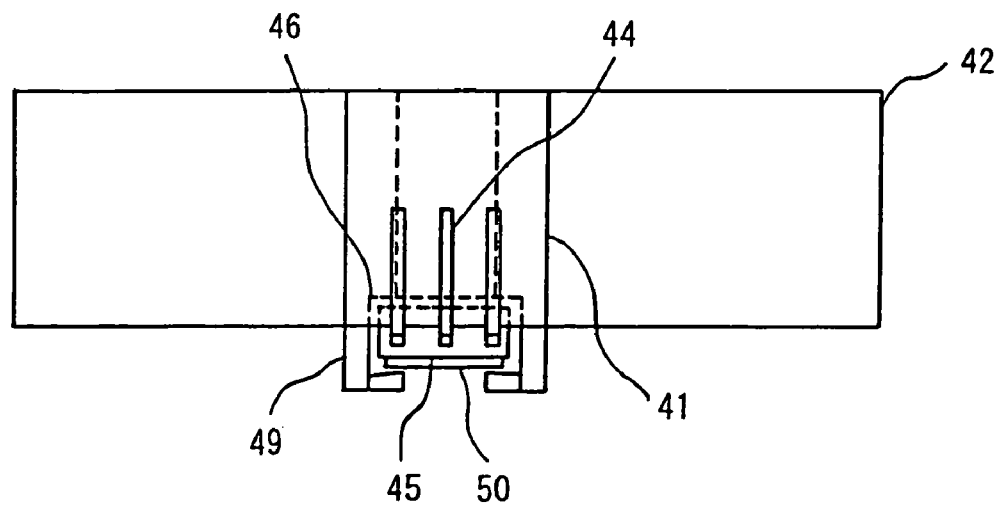
FIG. 2 is a top view showing the configuration of a current detector built in a power module of a power converter which is a first embodiment of the present invention.
Figure 3:
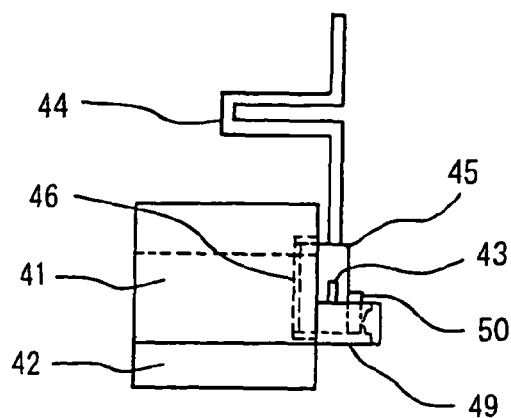
FIG. 3 is a side view showing the configuration of a current detector built in a power module of a power converter which is a first embodiment of the present invention.

FIGS. 1 through 3 show the configuration of a current detector built in a power module of a power converter according to this embodiment. A current detector 40 detects AC power current which has been converted by a power controlling semiconductor element 7 and is supplied to the motor 5. The current detector 40 consists of a magnetic detecting unit 47, detection conductor 41, and current detection electrodes 42. The magnetic detecting unit 47 has a function to calibrate accuracy of the detection and is configured such that a magnetic detecting semiconductor element 43 and part of connection terminals 44 (i.e. power source terminal 65, signal terminal 70, and calibration terminal 71) which have electrical connections with the magnetic detecting semiconductor element 43 are covered with molded resin 45. A Hall element is used for the magnetic detecting semiconductor element 43.

The power source terminal 65 is a connection terminal 44 which supplies electric power for driving a magnetic detecting semiconductor element 43 to the magnetic detecting semiconductor element 43, and has an electrical connection with a control power source 36 of the control unit 26. The signal terminal 70 is a connection terminal 44 which transmits the result detected by the magnetic detecting semiconductor element 43, and has an electrical connection with the computer 9 of the control unit 26. The calibration terminal 71 is a connection terminal 44 which transmits a calibration signal for calibrating the accuracy of the current detection to the magnetic detecting semiconductor element 43, and has an electrical connection with the computer 9 of the control unit 26 via a buffer circuit 72. The calibration signal outputted from the computer 9 of the control unit 26 is stepped up or down by the buffer circuit 72. Furthermore, the power source terminal 65, signal terminal 70 and the calibration terminal 71 have electrical connections with the external connection terminal 73, and therefore, power for driving a magnetic detecting semiconductor element 43 and a calibration signal for calibrating the accuracy of the current detection of the magnetic detecting unit 47 can be received from the outside and the result detected by the magnetic detecting semiconductor element 43 can be sent to the outside.

Two current detection electrodes 42, which are plate-like conductive members, are disposed opposite to each other at intervals and fixed by means of solder 51 onto the electrodes 52 which are fixed onto the surface of the ceramic substrate 28 which is an opposite side of the power module base 27 side. An electrode 52 to which one current detection electrode 42 is fixed has no electrical connection with the other electrode 52 to which the other current detection electrode 42 is fixed.

The detection conductor 41 is a conductive member through which a load current 10, detection current, flows, thereby generating magnetic flux to be detected by the magnetic detecting unit 47. The detection conductor 41 is made long and thin and reciprocating currents flow therethrough in proximity to each other so that magnetic flux created by detection current is efficiently concentrated to make the magnetic flux density become prescribed intensity at a prescribed location and also, an area in which density of the magnetic flux moderately changes can be formed near the prescribed location. The detection conductor 41 is electrically and mechanically connected to the current detection electrodes 42 which are disposed opposite to each other at intervals.

Specifically, the detection conductor 41 consists of a portion installed vertically on one current detection electrode 42, a portion installed vertically on the other current detection electrode 42, and a portion which is disposed parallel to the current detection electrodes 42 and has electrical and mechanical connections with those vertically installed portions; and the detection conductor 41 is provided in a protruding manner from the portion which is disposed parallel to the current detection electrodes 42 in the direction further away from the power module base 27 than the current detection electrodes 42 laminated on the power module base 27 with the ceramic substrate 28 interposed (or in the direction of the laminate from the power module base 27, toward the ceramic substrate 28, and toward the current detection electrodes 42, or upward).

In the detection conductor 41 configured as stated above, detection current flowing through the current detection electrodes 42 (i.e. the detection current which flows on the plane parallel to the surface on which the power module base 27 is located) flows in the direction away from the power module base 27 (i.e. the plane parallel to the surface on which the power module base 27 is located), or in the direction of the laminate from the power module base 27, toward the ceramic substrate 28, and toward the current detection electrodes 42, or upward, and then the detection current flows in the direction toward the power module base 27 (i.e. the plane parallel to the surface on which the power module base 27 is located), or in the direction of the laminate from the current detection electrodes 42, toward the ceramic substrate 28, and toward the power module base 27, or downward.

Relative distance between the detection conductor 41 and the power module base 27 is larger than the relative distance between the power controlling semiconductor element 7 and the power module base 27. In addition, relative distance between the detection conductor 41 and the power module base 27 is larger than relative distance between the current detection electrodes 42, which are laminated on the power module base 27 with the ceramic substrate 28 interposed, and the power module base 27.

On the surface of the detection conductor 41, a depression 46 (concave portion) is provided on one side end (one side end of the protruding section) in the direction perpendicular to the detection current flow. Part of the magnetic detecting unit 47 is contained in the depression 46 so that the connection terminals 44 extend upward (or in the direction of the laminate from the power module base 27, toward the ceramic substrate 28, and toward the current detection electrodes 42). In this embodiment, only one magnetic detecting unit 47 is provided; however, another magnetic detecting unit can be provided on the other side end (i.e. the other side end of the protruding section) in the direction perpendicular to the detection current flow on the surface of the detection conductor 41, that is, at a location symmetrical to the aforementioned magnetic detecting unit 47 so that another magnetic detecting unit functions as a backup.

A fixing jig abuts on a molded resin 45, which is not opposite to the depression 46 in the magnetic detecting unit 47, with an adhesion layer 50 interposed. The fixing jig is an arm-like protruding portion 49 which is created such that the detection conductor 41 protrudes into the molded resin 45, which is not opposite to the depression 46 in the magnetic detecting unit 47, so that the fixing jig surrounds (embraces) a part of the molded resin 45 of the magnetic detecting unit 47. The adhesion layer 50 is elastic enough to press the magnetic detecting unit 47 or the adhesion layer 50 becomes hard and adhesive by being processed by a prescribed procedure, thereby bonding together the magnetic detecting unit 47 and the protruding portion 49.

The calibration signal for calibrating the accuracy of the current detector 40 is created by a computer 9 according to the comparison between the value obtained by the current detector 40 detecting reference current flowing through the detection conductor 41 and the reference current value. The created calibration signal is stepped up or down by the buffer circuit 72 and then inputted into the current detector 40.

In this embodiment, a calibration signal is created by the computer 9; however, another computer can be provided and operated like this: the first calibration signal is created by the computer 9 according to the comparison between the value obtained by the current detector 40 detecting reference current flowing through the detection conductor 41 and the reference current value; and then the second calibration signal is created by another computer according to the comparison between the value obtained by the current detector 40 detecting reference current flowing through the detection conductor 41 and the reference current value; and if it is determined that the first calibration signal is false as the result of comparison between the second calibration signal and the first calibration signal, the second calibration signal can be outputted to the current detector 40 instead of the first calibration signal.

According to this embodiment, a current detector 40, which detects current flowing through the detection conductor 41 by inputting magnetic flux generated by the detection conductor 41 directly into the magnetic detecting semiconductor element 43, is incorporated into a power converter 24, and therefore, it is possible to make the current detector 40 smaller than conventional current detectors, thereby enabling the current detector 40 to be built in the power module 16 of the power converter 24. Therefore, according to this embodiment, no space is necessary in the power converter 24 to install the current detector, an AC bus bar 31B can be short or eliminated, an AC terminal block 35B can be eliminated, and the cable for supplying electric power to the motor 5 can be directly connected to the connection terminal 15; as a consequence, a power converter 24 can be made small. Also, according to this embodiment, it is possible to inhibit the size of the power module 16 from becoming large.

Furthermore, according to this embodiment, relative distance between the detection conductor 41 and the power module base 27 is larger than relative distance between the current detection electrode 42, which is installed on the power module base 27 with the ceramic substrate 28 interposed, and the power module base 27 (i.e. larger than relative distance between the power controlling semiconductor element 7 and the power module base 27), thereby making it possible to inhibit the influence of the magnetic flux which is generated by eddy current (induction current) flowing through the power module base 27 as the result that the magnetic flux generated by the current flowing through the detection conductor 41 interlinks with the power module base 27. Therefore, according to this embodiment, it is possible to improve the accuracy of the current detector 40. That is, the extent to which the amount of magnetic flux generated by the current flowing through the detection conductor 41 interlinks with the power module base 27 varies depending on the value of the coefficient of magnetically coupling between the magnetic flux generated by current flowing through the detection conductor 41 and the power module base 27. Accordingly, the magnitude of the eddy current (induction current) changes in proportion to the coupling coefficient. For this reason, as relative distance between the detection conductor 41 and the power module base 27 becomes larger, the amount of leakage of magnetic flux generated by current flowing through the detection conductor 41 increases, thereby making the coupling coefficient smaller. This reduces eddy current (induction current), that is, mirror current; therefore, it is possible to inhibit the influence of magnetic flux which is generated as the result of the flowing eddy current (induction current). Consequently, according to this embodiment, it is possible to improve the accuracy of the current detector 40.

Moreover, in this embodiment, a detection conductor 41 is provided as a means to enable relative distance between the detection conductor 41 and the power module base 27 to become larger than relative distance between the current detection electrode 42 and the power module base 27 (i.e. larger than relative distance between the power controlling semiconductor element 7 and the power module base 27); however, the same effect can be obtained by providing a depression in the power module base 27 which corresponds to the detection conductor 41 and making the thickness of the depression thinner than other portions.

Furthermore, according to this embodiment, at least a part of the magnetic detecting unit 47 is contained in the depression 46 created in the detection conductor 41, and therefore, it is possible to keep an interval between the magnetic detecting semiconductor element 43 and the detection conductor 41 constant. Therefore, according to this embodiment, there is no unevenness between the magnetic detecting semiconductor element 43 and the detection conductor 41, which prevents the accuracy of the current detector 40 from decreasing. Furthermore, the magnetic detecting unit 47 can be easily positioned. Consequently, according to this embodiment, it is possible to prevent production yield from decreasing, thereby preventing production costs of the power converter 24 from increasing.

Furthermore, according to this embodiment, a detection conductor 41 having a magnetic detecting unit 47 is installed on the power module base 27 with the current detection electrode 42 and ceramic substrate 28 interposed. This configuration allows heat generated in the detection conductor 41 and the current detection electrodes 42 due to current flow to be discharged via a power module base 27 which is a heat discharge member. Therefore, according to this embodiment, it is possible to inhibit heat transfer to the magnetic detecting unit 47, thereby preventing the temperature of the magnetic detecting semiconductor element 43 from rising above the specification limit. As a result, it is possible to inhibit performance of the magnetic detecting semiconductor element 43 from deteriorating due to heat, thereby increasing the accuracy of the current detector 40. Furthermore, it is possible to inhibit permanent deformation from occurring in the magnetic detecting semiconductor element 43 due to thermal stress generated by the difference of linear expansion coefficients between the magnetic detecting semiconductor element 43 and the molded resin 45, thereby increasing the accuracy of the current detector 40.

Furthermore, according to this embodiment, it is possible to increase the magnetic flux density at a prescribed location, thereby improving the S/N ratio of noise component resulted from incoming magnetic flux generated by current other than detection current to detection component. As a result, according to this embodiment, the accuracy of the current detector 40 can be increased.

Furthermore, according to this embodiment, it is possible to install a magnetic detecting unit 47 susceptible to thermal deformation separately from a detection conductor 41 on the power module 16. First, by means of the soldering process in which for several minutes at a high temperature a power controlling semiconductor element 7 is soldered, a detection conductor 41 is soldered onto the electrode 52 of the ceramic substrate 28. After that, a magnetic detecting unit 47 is inserted into a depression 46 created in the detection conductor 41, and a protruding portion 49 is abutted on the molded resin 45, which is not opposite to the depression 46 in the magnetic detecting unit 47, with an adhesion layer 50 interposed, and then the magnetic detecting unit 47 is fixed to the detection conductor 41. Consequently, according to this embodiment, the soldering process is not necessary to mount the magnetic detecting unit 47 to the detection conductor 41, thereby preventing reliability and accuracy of the detection of the magnetic detecting unit 47 from decreasing due to thermal stress caused by the soldering process.

Furthermore, according to this embodiment, a current detector 40 having a function to calibrate accuracy of the detection is used and the calibration signal for instructing calibration is created by a computer; therefore, it is possible for the computer 9 to calibrate a detection error resulted from misalignment between the magnetic detecting unit 47 and the detection conductor 41 which occurs when the power converter 24 is assembled and a detection error by the current detector 40 resulted from an error caused by the control power source 36. Therefore, according to this embodiment, it is possible to prevent yield of the power module 16 and power converter 24 from decreasing due to initial failure of the current detector 40. Herein, rightly, even if the current detector 40 does not have a function to calibrate accuracy of the detection, a control unit 26, not shown, can have a correction circuit or a computer 9 can execute digital corrections.

Furthermore, according to this embodiment, a computer other than computer 9 is provided to verify data calibrated by computer 9, thereby further increasing reliability of the current detector 40.

Moreover, according to this embodiment, it is possible to provide a small power converter 24 which is capable of accurately controlling electric power. Therefore, a motor drive system for an electric car which uses the power converter 24 can be made small, inexpensive, and highly reliable. Furthermore, an electric car which uses the power converter 24 can be made inexpensive, and its travel distance per one battery charge can be improved, and space for mounting the power converter can be reduced.

Embodiment 2

Figure 10:
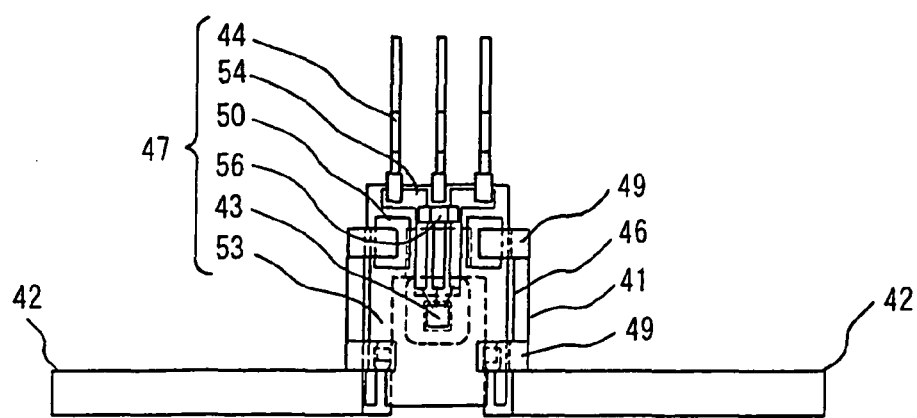
FIG. 10 is a front view showing the configuration of a current detector built in a power module of a power converter which is a second embodiment of the present invention.
Figure 11:
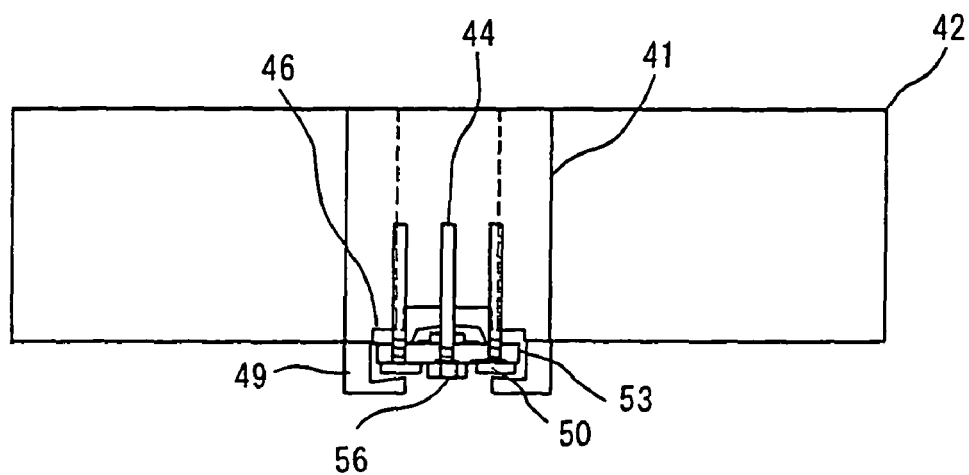
FIG. 11 is a top view showing the configuration of a current detector built in a power module of a power converter which is a second embodiment of the present invention.
Figure 12:
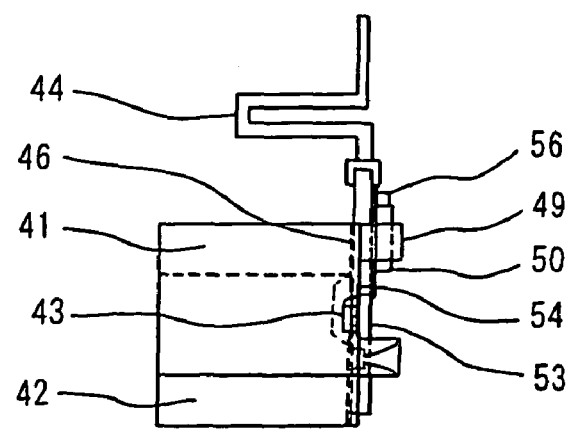
FIG. 12 is a side view showing the configuration of a current detector built in a power module of a power converter which is a second embodiment of the present invention.

A second embodiment of the present invention will be explained with reference to FIGS. 10 through 12. FIGS. 10 through 12 show the configuration of a current detector incorporated into a power converter of this embodiment. This embodiment is an altered example of the first embodiment. In this embodiment, a magnetic detecting semiconductor element 43 is fixed onto the printed wiring board 53 which is configured such that a plurality of laminated wiring sheets 54, each of which consists of a resin insulation layer and a laminated copper foil, are laminated; and a magnetic detecting unit 47 is provided in which the magnetic detecting semiconductor element 43 has electrical connections with the laminated wiring sheets 54 via aluminum wires, and connection terminals 44 have electrical connections with the laminated wiring sheets 54. The magnetic detecting semiconductor element 43 is covered with molded resin 45.

For example, the laminated wiring sheets 54 are disposed together with a wide shield electrode which is wired on the same wiring layer and allows most of the laminated wiring sheets 54 to overlap in a different wiring layer. Or, some of the laminated wiring sheets 54 are arranged on different wiring layers, and the laminated wiring sheets 54 are also disposed such that they overlap with the entire area. In the latter case, electronic parts, such as a chip capacitor 56, can be installed between the laminated wiring sheets 54.

A depression 46 is provided in the detection conductor 41 in the same manner as the first embodiment. A part of the magnetic detecting unit 47 is contained in the depression 46 so that connection terminals 44 extend in the same direction as shown in the first embodiment.

Two fixing jigs abut on a printed wiring board 53, which is not opposite to the depression 46 in the magnetic detecting unit 47, with an adhesion layer 50 interposed. The fixing jig is an arm-like protruding portion 49 which is created such that the detection conductor 41 protrudes into the printed wiring board 53, which is not opposite to the depression 46 in the magnetic detecting unit 47, so that the fixing jigs surround (embrace) the part of the printed wiring board 53. The adhesion layer 50 is elastic enough to press the magnetic detecting unit 47 or the adhesion layer 50 becomes hard and adhesive by being processed by a prescribed procedure, thereby bonding together the printed wiring board 53 and the protruding portion 49. The other configuration is the same as the first embodiment, and therefore, a specific description will be omitted.

According to this embodiment, the same effect as the first embodiment can be obtained, and it is also possible to flexibly change the shape of the connection terminals 44 which have electrical connections with the laminated wiring sheets 54 of the printed wiring board 53. Therefore, according to this embodiment, it is possible to increase the degree of flexibility of the connection system with the control board 55 of the control unit 26, and connection by means of a connector is also easily carried out.

Furthermore, according to this embodiment, the laminated wiring sheets 54 are disposed together with a wide shield electrode which is wired on the same wiring layer and allows most of the laminated wiring sheets 54 to overlap in a different wiring layer; or, some of the laminated wiring sheets 54 are arranged on different wiring layers, and the laminated wiring sheets 54 are also disposed such that they overlap with the entire area. Accordingly, it is possible to reduce magnetic flux (noise) which interlinks with the electrical annular wire connection created by circuit wiring of the control board 55, and therefore, it is possible to dispose noise control parts, such as a chip capacitor 56, in proximity to the magnetic detecting semiconductor element 43. As a result, according to this embodiment, the accuracy of the current detector 40 can be increased.

Embodiment 3

Figure 13:
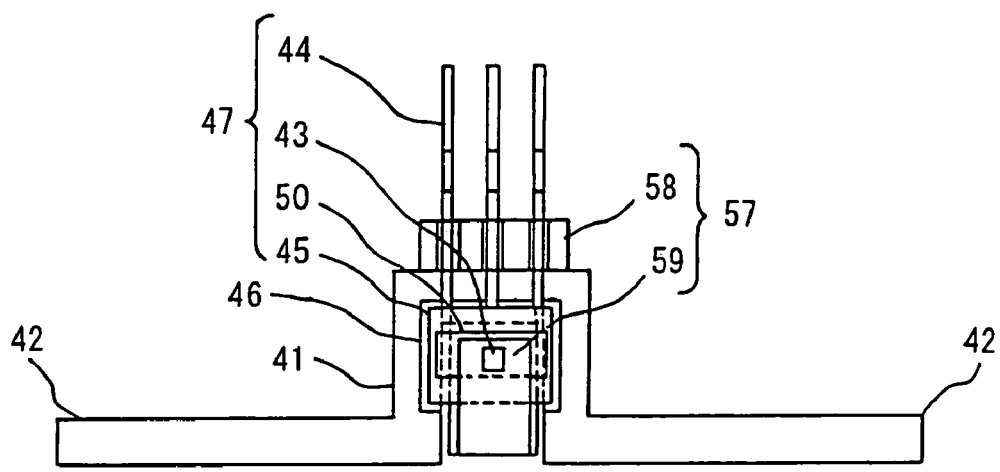
FIG. 13 is a front view showing the configuration of a current detector built in a power module of a power converter which is a third embodiment of the present invention.
Figure 14:
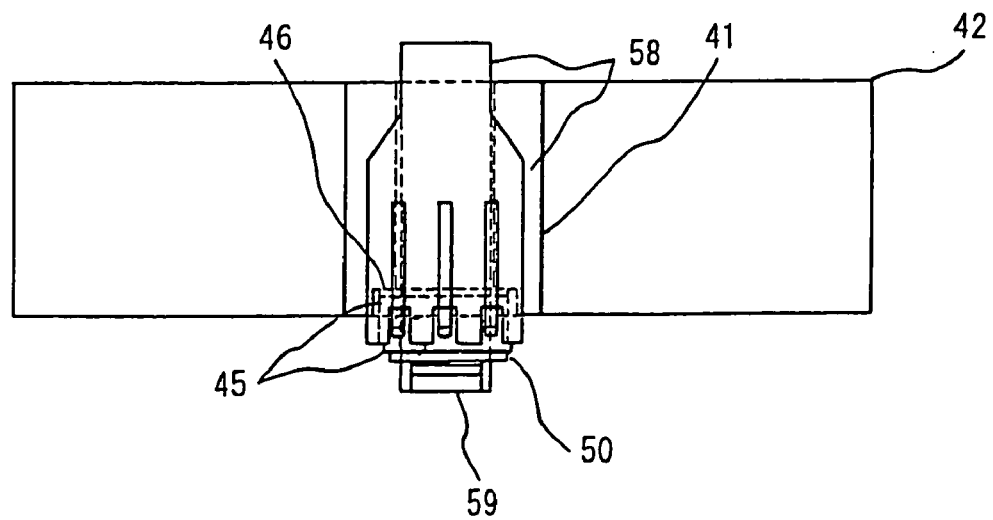
FIG. 14 is a top view showing the configuration of a current detector built in a power module of a power converter which is a third embodiment of the present invention.
Figure 15:
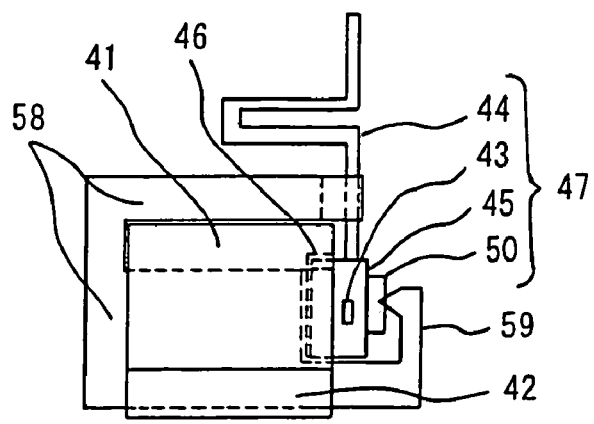
FIG. 15 is a side view showing the configuration of a current detector built in a power module of a power converter which is a third embodiment of the present invention.

A third embodiment of the present invention will be explained with reference to FIGS. 13 through 15. FIGS. 13 through 15 show the configuration of a current detector incorporated into a power converter of this embodiment. This embodiment is an altered example of the first embodiment. In this embodiment, a magnetic detecting unit 47 configured in the same manner as the first embodiment is provided, and a part of the magnetic detecting unit 47 is contained in the depression 46 of the detection conductor 41, which is provided in the same manner as the first embodiment, so that connection terminals 44 extend in the same direction as shown in the first embodiment.

The bottom portion of the nearly letter-U shaped resin formed body 57 having a protruding/recessed portion 58 is inserted into the cavity of the detection conductor 41 from one side of the detection conductor 41 which is the opposite side of the magnetic detecting unit 47 side, and is engaged with the detection conductor 41 so that the resin formed body 57 embraces the portion which is parallel to the current detection electrode 42 of the detection conductor 41. A claw 59 is formed at the tip of the bottom portion of the resin formed body 57. The claw-like protrusion of the claw 59 abuts on the molded resin 45, which is not opposite to the depression 46 in the magnetic detecting unit 47, with an adhesion layer 50 interposed, thereby securing the magnetic detecting unit 47. A concave portion into which connection terminals 44 are allowed to fit is created at the tip of the top portion of the resin formed body 57. The connection terminals 44 are fit into the concave portion located at the tip of the top portion of the resin formed body 57, and thus the connection terminals 44 are supported. The resin formed body 57 functions as a fixing jig for the magnetic detecting unit 47. The other configuration is the same as the first embodiment, and therefore, a specific description will be omitted.

In the current detector 40 configured as stated above, by means of the soldering process in which for several minutes at a high temperature a power controlling semiconductor element 7 is soldered, a detection conductor 41 is soldered onto the electrode 52 of the ceramic substrate 28. After that, the resin formed body 57 is inserted into the detection conductor 41 by using the protruding/recessed portion 58 formed on the resin formed body 57, thereby enabling the resin formed body 57 to engage with the detection conductor 41. Then, the magnetic detecting unit 47 is inserted into the depression 46 created in the detection conductor 41, and the claw-like protrusion of the claw 59 of the resin formed body 57 abuts on the molded resin 45, which is not opposite to the depression 46 in the magnetic detecting unit 47, with an adhesion layer 50 interposed, thereby securing the magnetic detecting unit 47 onto the detection conductor 41.

According to this embodiment, the same effect as the first embodiment can be obtained, and by integrating a resin formed body 57, which is blended with magnetic powder, and a detection conductor 41 into a magnetic circuit on the resin formed body 57, it is possible to improve the amount of magnetic flux inputted into the magnetic detecting unit 47.

Therefore, according to this embodiment, detection sensitivity of the current detector 40 can be increased.

Embodiment 4

Figure 16:
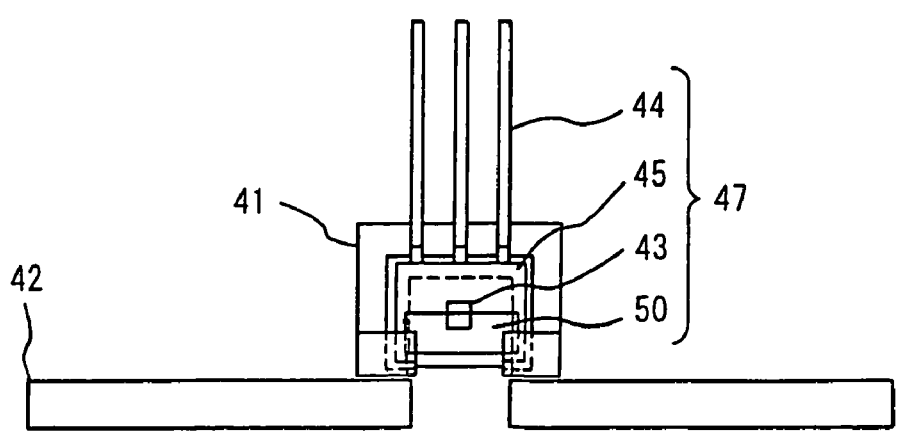
FIG. 16 is a front view showing the configuration of a current detector built in a power module of a power converter which is a fourth embodiment of the present invention.
Figure 17:
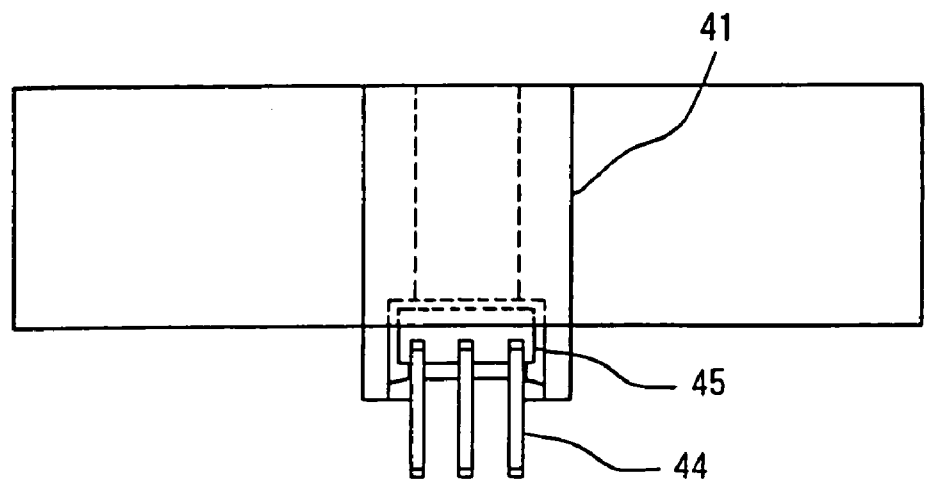
FIG. 17 is a top view showing the configuration of a current detector built in a power module of a power converter which is a fourth embodiment of the present invention.
Figure 18:
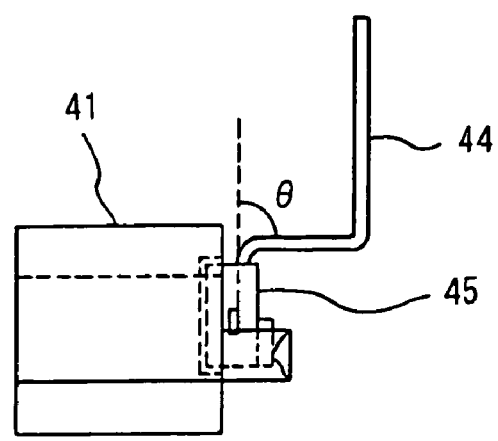
FIG. 18 is a side view showing the configuration of a current detector built in a power module of a power converter which is a fourth embodiment of the present invention.

A fourth embodiment of the present invention will be explained with reference to FIGS. 16 through 18. FIGS. 16 through 18 show the configuration of a current detector incorporated into a power converter of this embodiment. This embodiment is an altered example of the first embodiment. In this embodiment, a magnetic detecting unit 47 which is configured in the same manner as the first embodiment is provided, and a part of the magnetic detecting unit 47 is contained in the depression 46 of the detection conductor 41, which is provided in the same manner as the first embodiment, so that connection terminals 44 extend in the same direction as shown in the first embodiment.

The connection terminals 44 are bent at angle θ with the plane on which the magnetic detecting semiconductor element 43 is mounted toward the direction opposite of the detection conductor 41 side, and then extend upward (or in the direction of the laminate from the power module base 27, toward the ceramic substrate 28, and toward the current detection electrodes 42).

According to this embodiment, the same effect as the first embodiment can be obtained, and it is possible to prevent magnetic flux generated by the detection current flow from decreasing as the result of the magnetic flux interlinking with the electrical annular wire connection which is created by connection terminals 44 disposed in proximity to one another on the detection conductor 41 and the circuit wiring of the control board 55. Therefore, according to this embodiment, the accuracy of the current detector 40 can be increased.

Embodiment 5

Figure 19:
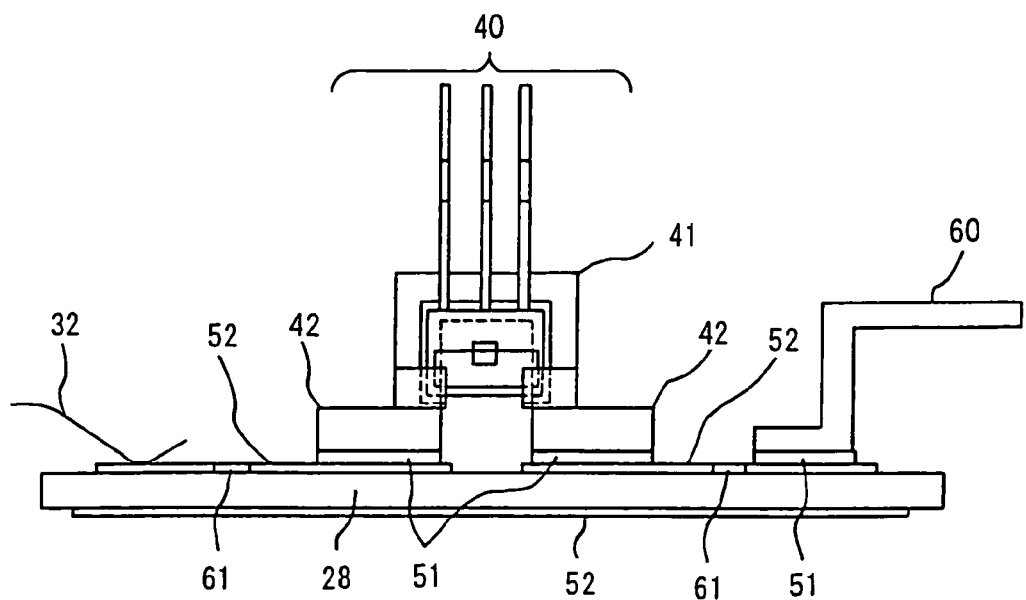
FIG. 19 is a front view showing the configuration of a current detector built in a power module of a power converter which is a fifth embodiment of the present invention.
Figure 20:
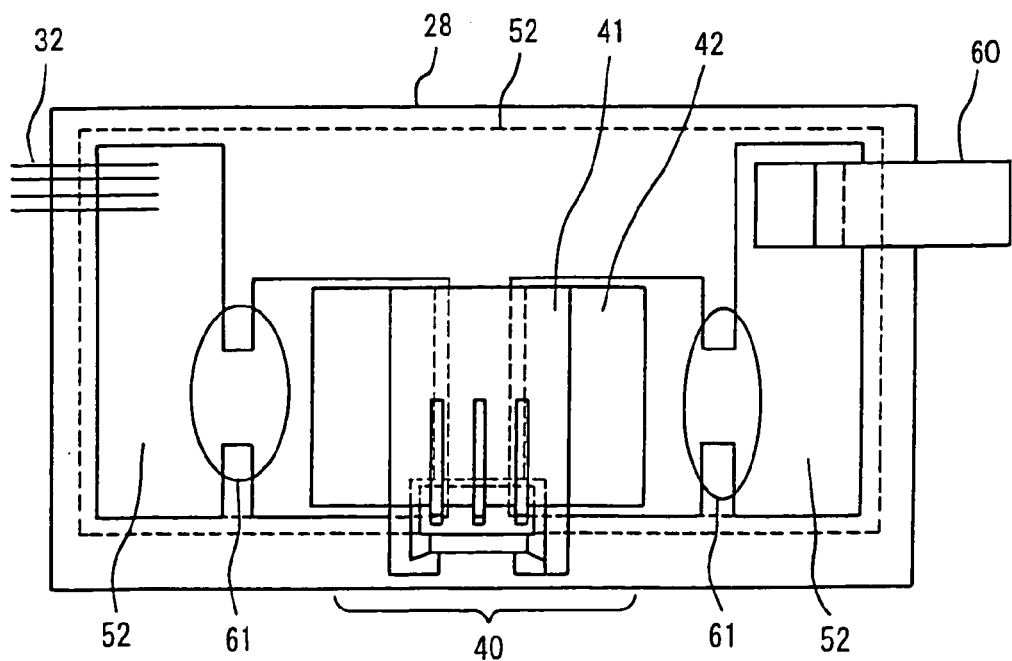
FIG. 20 is a top view showing the configuration of a current detector built in a power module of a power converter which is a fifth embodiment of the present invention.

A fifth embodiment of the present invention will be explained with reference to FIGS. 19 and 20. FIGS. 19 and 20 show the configuration of a current detector incorporated into a power converter of this embodiment. This embodiment is an altered example of the first embodiment. In this embodiment, the surface of the ceramic substrate 28 on which electrodes 52 are mounted is divided into two bilaterally symmetric portions by the bisector, and each of the electrodes 52 is disposed on the ceramic substrate 28 such that the two electrodes 52 are symmetric with respect to the bisector and right and left electrodes 52 are not connected.

On the electrodes 52, hour-glass shaped portions 61 for narrowing the path through which detection current flows are disposed such that those portions are bilaterally symmetric with respect to the bisector. Current detection electrodes 42 of the current detector 40 are soldered onto the electrodes 52 so that a current detector 40 configured in the same manner as the first embodiment is disposed on the bisector and is bilaterally symmetric with respect to the bisector. The hour-glass shaped portions 61 are located upstream and downstream of the current detector 40.

The electrode 52 disposed on the left side of the ceramic substrate 28 has an electrical connection with the conversion circuit of the power controlling semiconductor element 7 via an aluminum wire 32. The electrode 52 disposed on the right side of the ceramic substrate 28 has an electrical connection with the connection terminal 15 via a lead terminal 60. The other configuration is the same as the first embodiment, and therefore, a specific description will be omitted.

According to this embodiment, the same effect as the first embodiment can be obtained, and electrodes 52 and the current detector 40 are bilaterally symmetric with respect to the bisector of the ceramic substrate 28, and hour-glass shaped portions 61 are disposed on the electrodes 52 so that those portions are bilaterally symmetric with respect to the bisector. Therefore, it is possible to control detection current flowing through the detection conductor 41 so that the distribution of the detection current is bilaterally symmetric with respect to the bisector. As a result, according to this embodiment, it is possible to inhibit the current density in the detection conductor 41 from becoming inconsistent due to the current concentration in the complicated wiring of the power module 16 resulting from reducing the size of the power module 16. Consequently, the accuracy of the current detector 40 can be increased.

Embodiment 6

Figure 21:
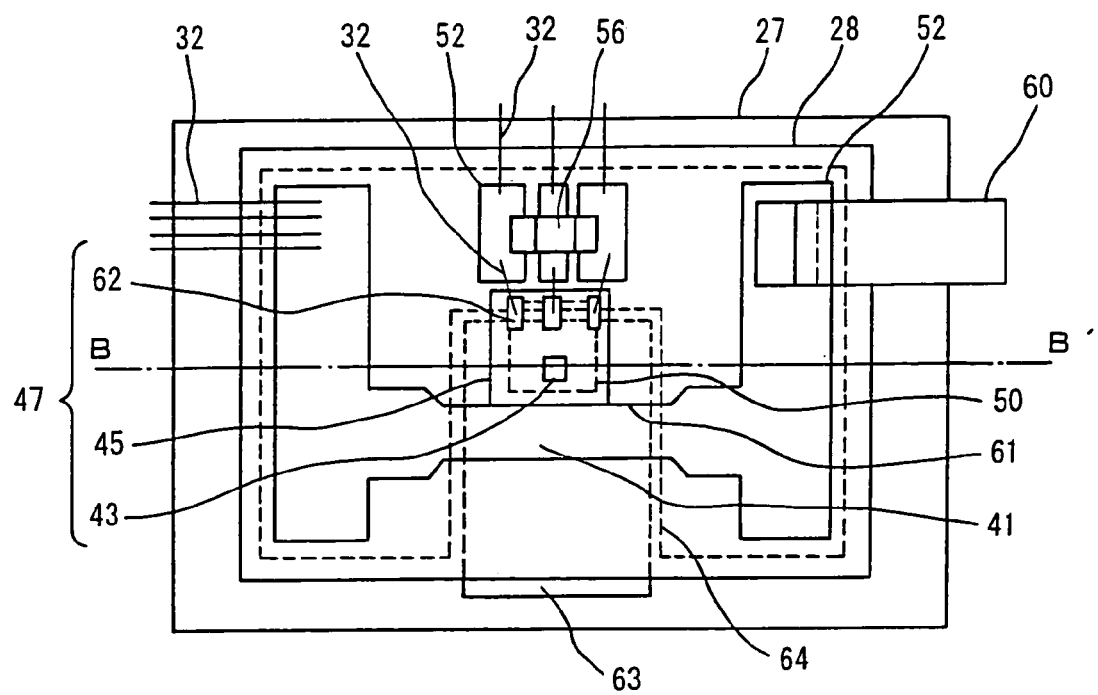
FIG. 21 is a top view showing the configuration of a current detector built in a power module of a power converter which is a sixth embodiment of the present invention.
Figure 22:
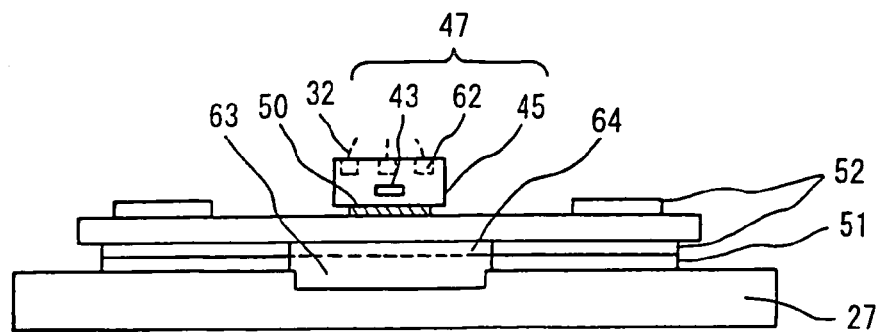
FIG. 22 shows the configuration of a current detector built in a power module of a power converter which is a sixth embodiment of the present invention, and is also a sectional view taken substantially along the line B-B' in FIG. 21.

A sixth embodiment of the present invention will be explained with reference to FIGS. 21 and 22. FIGS. 21 and 22 show the configuration of a current detector incorporated into a power converter of this embodiment. In this embodiment, the surface of the ceramic substrate 28 on which electrodes 52 are mounted is divided into two bilaterally symmetric portions by the bisector, and each of the electrodes 52 is disposed on the ceramic substrate 28 such that the two electrodes 52 are symmetric with respect to the bisector, and right and left electrodes 52 are connected to form a current path.

On the electrodes 52, hour-glass shaped portions 61 for narrowing the path through which detection current flows are disposed such that those portions are bilaterally symmetric with respect to the bisector, and a current path flows from the left electrode 52 (upstream of the detection current) to the right electrode 52 (downstream of the detection current) thereby forming the detection conductor 41. The magnetic detecting unit 47 which is a component of the current detector is fixed onto the ceramic substrate 28 with an adhesion layer 50 interposed. The magnetic detecting unit 47 is located in proximity to the detection conductor 41 so that a part of the magnetic detecting unit 47 is contained in the hour-glass shaped portion 61 and also located on the bisector bilaterally symmetric with respect to the bisector.

The magnetic detecting unit 47 is configured such that the magnetic detecting semiconductor element 43 and a pad 62 which has an electrical connection with the magnetic detecting semiconductor element 43 are covered with the molded resin 45. The pad 62 is a conductive electrode member, and is exposed outside the molded resin 45. The pad 62 is connected to the electrode 52 fixed onto the ceramic substrate 28 via an aluminum wire. The electrode 52 disposed on the left side of the ceramic substrate 28 has an electrical connection with the conversion circuit of the power controlling semiconductor element 7 via an aluminum wire 32. The electrode 52 disposed on the right side of the ceramic substrate 28 has an electrical connection with a connection terminal 15 via a lead terminal 60. In the drawing, number 56 denotes a chip capacitor.

On the ceramic substrate 28, a non-wiring area is provided in which there is no wiring on the self and other layers in proximity to the detection conductor 41 and the magnetic detecting unit 47. An engraved portion 63 (or depression) is provided in the power module base 27 which corresponds to the detection conductor 41 and the magnetic detecting unit 47. Thus, a portion of the power module base 27 which corresponds to the detection conductor 41 and the magnetic detecting unit 47 is thinner than the remaining area. Therefore, relative distance between the detection conductor 41, magnetic detecting unit 47 and the power module base 27 is larger than relative distance between the power controlling semiconductor element 7 and the power module base 27.

According to this embodiment, the wiring on the self and other layers which are in proximity to the detection conductor 41 and the magnetic detecting unit 47 is eliminated, and an engraved portion 63 is provided in the power module base 27 which corresponds to the detection conductor 41 and the magnetic detecting unit 47. Therefore, it is possible to inhibit magnetic flux generated by detection current from being offset by counteracting magnetic flux generated by eddy current flowing through the wiring conductor, ceramic substrate 28 connecting solder 51 and the power module base 27 as the result that magnetic flux generated by detection current interlinks with a wiring conductor other than the detection conductor, ceramic substrate 28 connecting solder 51, and the power module base 27. As a result, according to this embodiment, the accuracy of the current detector can be increased.

Embodiment 7

Figure 23:
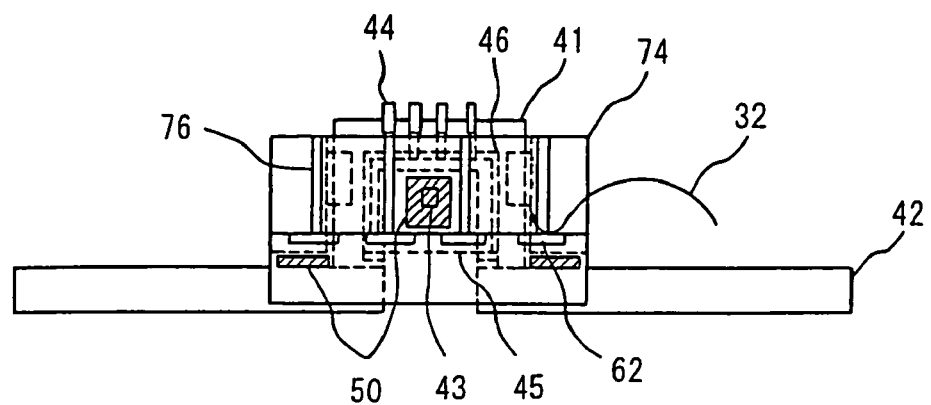
FIG. 23 is a front view showing the configuration of a current detector built in a power module of a power converter which is a seventh embodiment of the present invention.
Figure 24:
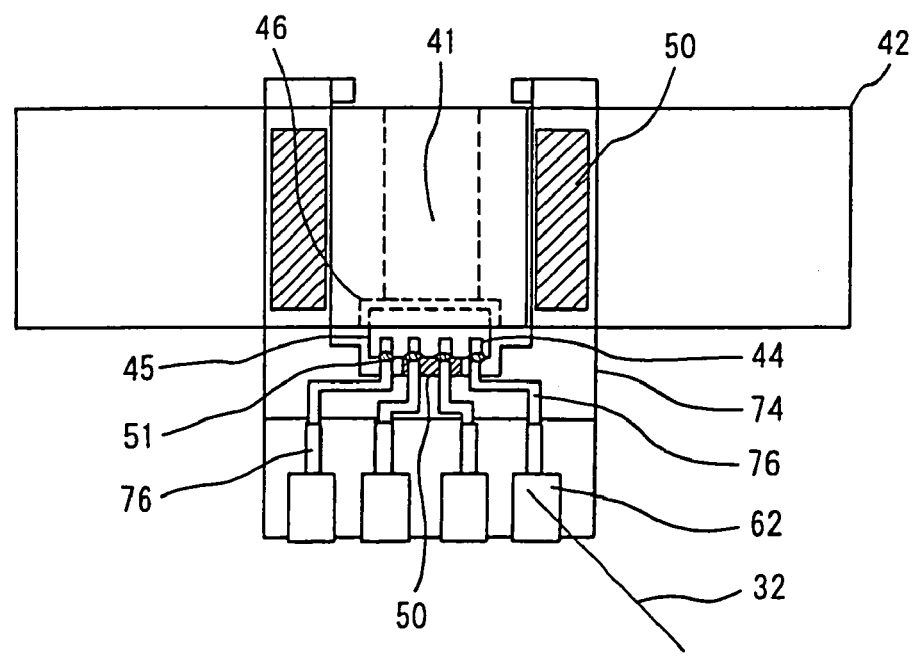
FIG. 24 is a top view showing the configuration of a current detector built in a power module of a power converter which is a seventh embodiment of the present invention.
Figure 25:
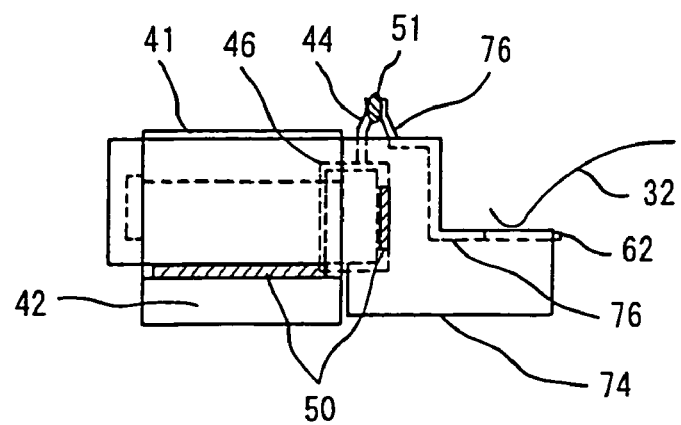
FIG. 25 is a side view showing the configuration of a current detector built in a power module of a power converter which is a seventh embodiment of the present invention.
Figure 26:
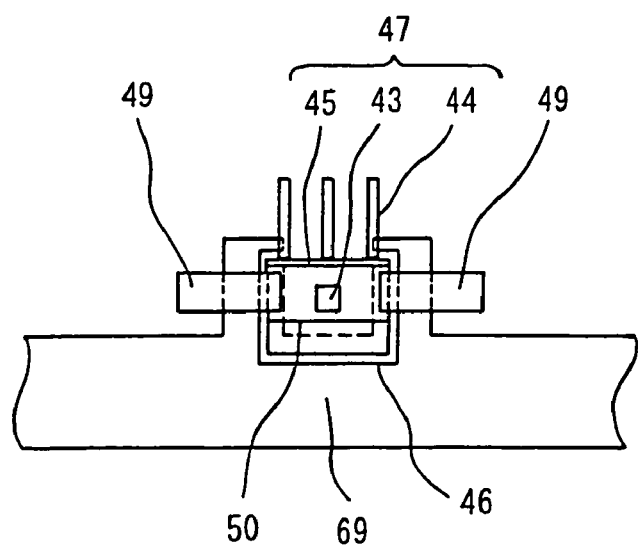
FIG. 26 is a front view showing the configuration of a current detector provided in the terminal block of a power converter which is an eighth embodiment of the present invention.
Figure 27:
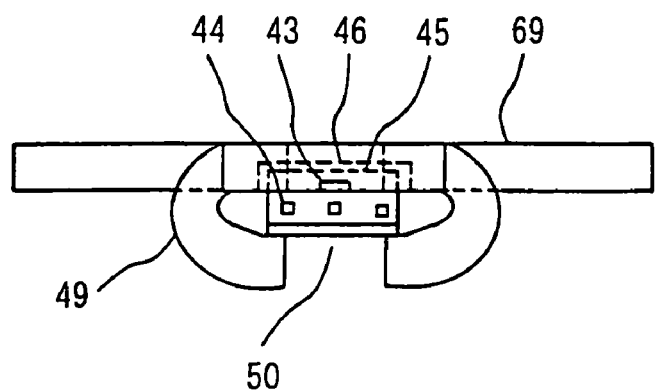
FIG. 27 is a top view showing the configuration of a current detector provided in the terminal block of a power converter which is an eighth embodiment of the present invention.
Figure 28:
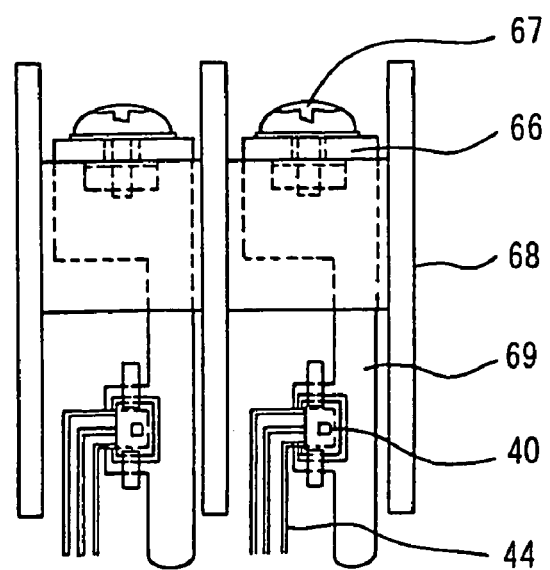
FIG. 28 is a front view showing the configuration of the terminal block of a power converter which is an eighth embodiment of the present invention.
Figure 29:
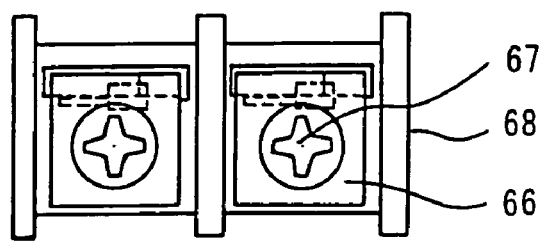
FIG. 29 is a top view showing the configuration of the terminal block of a power converter which is an eighth embodiment of the present invention.
Figure 30:
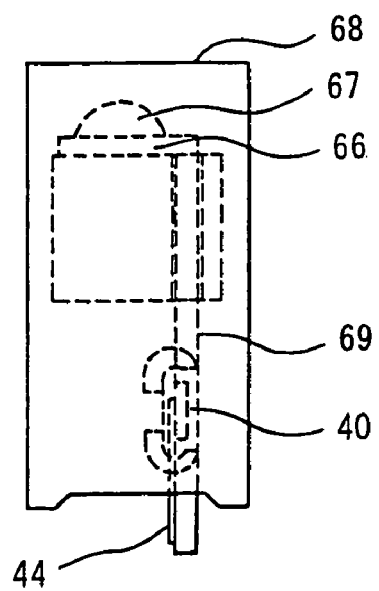
FIG. 30 is a side view showing the configuration of the terminal block of a power converter which is an eighth embodiment of the present invention.

A seventh embodiment of the present invention will be explained with reference to FIGS. 23 through 25. FIGS. 23 through 25 show the configuration of a current detector incorporated into a power converter of this embodiment. This embodiment is an altered example of the first embodiment. In this embodiment, a magnetic detecting unit 47 which is configured in the same manner as the first embodiment is provided, and a part of the magnetic detecting unit 47 is contained in the depression 46 of the detection conductor 41 provided in the same manner as the first embodiment so that connection terminals 44 extend in the same direction as shown in the first embodiment.

A fixing jig abuts on the molded resin 45, which is not opposite to the depression 46 in the magnetic detecting unit 47, with an adhesion layer 50 interposed. The fixing jig is an electrode-integrated resin formed body 74 and consists of a step portion located in the magnetic detecting unit 47 on the opposite side of the detection conductor 11 side, and an arm which extends from the step portion toward the opposite direction of the detection conductor's 11 magnetic detecting unit 47 side. A plurality of pads 62 are provided at the bottom of the step portion of the electrode-integrated resin formed body 74 so that the pads are exposed outside. Each of the pads 62 has an electrical connection with one end of the plurality of insert electrodes 76 inserted along the periphery of the step portion of the electrode-integrated resin formed body 74. The other end of the insert electrodes 76 protrudes outward at the top of the step portion of the electrode-integrated resin formed body 74 and is fixed onto the corresponding connection terminals 44 by means of solder 51. The pad 62 is a conductive electrode member which is flat and can be bonded with an aluminum wire 32.

The arm of the electrode-integrated resin formed body 74 extends from the step portion toward the opposite side of the detection conductor's 11 magnetic detecting unit 47 side so that the arm embraces the vertically installed detection conductor 41 thereby securely holding the detection conductor 41, and the arm is fix to the current detection electrode 42 with an adhesion layer 50 interposed.

In the current detector 40 configured as stated above, by means of the soldering process in which for several minutes at a high temperature a power controlling semiconductor element 7 is soldered, a detection conductor 41 is soldered onto the electrode 52 of the ceramic substrate 28. After that, the electrode-integrated resin formed body 74 is mounted to the detection conductor 41. Then, the magnetic detecting unit 47 is inserted into the depression 46 created in the detection conductor 41, and the electrode-integrated resin formed body 74 is fixed onto the molded resin 45, which is not opposite to the depression 46 in the magnetic detecting unit 47, with an adhesion layer 50 interposed.

According to this embodiment, the same effect as the first embodiment can be obtained, and connection terminals 44 of the magnetic detecting unit 47 are not directly connected to the control board 55. Therefore, it is possible to flexibly route an aluminum wire 32 or a wire in the power module 16 connected to the aluminum wire 32 and to flexibly lay out the position of the connection with the control board 55 regardless of the location of the current detection unit 47. As a result, distance between the magnetic detecting unit 47 and the detection conductor 41 can be effectively accurate.

Embodiment 8

Figure 31:
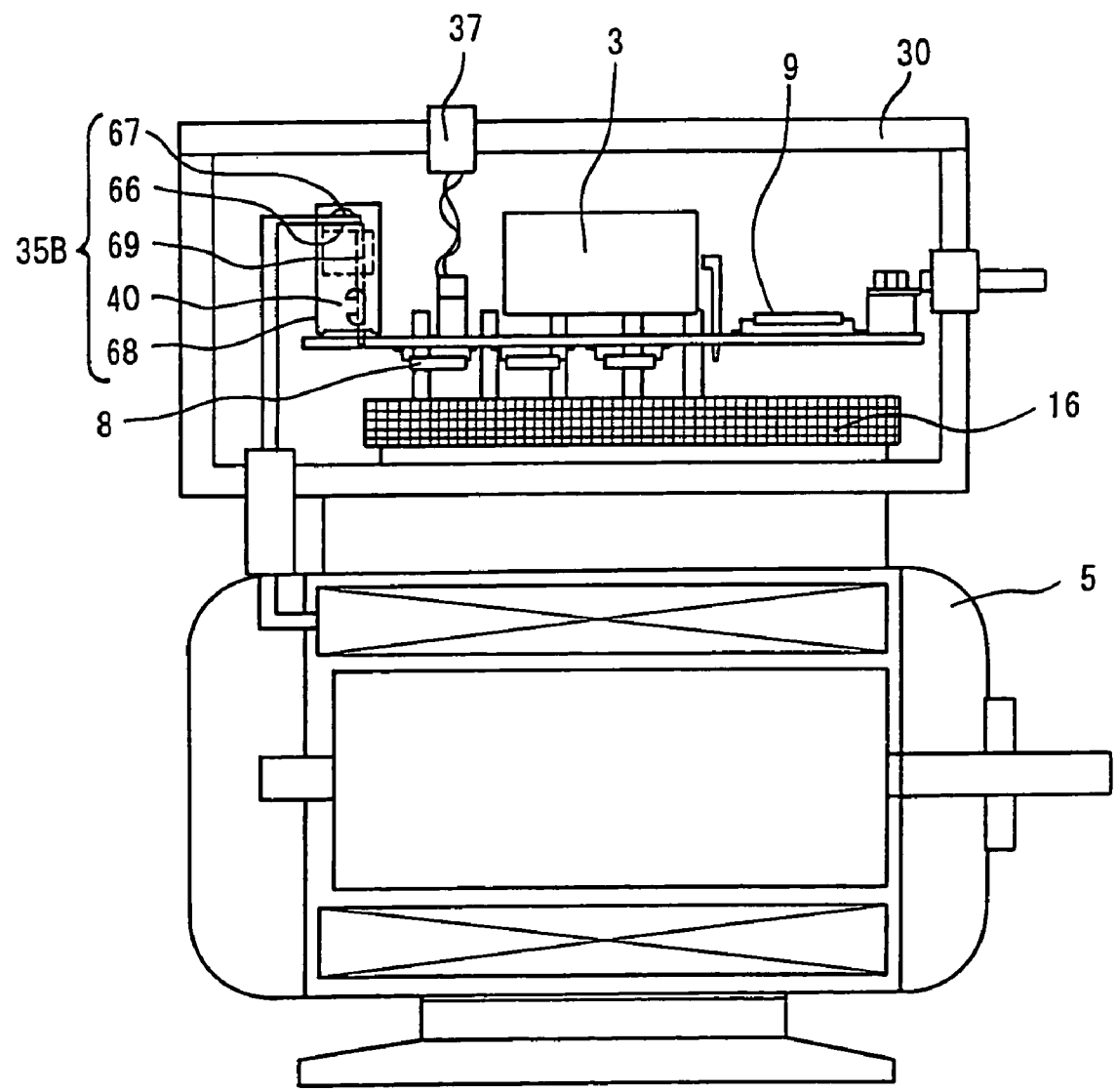
FIG. 31 is a sectional view showing the configuration of a power converter which is an eighth embodiment of the present invention.

An eighth embodiment of the present invention will be explained with reference to FIGS. 26 through 31. FIGS. 26 through 30 show the configuration of a current detector incorporated into a power converter of this embodiment. FIG. 31 shows the configuration of a power converter of this embodiment. An AC terminal block 35B which is incorporated into the power converter is a terminal for connecting a wire with the power converter 24 to supply AC power to the motor 5, an electric load. The AC terminal block 35B has an electrode plate 66 to connect wire, a tightening screw 67 to secure the wire, resin 68 to fix the electrode plate 66, a drive circuit 8 for controlling the computer 9 and power controlling semiconductor element 7 built in the power converter 24, capacitor 3, and an out-going electrode 69 which is connected to a prescribed wire of the control board 55 to which the power module 16 is connected. The surface on which the electrode plate 66 comes in contact with the wire is exposed on the surface of the resin 68. A part of the electrode plate 66 and out-going electrode 69 is securely built in the resin 68. The electrode plate 66 and the out-going electrode 69 are disposed on the same resin 68 at constant intervals.

This embodiment has a magnetic detecting unit 47 configured in the same manner as the first embodiment, and the part of the magnetic detecting unit 47 is contained in the depression 46 provided on the surface of the out-going electrode 69. The out-going electrode 69 is made partially thin to concentrate detection current. A fixing jig abuts on the molded resin 45, which is not opposite to the depression 46 in the magnetic detecting unit 47, with an adhesion layer 50 interposed. The fixing jig is an arm-like protruding portion 49 which is formed such that the out-going electrode 69 protrudes into the molded resin 45, which is not opposite to the depression 46 in the magnetic detecting unit 47, so that the fixing jig surrounds (embraces) a part of the molded resin 45 of the magnetic detecting unit 47. The adhesion layer 50 is elastic enough to press the magnetic detecting unit 47 or the adhesion layer 50 becomes hard and adhesive by being processed by a prescribed procedure, thereby bonding together the magnetic detecting unit 47 and the protruding portion 49.

According to this embodiment, because a current detector 40 is provided in the part of the out-going electrode 69 of the AC terminal block 35B, it is not necessary to provide new exclusive wiring for the current detector 40 in the wiring portion through which load current 10 of the power converter 24 flows. Therefore, according to this embodiment, it is possible to inhibit the size of the power module 16 from becoming large due to a built-in detection conductor 41 and also to inhibit production costs from increasing accordingly.

Furthermore, according to this embodiment, it is possible to eliminate a detection conductor 41 from the control board 55 to which a drive circuit 8 for controlling the computer 9 and power controlling semiconductor element 7, thereby making the control board 55 small.

Furthermore, according to this embodiment, it is possible to reduce magnetic noise components, generated in the circuits located in the vicinity of the detection conductor 41, which superpose with the result detected by the magnetic detecting unit 47. As a result, the accuracy of the current detector 40 can be increased.

Embodiment 9

Figure 32:
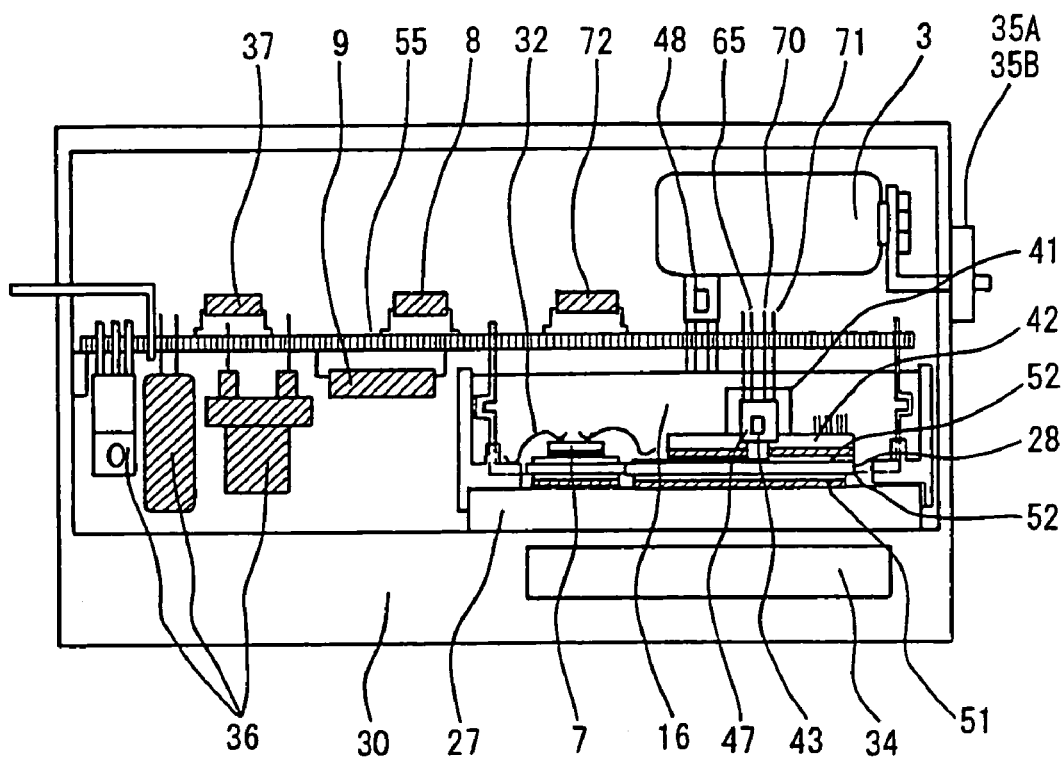
FIG. 32 is a sectional view showing the configuration of a power converter which is a ninth embodiment of the present invention.
Figure 33:
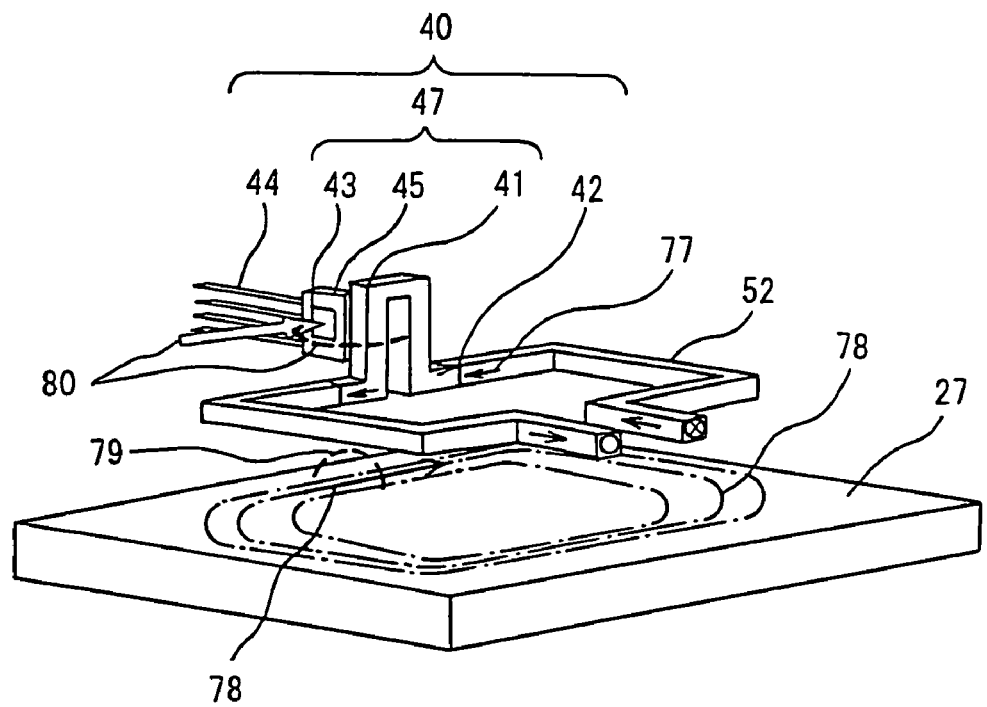
FIG. 33 is a perspective view showing the configuration of a current detector built in a power module of a power converter which is a tenth embodiment of the present invention.
Figure 34:
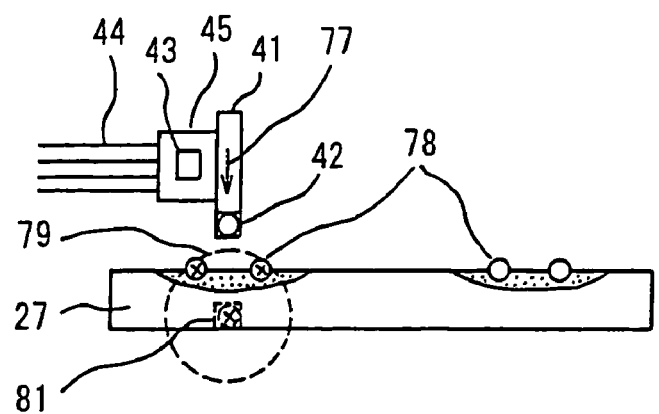
FIG. 34 is a side view partially broken showing the configuration of a current detector built in a power module of a power converter which is a tenth embodiment of the present invention.
Figure 35:
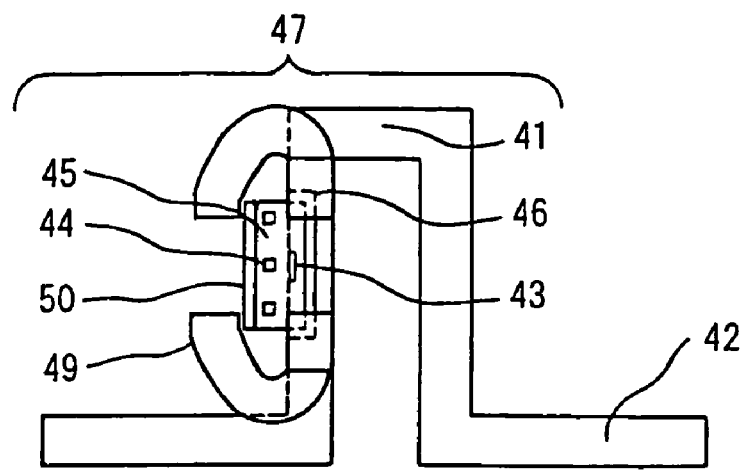
FIG. 35 is a front view showing the configuration of a current detector built in a power module of a power converter which is a tenth embodiment of the present invention.
Figure 36:
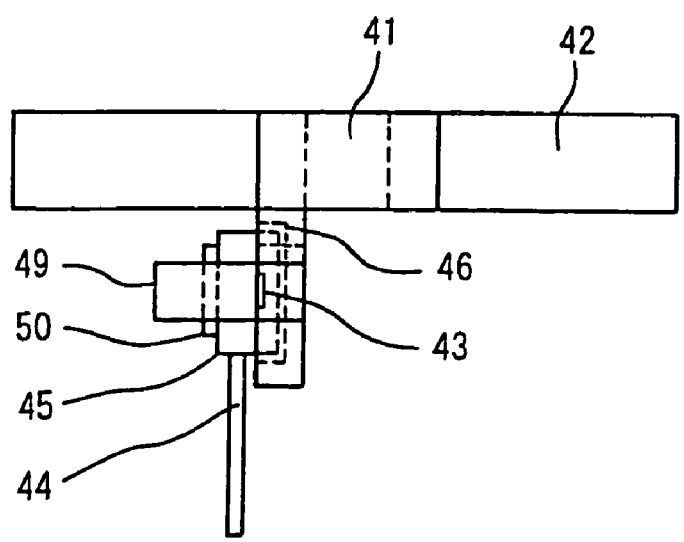
FIG. 36 is a top view showing the configuration of a current detector built in a power module of a power converter which is a tenth embodiment of the present invention.
Figure 37:
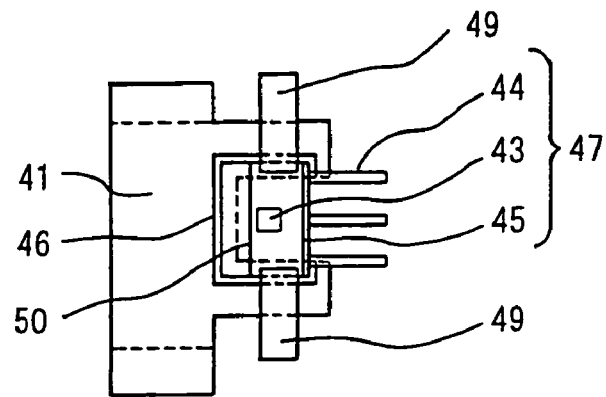
FIG. 37 is a side view showing the configuration of a current detector built in a power module of a power converter which is a tenth embodiment of the present invention.

A ninth embodiment of the present invention will be explained with reference to FIG. 32. FIG. 32 shows the configuration of a power converter of this embodiment. This embodiment is an altered example of the first embodiment. In the power converter 24 of this embodiment, a foreign magnetic detector 48 is disposed on the control board 55 in the vicinity of the current detector 40 in addition to the current detector 40 which detects load current 10 so that the direction of the foreign magnetic detector 48 is the same as the direction of the magnetic detecting unit 47. Results detected by the magnetic detecting unit 47 and the foreign magnetic detector 48 are inputted into the computer 9 and compared. Moreover, in this embodiment, results detected by the magnetic detecting unit 47 and the foreign magnetic detector 48 are inputted into the computer 9 and compared; however, it is possible to provide a circuit to compare the results detected by the magnetic detecting unit 47 and the foreign magnetic detector 48.

According to this embodiment, the current detector 40 detects the sum of the strong magnetic field radiated from the outside of the power converter 24 and the magnetic field generated by detection current, and then the foreign magnetic detector 48 detects the strong magnetic field radiated from the outside of the power converter 24 and compares an output from the current detector 40 with an output from the foreign magnetic detector 48. Accordingly, it is possible to correct a wrong value detected by the current detector 40 due to the foreign magnetic field, and if the foreign magnetic detector 48 detects a foreign magnetic field of the prescribed value or more, operation of the power converter 24 can be sustained or stopped at that value. Consequently, according to this embodiment, it is possible to inhibit the influence of an errant detection caused by foreign magnetic noise, thereby making it possible to improving reliability of the power converter 24.

Embodiment 10

A tenth embodiment of the present invention will be explained with reference to FIGS. 33 through 38. FIGS. 33 through 38 show the configuration of a current detector incorporated into a power converter of this embodiment. This embodiment is an altered example of the first embodiment, and the magnetic detecting unit 47 is disposed at a different location. The detection conductor 41 is laminated on the power module base 27 with an insulative ceramic substrate (not shown) interposed. Detection magnetic flux 80 generated by detection current 77 which flows through the detection conductor 41, current detection electrode 42, and other electrodes 52 which are connected to both ends of the current detection electrode 42 interlinks with the power module base 27. Accordingly, mirror current 81 flows through the power module base 27 according to the method of mirror image (or method of image) used in electromagnetism.

Generally, mirror current 81 is induction current 78 (or is called eddy current) induced by detection current 77 which flows parallel to the power module base 27, and flows near the surface of the power module base 27 in proportion to the square root of the product of the detection current 77 frequency and the electric conductivity and magnetic permeability of the power module base 27. In particular, when resistance of the power module base 27 is extremely low, or when detection current 77 frequency is extremely high, mirror current which is the same magnitude as detection current 77 flows in the area symmetrical to the surface of the power module base 27 in the reverse direction and also parallel to detection current 77, thereby generating magnetic flux 79 around the power module base 27. Magnetic flux 79 generated by induction current is frequency dependent because the density of mirror current 81, that is, induction current 78 (or eddy current) which flows through the surface of the power module base 27 changes according to the frequency of detection current 77. Magnetic flux 79 is characterized in that it mainly contains components vertical to the power module base 27 and has only few or no components parallel to the power module base 27. Therefore, depending on the location of the magnetic detecting unit 47, it is possible to inhibit the influence of magnetic flux generated by the power module base 27 on the magnetic detecting unit 47, thereby further increasing the accuracy of the current detector 40.

Thus, in this embodiment, the magnetic detecting unit 47 is disposed in the detection conductor 41 so that the magnetic detecting unit 47 detects magnetic flux having components parallel to the power module base 27 or to the induction current 78 (eddy current) flowing through the power module base 27 among detection magnetic fluxes 80 created by the detection conductor 41. Specifically, the magnetic detecting unit 47 is disposed in the detection conductor 41 which bends from the current detection electrode 42 and extends in the direction away from the power module base 27 and also vertical to the current detection electrode 42 (power module base 27) so that the magnetic detection surface of the magnetic detecting semiconductor element 43 is vertical and also parallel to either one of two portions of the detection conductor 41 which bend from the current detection electrode 42 and extend in the direction away from the power module base 27, that is, portions installed vertical to the current detection electrode 42 (power module base 27).

The magnetic detecting unit 47 can be disposed in either one or the other portion of the detection conductor 41 which bends from the current detection electrode 42 and extends in the direction away from the power module base 27, that is, a portion installed vertical to the current detection electrode 42 (power module base 27). In other words, the magnetic detecting unit 47 can be disposed in either a portion of the detection conductor 41 in which current flows in the direction away from the power module base 27 or the other portion of the detection conductor 41 in which current flows in the direction close to the power module base 27. Furthermore, the magnetic detecting unit 47 can be disposed either inside or outside of the current ring consisting of the detection conductor 41, current detection electrode 42, and the electrode 52.

Furthermore, by ensuring the sufficient length of the portion of the detection conductor 41 which extends parallel to the current detection electrode 42 (power module base 27), it is possible to reduce magnetic mutual interference of one of the portions which bend from the current detection electrode 42 and extend in the direction away from the power module base 27, that is, portions installed vertical to the current detection electrode 42 (power module base 27) with the other portion. Accordingly, the magnetic flux density of the detection magnetic flux 80 can be increased, thereby further increasing the accuracy of the current detector 40.

The magnetic detecting unit 47 has a function to calibrate accuracy of the detection in the same manner as the first embodiment, and is configured such that a magnetic detecting semiconductor element 43 and a part of connection terminals 44 (i.e. power source terminal 65, signal terminal 70, and calibration terminal 71) which have electrical connections with the magnetic detecting semiconductor element 43 are covered with molded resin 45. A Hall element is used for the magnetic detecting semiconductor element 43.

On the surface of the detection conductor 41 on which the magnetic detecting unit 47 is disposed, a depression 46 (concave portion) is provided to contain a part of the magnetic detecting unit 47. A part of the molded resin 45 of the magnetic detecting unit 47 is contained in the depression 46 (concave portion) so that the connection terminals 44 extend in the direction away from the detection conductor 41. A fixing jig abuts on the molded resin 45, which is not opposite to the depression 46 of the magnetic detecting unit 47, with an adhesion layer 50 interposed. The fixing jig is an arm-like protruding portion 49 which is created such that the detection conductor 41 protrudes into the molded resin 45, which is not opposite to the depression 46, so that the fixing jig surrounds (embraces) the part of the molded resin 45 of the magnetic detecting unit 47. The adhesion layer 50 is elastic enough to press the magnetic detecting unit 47 or the adhesion layer 50 becomes hard and adhesive by being processed by a prescribed procedure, thereby bonding together the molded resin 45 and the protruding portion 49.

A more specific description will be given. Assuming that a portion of the detection conductor 41 which bends (first bend) from the current detection electrode 42 and extends in the direction away from the power module base 27, that is, the portion which is installed (extends) vertical to the current detection electrode 42 (power module base 27) be a first conductor; a current detection electrode 42 which extends from the first conductor and bends at the first bend be a second conductor; and another portion of the detection conductor 41 which bends (second bend) from a portion installed (extending) vertical to the portion of the detection conductor 41 (current detection electrode 42 (power module base 27)) extending from the first conductor and bending at the second bend and also extends parallel to the current detection electrode 42 (power module base 27) be a third conductor; the magnetic detecting unit 47 detects magnetic flux which contains components parallel to the power module base 27 or to the induction current 78 flowing through the power module base 27 among magnetic fluxes generated by the first conductor.

The second conductor and the third conductor are bent perpendicular to the first conductor, and extend in the different directions. Specifically, the second conductor and the third conductor extend in the opposite directions. In this case, the magnetic detecting unit 47 is disposed on the plane on which the magnetic detection surface of the magnetic detecting semiconductor element 43 is vertical to the second and third conductors as the axis line of the first conductor as an intersecting point so that the magnetic detecting semiconductor element 43 detects magnetic flux which contains components parallel to the power module base 27 or to the induction current 78 flowing through the power module base 27 among detection magnetic fluxes 80 generated by the first conductor.

Moreover, in this embodiment, the second conductor and the third conductor extend in the opposite directions; however, the following case can be considered. That is, if the second conductor and the third conductor are disposed on the same plane, the third conductor may extend in the direction at an obtuse angle (i.e. θ is more than 90 degrees and less than 180 degrees) with the second conductor. In this case, the magnetic detecting unit 47 is disposed in the space in which the magnetic detection surface of the magnetic detecting semiconductor element 43 is segmented by the plane vertical to the second conductor using the first bend as an intersecting point and in the space which is located on the third conductor side including the first conductor so that the magnetic detecting semiconductor element 43 detects magnetic flux which contains components parallel to the power module base 27 or to the induction current 78 flowing through the power module base 27 among magnetic fluxes generated by the first conductor. Or, the magnetic detecting unit 47 is disposed in the space created such that the magnetic detection surface of the magnetic detecting semiconductor element 43 is segmented by the plane vertical to the second conductor using the first bend as an intersecting point and also created such that the space located on the third conductor side including the first conductor is segmented by the plane vertical to the third conductor using the second bed as an intersecting point and the space overlaps with a space on the second conductor side including the first conductor so that the magnetic detecting semiconductor element 43 detects, among other magnetic fluxes generated by the first conductor, magnetic flux which contains components parallel to the power module base 27 or to the induction current 78 flowing through the power module base 27.

The other configuration is the same as the first embodiment, and therefore, the same numbers are assigned and a specific description will be omitted.

In this embodiment, a depression 46 is provided on one of two portions of the detection conductor 41 which bend from the current detection electrode 42 and extend in the direction away from the power module base 27, that is, portions installed vertical to the current detection electrode 42 (power module base 27), and a part of the magnetic detecting unit 47 is contained in the depression. However, it is also possible to provide another depression on the other portion to contain another magnetic detecting unit for the use of backup.

According to this embodiment, the same effect as the first embodiment can be obtained, and the magnetic detecting unit 47 is disposed in the detection conductor 41 so that among detection magnetic fluxes 80 generated by the detection conductor 41, the magnetic detecting semiconductor element 43 detects magnetic flux which contains components parallel to the power module base 27 or to the induction current 78 flowing through the power module base 27. Accordingly, it is possible to inhibit the influence of the frequency dependent magnetic flux 79 generated by induction current 78. As a result, according to this embodiment, the accuracy of the current detector 40 can be further increased.

Moreover, in this embodiment, a power module base 27 which is electrically insulated from the detection conductor 41 is used as a conductive member and an explanation is given about how the influence of magnetic flux 79 generated by induction current 78 flowing through the power module base 27 is inhibited. However, another conductive member which has electrical insulation with or has only one electrical connection with the detection conductor 41, such as a metal power converter case 30 (chassis), a conductor electrically connected to the power controlling semiconductor element 7, and the wiring pattern (conductor foil) on the ceramic substrate 28 are applicable.

Furthermore, according to this embodiment, a detection conductor 41 having a magnetic detecting unit 47 is disposed on the power module base 27 with the current detection electrode 42 and the ceramic substrate 28 interposed. Therefore, Joule heat generated in the detection conductor 41 and a current detection electrode 42 due to current flow can be discharged via a power module base 27 which is a heat discharge member. Consequently, according to this embodiment, the detection conductor 41 which tends to generate increasing Joule heat can be made thinner. As a result, the magnetic flux density of detection magnetic flux 80 can be increased, and the accuracy of the current detector 40 can also be increased.

Embodiment 11

Figure 38:
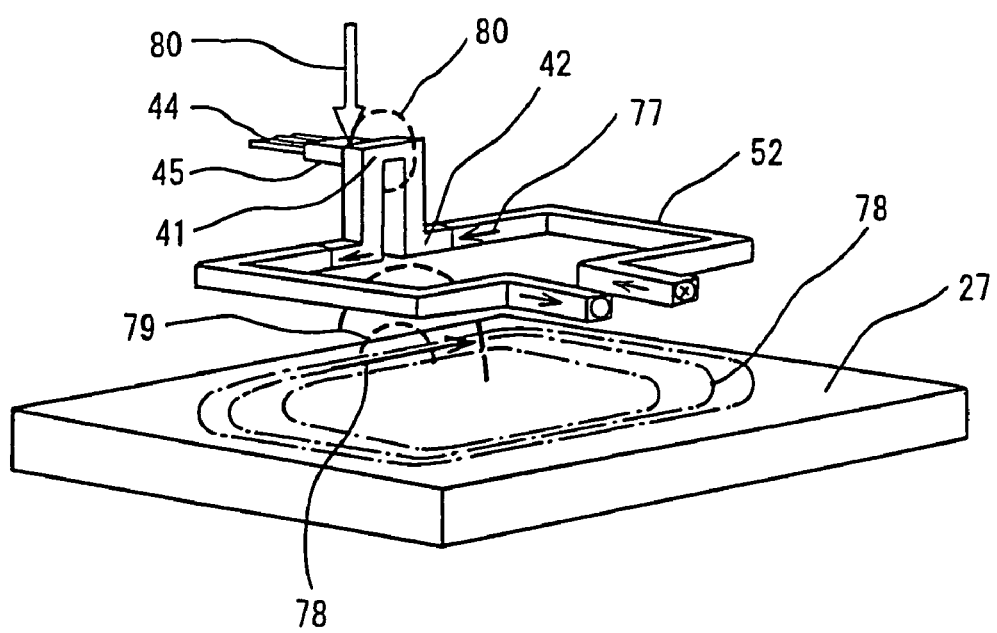
FIG. 38 is a perspective view showing the configuration of a current detector built in a power module of a power converter which is an eleventh embodiment of the present invention.
Figure 39:
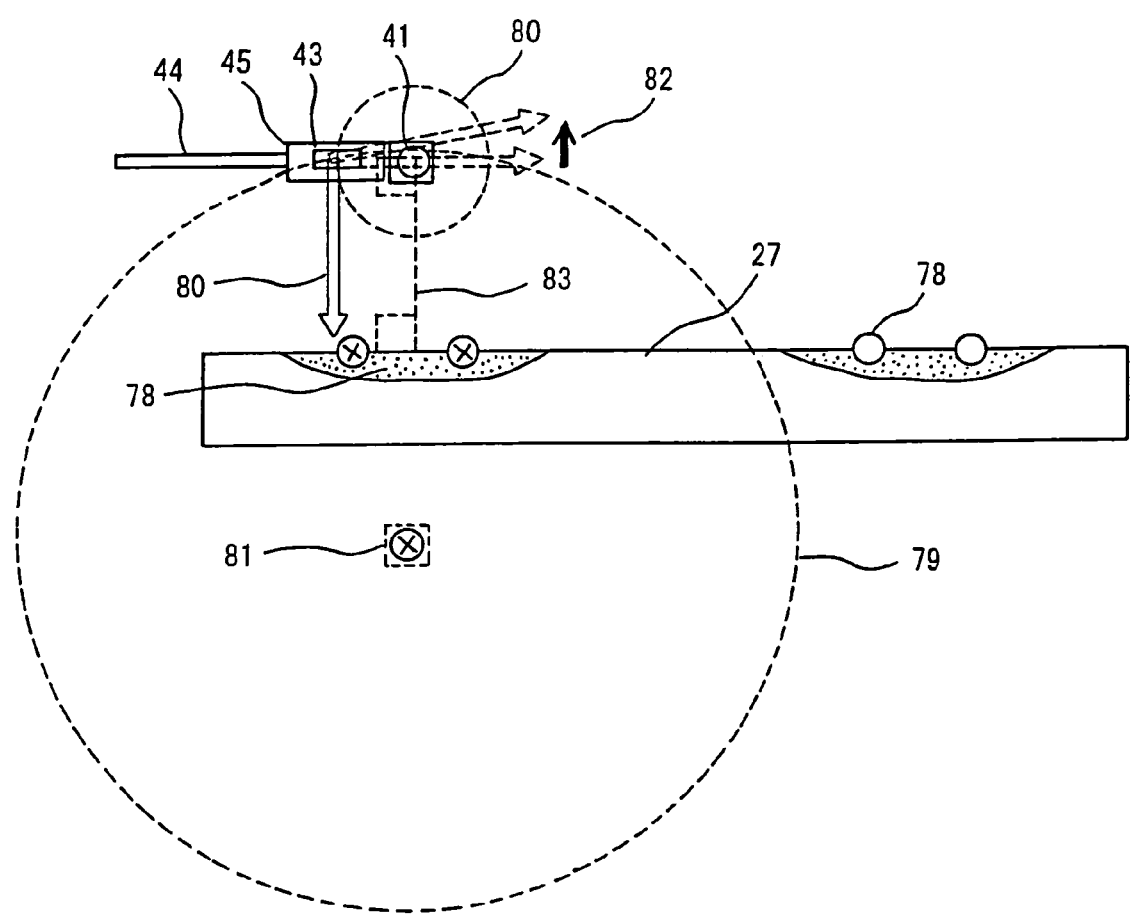
FIG. 39 is a side view partially broken showing the configuration of a current detector built in a power module of a power converter which is an eleventh embodiment of the present invention.

An eleventh embodiment of the present invention will be explained with reference to FIGS. 38 and 39. FIGS. 38 and 39 show the configuration of a current detector incorporated into a power converter of this embodiment. This embodiment is an altered example of the first embodiment, and the magnetic detecting unit 47 is disposed at a different location.

In this embodiment, the magnetic detecting unit 47 is disposed in the detection conductor 41 so that among detection magnetic fluxes 80 generated by the detection conductor 41, the magnetic detecting unit 47 detects magnetic flux 82 having components vertical to the power module base 27 or parallel to the perpendicular line which vertically intersects with the power module base 27. Specifically, the magnetic detecting unit 47 is disposed in a portion of the detection conductor 41, which bends from the current detection electrode 42, extends in the direction away from the power module base 27, bends again and then extends parallel to the power module base 27, so that the magnetic detection surface of the magnetic detecting semiconductor element 43 is parallel to the portion, which bends from the current detection electrode 42, extends in the direction away from the power module base 27, bends again and then extends parallel to the power module base 27, and also the magnetic detection surface is parallel to the current detection electrode 42 (power module base 27).

That is, magnetic flux 79 generated by induction current 78 flowing through the power module base 27 has less components which are parallel to the perpendicular line which vertically intersects with the power module base 27 than the components vertical to the perpendicular line. Therefore, among magnetic fluxes generated by the detection conductor 41, by detecting magnetic flux containing components parallel to the perpendicular line which vertically intersects with the power module base 27, the influence of magnetic flux generated by induction current can be inhibited. For this reason, in this embodiment, the magnetic detecting unit 47 is disposed in the detection conductor 41 which extends parallel to the power module base 27 as stated above.

The other configuration is the same as the first embodiment, and therefore, the same numbers as shown in the first embodiment are assigned and a specific description will be omitted.

According to this embodiment, the same effect as the first embodiment can be obtained, and the magnetic detecting unit 47 is disposed in the detection conductor 41 so that among detection magnetic fluxes 80 generated by the detection conductor 41, detection magnetic flux 82 having components vertical to the power module base 27 or parallel to the perpendicular line which vertically intersects with the power module base 27 is detected. Consequently, it is possible to inhibit the influence of the frequency dependent magnetic flux 79 generated by induction current 78. As a result, according to this embodiment, the accuracy of the current detector 40 can be further increased.

Embodiment 12

Figure 40:
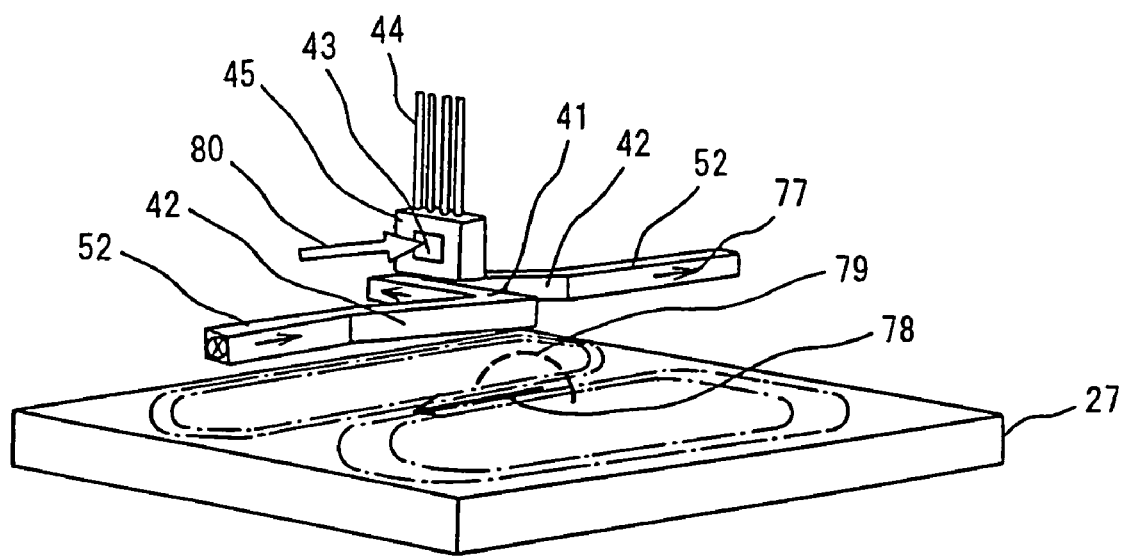
FIG. 40 is a perspective view showing the configuration of a current detector built in a power module of a power converter which is a twelfth embodiment of the present invention.

A twelfth embodiment of the present invention will be explained with reference to FIG. 40. FIG. 40 shows the configuration of a current detector incorporated into a power converter of this embodiment. In this embodiment, configuration of the detection conductor 41 is different. In this embodiment, a conductor consisting of a detection conductor 41 and a current detection electrode 42 extends parallel to the power module base 27 and is nearly letter-S shape with the first and second bends provided. In this embodiment, a conductor portion between the first bend and the second bend corresponds to the detection conductor 41, and the other portion corresponds to the current detection electrode 42. The shape of the detection conductor 41 is linear. One end of the current detection electrode 42 (conductor portion between one end of the conductor near the first bend and the first bend) and the other end of the current detection electrode 42 (conductor portion between the other end of the conductor near the second bend and the second bend) are parallel and extend in the opposite directions. That is, both ends of the current detection electrode 42 extend in the direction perpendicular to the detection conductor 41. The detection conductor 41 is shorter than the current detection electrode 42.

The magnetic detecting unit 47 is disposed in the detection conductor 41. In this embodiment, the magnetic detecting unit 47 is disposed in the detection conductor 41 so as to detect magnetic flux containing components parallel to the power module base 27 or to the induction current 78 (eddy current) flowing through the power module base 27 among detection magnetic fluxes 80 generated by the detection conductor 41. Specifically, the magnetic detecting unit 47 is disposed in the detection conductor 41 so that the magnetic detection surface of the magnetic detecting semiconductor element 43 is vertical to the power module base 27 and the detection conductor 41 and parallel to the detection conductor 41.

That is, by providing first and second bends for the conductor extending parallel to the power module base 27 so as to form a detection conductor 41, it is possible to provide induction current 78 flowing through the power module base 27 in the vicinity of the detection conductor 41 so that the induction current flows nearly perpendicular to the detection conductor 41. Magnetic flux 79 generated by induction current 78 has components parallel to the plane which is vertical to the power module base 27 and perpendicular to the induction current 78, and has no component parallel to the plane which is vertical to the power module base 27 and parallel to the induction current 78. For this reason, in this embodiment, first and second bends are created in the conductor which extends parallel to the power module base 27, as stated above, thereby forming a detection conductor 41 in which the magnetic detecting unit 47 is disposed.

The other configuration is the same as the first embodiment, and therefore, the same numbers are assigned and a specific description will be omitted.

According to this embodiment, first and second bends are created in the conductor which extends parallel to the power module base 27 thereby forming a detection conductor 41, and the magnetic detecting unit 47 is disposed in the detection conductor 41 so as to detection magnetic flux containing components parallel to the power module base 27 or to the induction current 78 (eddy current) flowing through the power module base 27 among detection magnetic fluxes 80 generated by the detection conductor 41. Accordingly, it is possible to inhibit the influence of frequency dependent magnetic flux 79 generated by induction current 78. As a result, according to this embodiment, the accuracy of the current detector 40 can be increased.

Moreover, in this embodiment, an angle at the first bend and the second bend is right angle, however, the angle can be acute angle. Furthermore, in this embodiment, a conductor consisting of a detection conductor 41 and a current detection electrode 42 is configured such that one end of the current detection electrode 42 and the other end of the current detection electrode 42 are parallel to each other and extend in the opposite directions. However, the conductor consisting of a detection conductor 41 and a current detection electrode 42 can be configured such that one end of the current detection electrode 42 and the other end of the current detection electrode 42 are parallel and extend in the same direction.

Embodiment 13

Figure 41:
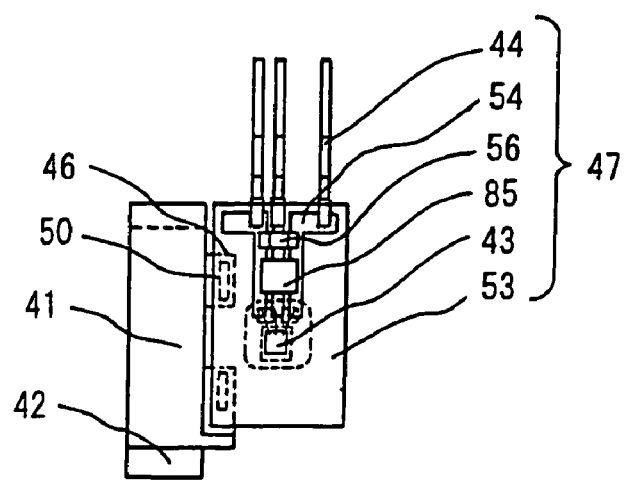
FIG. 41 is a front view showing the configuration of a current detector built in a power module of a power converter which is a thirteenth embodiment of the present invention.
Figure 42:
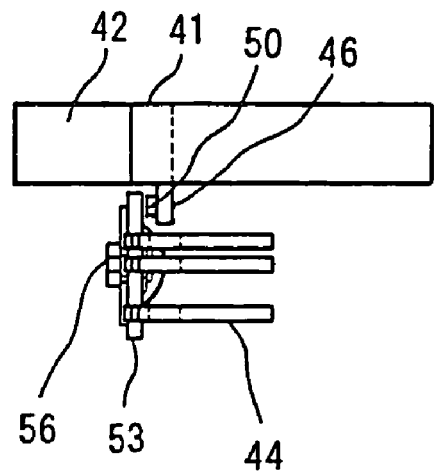
FIG. 42 is a top view showing the configuration of a current detector built in a power module of a power converter which is a thirteenth embodiment of the present invention.
Figure 43:
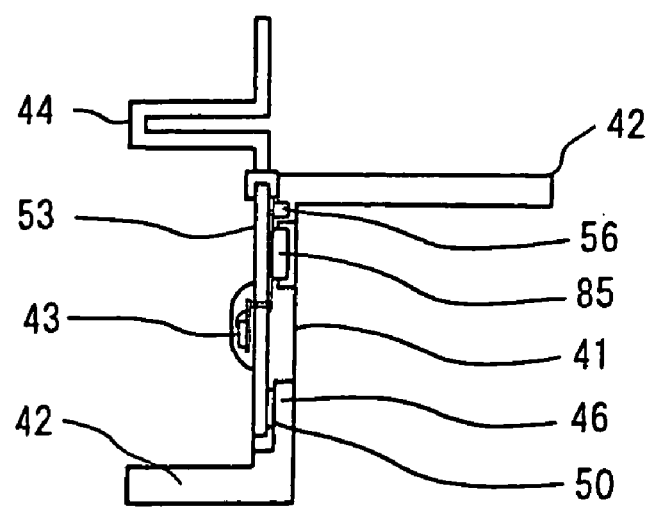
FIG. 43 is a side view showing the configuration of a current detector built in a power module of a power converter which is a thirteenth embodiment of the present invention.

A thirteenth embodiment of the present invention will be explained with reference to FIGS. 41 through 43. FIGS. 41 through 43 show the configuration of a current detector incorporated into a power converter of this embodiment. This embodiment is an altered example of the tenth embodiment. In this embodiment, a magnetic detecting unit 47 is provided, wherein a magnetic detecting semiconductor element 43 is fixed onto the printed wiring board 53 which is configured such that a plurality of laminated wiring sheets 54, each of which consists of a resin insulation layer and a laminated copper foil, are laminated, and the magnetic detecting semiconductor element 43 has electrical connections with the laminated wiring sheets 54 via aluminum wires, and connection terminals 44 have electrical connections with the laminated wiring sheets 54. The magnetic detecting semiconductor element 43 is covered with molded resin 45.

Laminated wiring sheets 54 are disposed together with a wide shield electrode which is wired on the same wiring layer and allows most of the laminated wiring sheets 54 to overlap in a different wiring layer; or, some of the laminated wiring sheets 54 are arranged on different wiring layers, and the laminated wiring sheets 54 are also disposed such that they overlap in the entire area. In the latter case, it is possible to install electronic parts, such as a chip capacitor 56, and a correction circuit 85 which improves output characteristics of the magnetic detecting semiconductor element 43 between the laminated wiring sheets 54.

A depression 46 is provided in the detection conductor 41 in the same manner as the tenth embodiment. A part of the printed wiring board 53 of the magnetic detecting unit 47 is contained in the depression 46. Specifically, the depression 46 is provided such that two portions of the detection conductor 41 protrude from the detection conductor 41. Moreover, in this embodiment, two portions of the detection conductor 41 protrude; however, one or more portions of the detection conductor 41 can protrude. Furthermore, the positional relationship between the detection conductor 41 and the magnetic detection surface of the magnetic detecting semiconductor element 43 is the same as the tenth embodiment.

An adhesion layer 50 is provided on the printed wiring board 53 opposite to the depression 46 (protrusion) of the detection conductor 41. The printed wiring board 53 abuts on the depression 46 (protrusion) with an adhesion layer 50 interposed and is fixed to the depression 46 (protrusion). The adhesion layer 50 becomes hard by being processed by a prescribed procedure, thereby bonding together the depression 46 (protrusion) and the printed wiring board 53.

The other configuration is the same as the first embodiment, and therefore, the same numbers as shown in the tenth embodiment are assigned and a specific description will be omitted.

According to this embodiment, the same effect as the tenth embodiment can be obtained, and it is possible to flexibly change the shape of the connection terminals 44 which have electrical connections with laminated wiring sheets 54 of the printed wiring board 53. Therefore, according to this embodiment, it is possible to increase the degree of flexibility of the connection system with the control board 55 of the control unit 26, and connection by means of a connector is also easily carried out.

Furthermore, according to this embodiment, laminated wiring sheets 54 are disposed together with a wide shield electrode which is wired on the same wiring layer and allows most of the laminated wiring sheets 54 to overlap with a different wiring layer; or, some of the laminated wiring sheets 54 are arranged on different wiring layers, and the laminated wiring sheets 54 are also disposed such that they overlap with the entire area. Accordingly, it is possible to reduce magnetic flux (noise) which interlinks with the electrical annular wire connection created by circuit wiring of the control board 55, and therefore, it is possible to install noise control parts, such as a chip capacitor 56, in proximity to the magnetic detecting semiconductor element 43 and also install a correction circuit 85 which improves output characteristics of the magnetic detecting semiconductor element 43. As a result, according to this embodiment, the accuracy of the current detector 40 can be increased.

Embodiment 14

Figure 44:
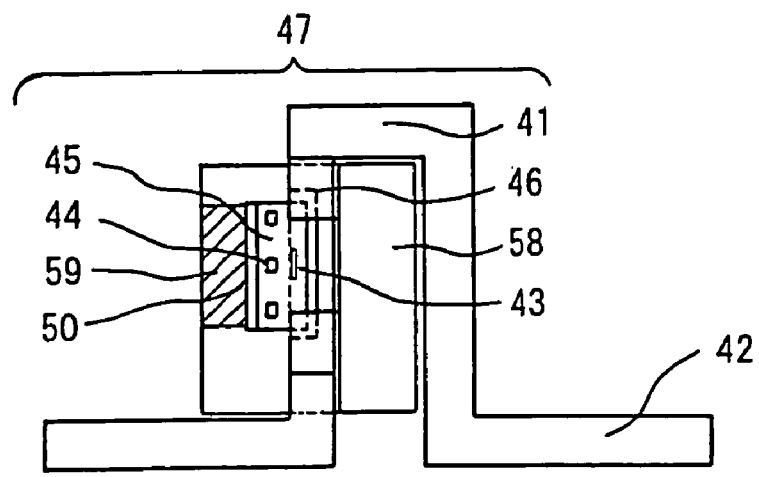
FIG. 44 is a front view showing the configuration of a current detector built in a power module of a power converter which is a fourteenth embodiment of the present invention.
Figure 45:
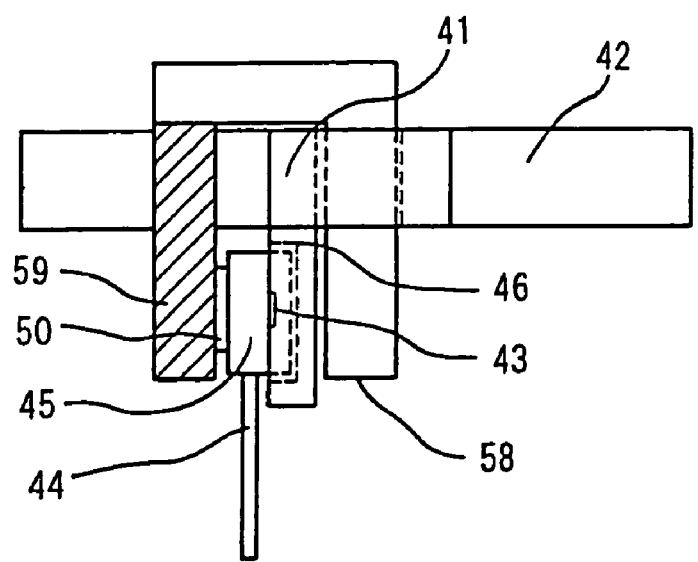
FIG. 45 is a top view showing the configuration of a current detector built in a power module of a power converter which is a fourteenth embodiment of the present invention.
Figure 46:
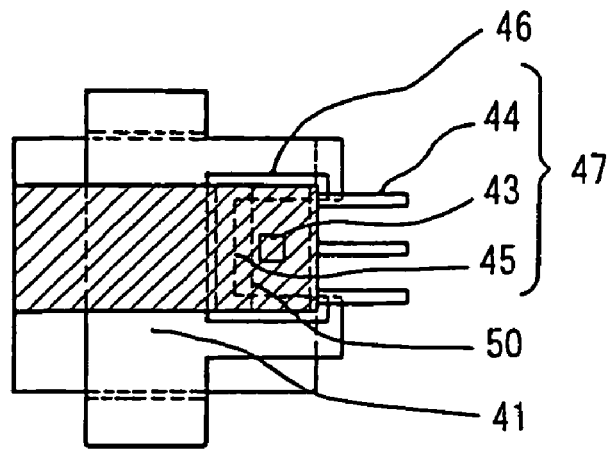
FIG. 46 is a side view showing the configuration of a current detector built in a power module of a power converter which is a fourteenth embodiment of the present invention.

A fourteenth embodiment of the present invention will be explained with reference to FIGS. 44 through 46. FIGS. 44 through 46 show the configuration of a current detector incorporated into a power converter of this embodiment. This embodiment is an altered example of the tenth embodiment. In this embodiment, a magnetic detecting unit 47 configured in the same manner as the tenth embodiment is provided, and a part of the molded resin 45 of the magnetic detecting unit 47 is contained in the depression 46 of the detection conductor 41 so that connection terminals 44 extend in the same direction as shown in the tenth embodiment.

A nearly letter-U shaped resin formed body 57 having a claw 59 and a protruding/recessed portion 58 to secure a magnetic detecting unit 47 and a detection conductor 41 is inserted into the detection conductor 41. The resin formed body 57 functions as a fixing jig for the magnetic detecting unit 47. The protruding/recessed portion 58 is inserted into the cavity of the detection conductor 41 which is located on the opposite side of the magnetic detecting unit 47 side of the detection conductor 41, and is engaged with the detection conductor 41 so that the claw 59 and the protruding/recessed portion 58 embrace the detection conductor 41 and the magnetic detecting unit 47. The claw 59 abuts on the molded resin 45, which is opposite to the depression 46 of the magnetic detecting unit 47, with an adhesion layer 50 interposed, thereby pressing the molded resin 45 of the magnetic detecting unit 47 on the depression 46 side to secure the molded resin 45 of the magnetic detecting unit 47 in the depression 46. The adhesion layer 50 becomes hard by being processed by a prescribed procedure, thereby bonding together the molded resin 45 of the magnetic detecting unit 47 and the claw 59.

In the current detector 40 thus configured, by means of the soldering process in which for several minutes at a high temperature a power controlling semiconductor element 7 is soldered, a detection conductor 41 is soldered onto the electrode 52 of the ceramic substrate 28. After that, the protruding/recessed portion 58 of the resin formed body 57 is inserted into the cavity of the detection conductor 41, thereby engaging the resin formed body 57 with the detection conductor 41. Then, the magnetic detecting unit 47 is inserted into the depression 46 created in the detection conductor 41, and the claw 59 of the resin formed body 57 abuts on the molded resin 45, which is opposite to the depression 46 of the magnetic detecting unit 47, with an adhesion layer 50 interposed, thereby fixing the magnetic detecting unit 47 in the depression 46 of the detection conductor 41. Moreover, in this embodiment, an adhesion layer 50 is provided between the claw 59 and the molded resin 45; however, instead of the adhesion layer 50, it is possible to make the claw 59 and the protruding/recessed portion 58 of the resin formed body 57 elastic so that the claw 59 and the protruding/recessed portion 58 of the resin formed body 57 embrace the detection conductor 41 and the magnetic detecting unit 47.

The other configuration is the same as the first embodiment, and therefore, the same numbers as shown in the tenth embodiment are assigned and a specific description will be omitted.

According to this embodiment, the same effect as the tenth embodiment can be obtained, and by integrating a resin formed body 57, which is blended with magnetic powder, and a detection conductor 41 into a magnetic circuit on the resin formed body 57, it is possible to improve the amount of magnetic flux inputted into the magnetic detecting unit 47. It is also possible to reduce the influence of noise magnetic flux generated by the nearby circuits as well as magnetic flux 79 generated by induction current resulted from transfer, deformation or addition of the conductive member 84. Consequently, according to this embodiment, detection sensitivity of the current detector 40 can be increased, and therefore, the accuracy of the current detector 40 can be increased.

Embodiment 15

Figure 47:
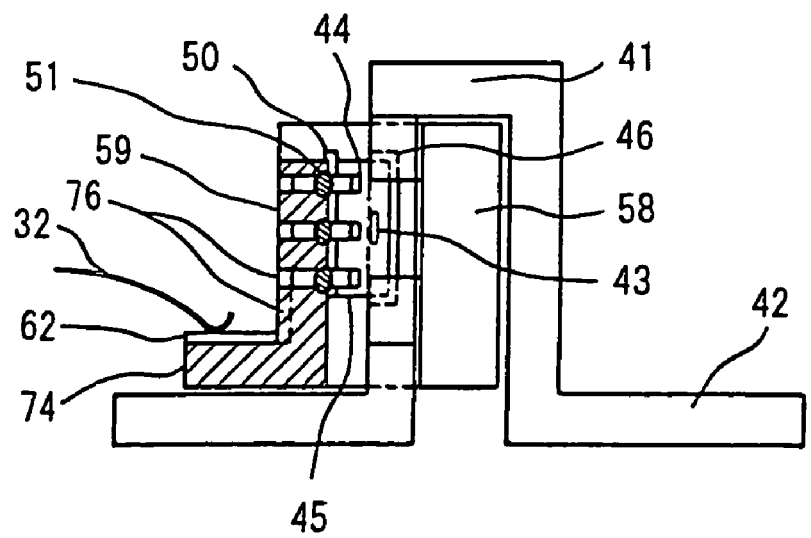
FIG. 47 is a front view showing the configuration of a current detector built in a power module of a power converter which is a fifteenth embodiment of the present invention.
Figure 48:
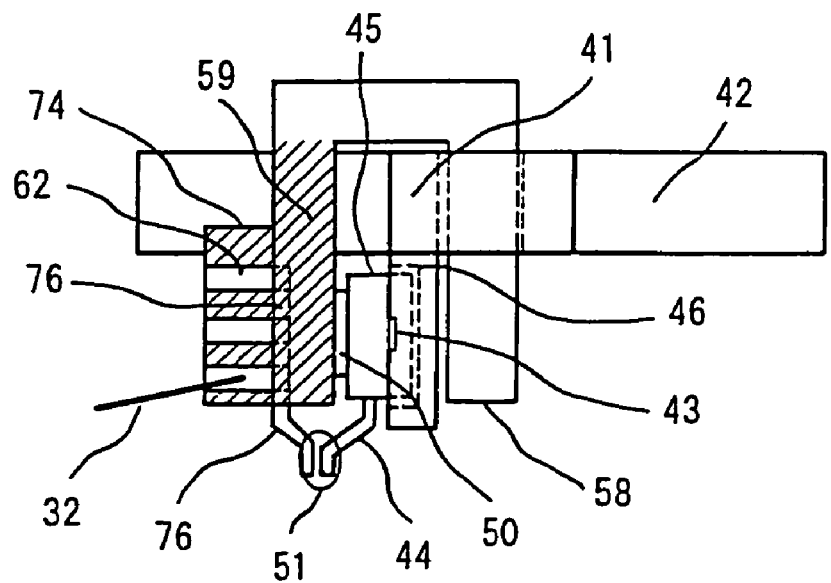
FIG. 48 is a top view showing the configuration of a current detector built in a power module of a power converter which is a fifteenth embodiment of the present invention.
Figure 49:
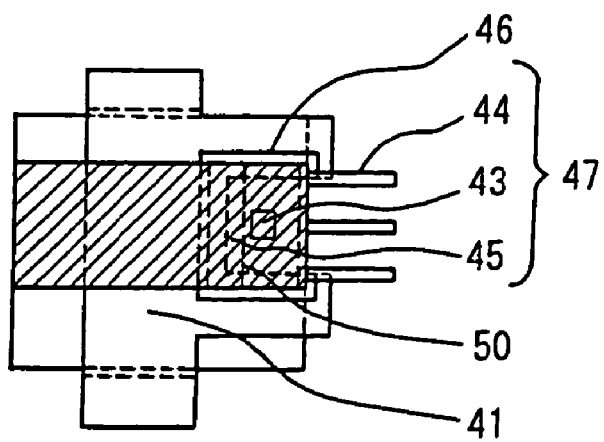
FIG. 49 is a side view showing the configuration of a current detector built in a power module of a power converter which is a fifteenth embodiment of the present invention.

A fifteenth embodiment of the present invention will be explained with reference to FIGS. 47 through 49. FIGS. 47 through 49 show the configuration of a current detector incorporated into a power converter of this embodiment. This embodiment is an altered example of the fourteenth embodiment. In this embodiment, a magnetic detecting unit 47 configured in the same manner as the fourteenth embodiment is provided, and a part of the molded resin 45 of the magnetic detecting unit 47 is contained in the depression 46 of the detection conductor 41 so that connection terminals 44 extend in the same direction as shown in the fourteenth embodiment.

A nearly letter-U shaped resin formed body 74 having a claw 59 and a protruding/recessed portion 58 to secure a magnetic detecting unit 47 and a detection conductor 41 is inserted into the detection conductor 41. The resin formed body 57 functions as a fixing jig for the magnetic detecting unit 47. The protruding/recessed portion 58 is inserted into the cavity of the detection conductor 41 which is located on the opposite side of the magnetic detecting unit 47 side of the detection conductor 41, and is engaged with the detection conductor 41 so that the claw 59 and the protruding/recessed portion 58 embrace the detection conductor 41 and the magnetic detecting unit 47. The claw 59 abuts on the molded resin 45, which is opposite to the depression 46 of the magnetic detecting unit 47, with an adhesion layer 50 interposed, thereby pressing the molded resin 45 of the magnetic detecting unit 47 on the depression 46 side to secure the molded resin 45 of the magnetic detecting unit 47 in the depression 46. The adhesion layer 50 becomes hard by being processed by a prescribed procedure, thereby bonding together the molded resin 45 of the magnetic detecting unit 47 and the claw 59.

Furthermore, in this embodiment, a plurality of insert electrodes 76 are built in the opposite side of the detection conductor 41 side of the claw 59 of the resin formed body 74. A plurality of insert electrodes 76 extend to the step portion provided on the opposite side of the detection conductor 41 side of the claw. A plurality of flat pads 62 which can be bonded with aluminum wires 32 are embedded in the step portion of the claw 59 of the resin formed body 74 so that the pads are exposed on the surface, and one end of the corresponding insert electrode 76 is connected to the pads. The other end of the plurality of insert electrodes 76 protrudes outward from the tip of the claw 59, and is connected to the connection terminals 44 by means of solder 51.

According to this embodiment, the same effect as the fourteenth embodiment can be obtained, and connection terminals 44 of the magnetic detecting unit 47 are not directly connected to the control board 55. Accordingly, it is possible to flexibly route an aluminum wire 32 or a wire in the power module 16 connected to the aluminum wire 32. Therefore, it is possible to flexibly lay out the position of the connection with the control board 55 regardless of the location of the magnetic detecting unit 47. As a result, distance between the magnetic detecting unit 47 and the detection conductor 41 can be effectively accurate.

Embodiment 16

Figure 50:
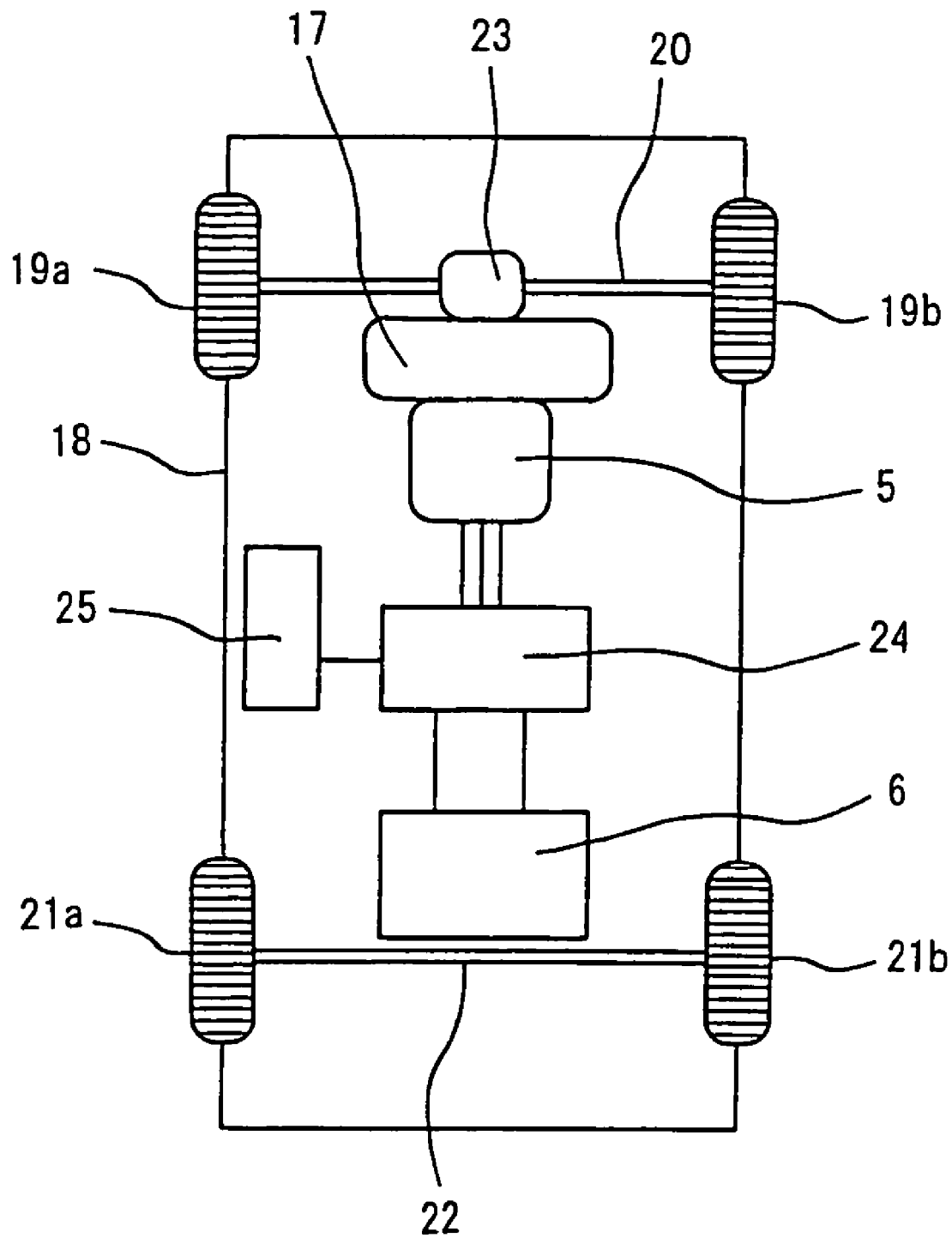
FIG. 50 is a block diagram schematically showing the configuration of a hybrid car which is a sixteenth embodiment of the present invention equipped with a motor drive system incorporating a power converter according to any one of first through fifteenth embodiments.

A sixteenth embodiment of the present invention will be explained with reference to FIG. 50. FIG. 50 schematically shows the configuration of a hybrid car which incorporates a motor drive system that uses a power converter according to any one of first through fifteenth embodiments. The hybrid car drives one wheel by switching an internal-combustion engine 17 and a motor 5. An internal-combustion engine 17 is mechanically connected to the axle 20 via a gear 23. A motor 5 is mechanically connected to the internal-combustion engine 17. The other configuration is the same as the electric car according to the first embodiment, and a specific description will be omitted.

According to this embodiment, a power converter 24, which is small and accurately controls electric power, according to any one of first through fifteenth embodiments is used; therefore, it is possible to make a motor drive system for a hybrid car small, inexpensive and reliable. Furthermore, it is possible to make a hybrid car inexpensive, increase fuel efficiency, improve travel distance per one battery charge, and reduce space for mounting the power converter.

Embodiment 17

Figure 51:
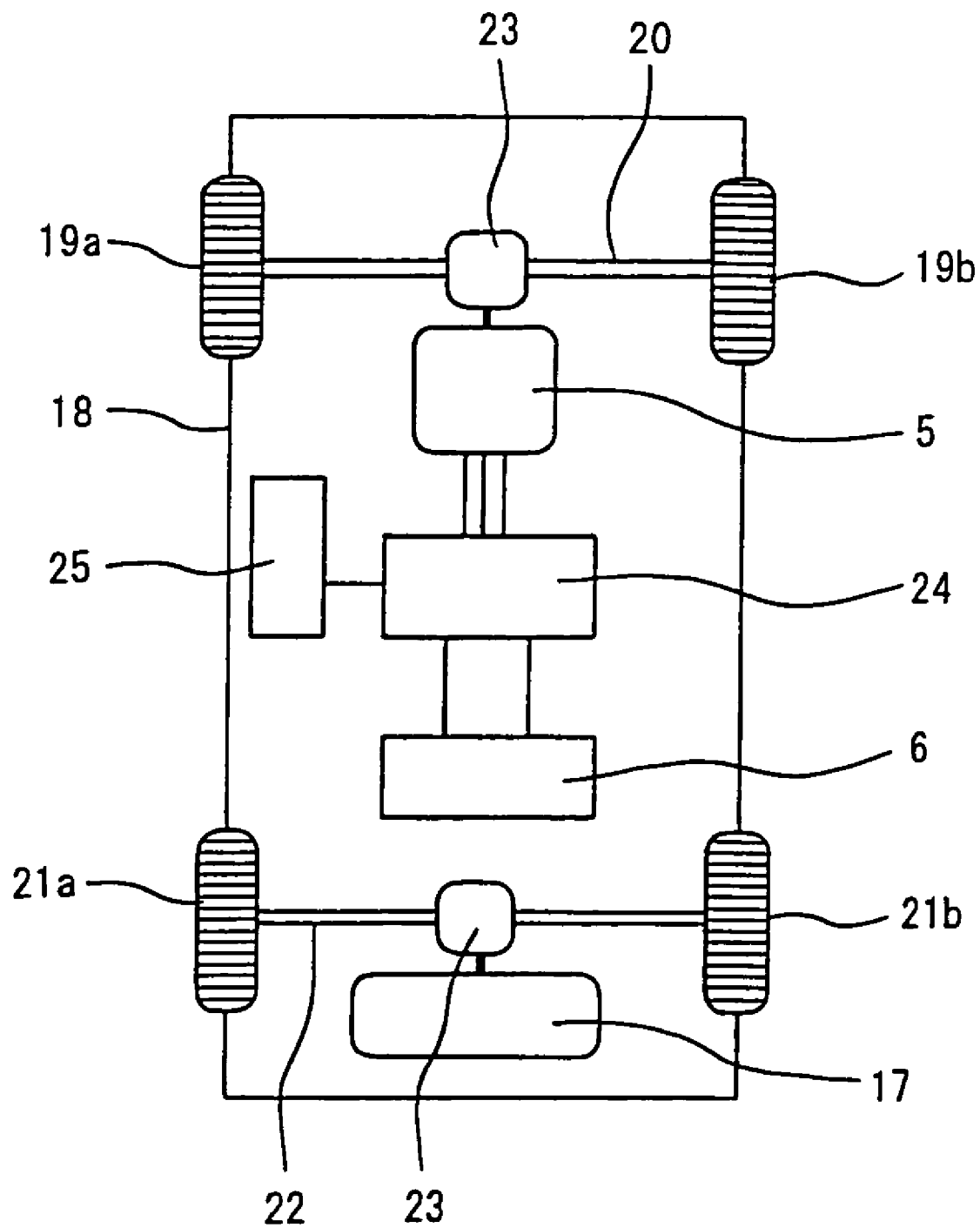
FIG. 51 is a block diagram schematically showing the configuration of an electrical four-wheel drive vehicle which is a seventeenth embodiment of the present invention equipped with a motor drive system incorporating a power converter according to any one of first through fifteenth embodiments.

A seventeenth embodiment of the present invention will be explained with reference to FIG. 51. FIG. 51 shows the configuration of an electrical four-wheel drive vehicle which incorporates a motor drive system that uses a power converter according to any one of first through fifteenth embodiments. In an electrical four-wheel drive vehicle, an internal-combustion engine 17 drives wheels as a main drive source and a motor 5 drives other wheels as a sub drive source (for assist). An internal-combustion engine 17 is mechanically connected to the axle 20 via a gear 23. A motor 5 is mechanically connected to the axle 22. The other configuration is the same as the first embodiment, and a specific description will be omitted.

According to this embodiment, a power converter 24, which is small and accurately controls electric power, according to any one of first through fifteenth embodiments is used; therefore, it is possible to make a motor drive system for an electrical four-wheel drive vehicle small, inexpensive and reliable. Furthermore, it is possible to make an electrical four-wheel drive vehicle inexpensive, increase fuel efficiency, and reduce space for mounting the power converter.

Embodiment 18

Figure 52:
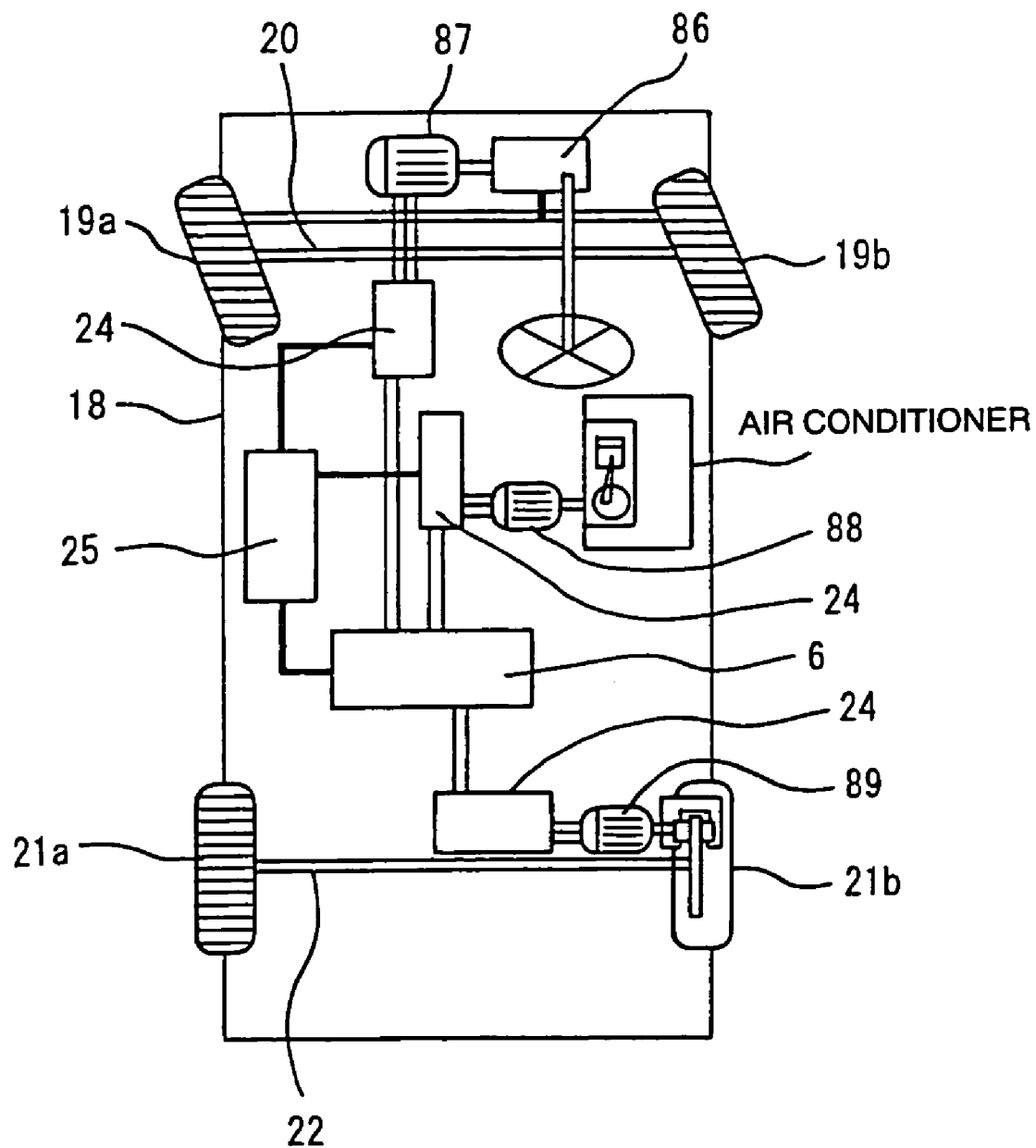
FIG. 52 is a block diagram schematically showing the configuration of a vehicle which is an eighteenth embodiment of the present invention equipped with a motor drive system incorporating a power converter according to any one of first through fifteenth embodiments.

An eighteenth embodiment of the present invention will be explained with reference to FIG. 52. FIG. 52 schematically shows the configuration of a vehicle which incorporates a motor drive system that uses a power converter according to any one of first through fifteenth embodiments. As a motor drive system, any one or more than two of the following systems is provided: an electrical power steering system which drives a motor 87 and adjusts the steering angle of the steering device 86, a driven device; an electrical air-conditioning system which drives a motor 88 thereby driving a compressor, a driven device; and an electric brake system which drives a motor 89 thereby pressurizing the brake pad in the brake caliper, a driven device. The motor drive system is configured in the same manner as the electric car according to the first embodiment, such that DC power supplied from the battery 6 is converted into AC power by the power converter 24, supplied to motors 86, 88 and 89 thereby driving motors 86, 88 and 89.

According to this embodiment, a power converter 24, which is small and accurately controls electric power, according to any one of first through fifteenth embodiments is used; therefore, it is possible to make a motor drive system incorporated into a vehicle small, inexpensive and reliable. Moreover, in this embodiment, a battery is used as a DC power source, however, a fuel cell system is applicable.

Embodiment 19

Figure 53:
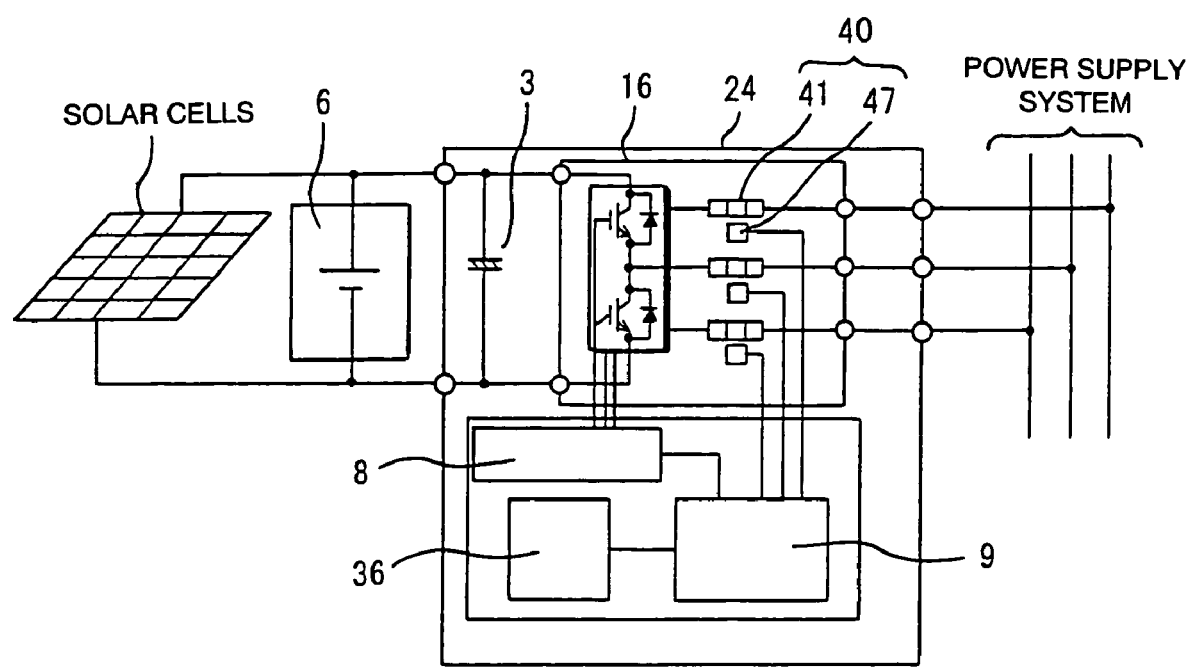
FIG. 53 is a block diagram schematically showing the configuration of a solar power generating system which is a nineteenth embodiment of the present invention equipped with a power converter according to any one of first through fifteenth embodiments.

A nineteenth embodiment of the present invention will be explained with reference to FIG. 53. FIG. 53 shows the configuration of a solar power generating system which incorporates a power converter according to any one of first through fifteenth embodiments. The solar power generating system stores DC power obtained by solar cells in the battery 6. DC power stored in the battery 6 is converted into AC power by a power converter 24 and supplied to the power supply system.

According to this embodiment, a power converter 24, which is small and accurately controls electric power, according to any one of first through fifteenth embodiments is used; therefore, it is possible to make a solar power generating system small, inexpensive and reliable. Moreover, in this embodiment, a solar power generating system using solar cells is used, however, a fuel cell system using fuel cells is applicable.

Embodiment 20

Figure 54:
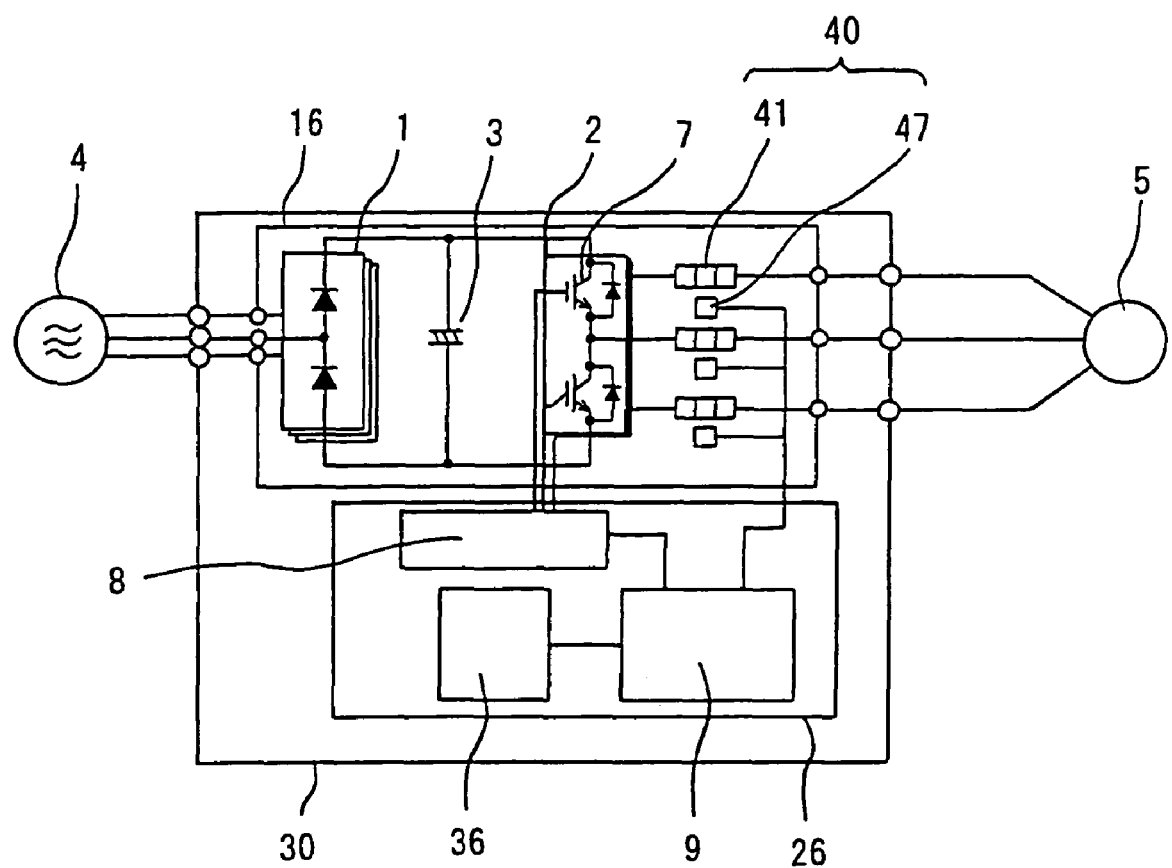
FIG. 54 is a block diagram schematically showing the configuration of an electric power system which is a twentieth embodiment of the present invention equipped with a power converter according to any one of first through fifteenth embodiments.

A twentieth embodiment of the present invention will be explained with reference to FIG. 54. FIG. 54 shows the configuration of an electric power system which incorporates a power converter according to any one of first through fifteenth embodiments. An electric power system of this embodiment is a motor drive system which smoothes AC power supplied from a commercial power source 4 into DC power by converter 1 of the power converter and converts the DC power into AC power of prescribed voltage and frequency by inverter 2, and then the AC power is supplied to an electric load, such as a motor 5. The power converter is configured such that a converter 1 (forward converter) constituted by a rectifying element such as a diode, inverter 2 (reverse converter) constituted by a PWM (pulse width modulation) control system, and a smoothing capacitor 3 (capacitor) connected to the DC portion located between the converter 1 and the inverter 2 have electrical connections with one another and are contained in the power converter case 30. The inverter 2 is configured in the same manner as a power converter according to any one of the aforementioned first through ninth embodiment. Therefore, a detailed description of the inverter 2 will be omitted.

According to this embodiment, the inverter 2 is configured in the same manner as a power converter according to any one of the aforementioned first through fifteenth embodiment, thereby making it possible to make an electric power system, such as a motor drive system, small, inexpensive and reliable.

According to the present invention described above, a current detector which is small and can carry out highly accurate current detection, thereby making it possible to provide an electric power system and a mobile body incorporating a power converter which is small and can accurately control electric power.

What is claimed is:

1. A power converter comprising
a power module having
a power controlling semiconductor element, and
a current detector for detecting current inputted into said power controlling semiconductor element or outputted from said power controlling semiconductor element;
a control unit for controlling operation of said power controlling semiconductor element; and
a planar conductive member through which induction current flows at the surface due to electromagnetic induction generated by current flowing through said current detector, wherein
said current detector has
a conductor electrically connected to said power controlling semiconductor element, and
a magnetic detecting unit for detecting a magnetic flux which is generated by the current flowing through said conductor, and
the magnetic detection surface of said magnetic detecting unit being parallel to the surface of said planar conductive member so that said magnetic detecting unit detects a component which is vertical to the surface of said planar conductive member, among magnetic flux generated by the current flowing through said conductor.

2. A power converter according to claim 1, wherein
said conductor has a portion which protrudes in the direction away from said conductive member, and among magnetic flux generated by said conductor portion protruding in the direction away from said conductive member; and said magnetic detecting unit detects magnetic flux having a component parallel to the perpendicular line which vertically intersects with said conductive member.

3. A power converter according to claim 1, wherein said conductor has a portion which protrudes in the direction away from said conductive member and is parallel to said conductive member; and said magnetic detecting unit is disposed in said conductor portion which protrudes in the direction away from said conductive member and is parallel to said conductive member so that the magnetic detection surface of said magnetic detecting semiconductor element is parallel to said conductive member and is vertical and parallel to said conductor portion which protrudes in the direction away from said conductive member and is parallel to said conductive member.

4. A mobile body comprising:

a body;

a driven device provided in said body;

a motor for being driven by an external power source or electric power supplied from an internal power source mounted to said body thereby driving said driven device; and a power converter for controlling electric power supplied from said power source to said motor, wherein a power converter according to claim 1 is used as said power converter.

5. The power converter according to claim 1, wherein said planar conductive member being a metal base plate on which said power controlling semiconductor elements are arranged with an insulation member interposed.

* * * * *